(12) United States Patent
Song

(10) Patent No.: US 9,922,721 B2
(45) Date of Patent: *Mar. 20, 2018

(54) ANTI-FUSE TYPE ONE-TIME PROGRAMMABLE MEMORY CELL ARRAY AND METHOD OF OPERATING THE SAME

(71) Applicant: SK hynix Inc., Gyeonggi-do (KR)

(72) Inventor: Hyun Min Song, Sejong (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/267,859

(22) Filed: Sep. 16, 2016

(65) Prior Publication Data

US 2017/0004887 A1    Jan. 5, 2017

Related U.S. Application Data

(63) Continuation of application No. 14/697,355, filed on Apr. 27, 2015, now Pat. No. 9,490,027.

(30) Foreign Application Priority Data

Nov. 18, 2014   (KR) .................. 10-2014-0161183

(51) Int. Cl.
| | |
|---|---|
| *G11C 17/00* | (2006.01) |
| *G11C 17/16* | (2006.01) |
| *H01L 27/112* | (2006.01) |
| *H01L 23/525* | (2006.01) |
| *G11C 17/18* | (2006.01) |
| *G11C 5/02* | (2006.01) |
| *H01L 27/02* | (2006.01) |

(52) U.S. Cl.
CPC ............ *G11C 17/16* (2013.01); *G11C 17/165* (2013.01); *G11C 17/18* (2013.01); *H01L 23/5252* (2013.01); *H01L 27/112* (2013.01); *H01L 27/11206* (2013.01); *G11C 5/025* (2013.01); *H01L 27/0207* (2013.01)

(58) Field of Classification Search
CPC ............ G11C 5/025; G11C 5/04; G11C 5/063
USPC ............. 365/96, 51, 72, 185.27, 185.28
See application file for complete search history.

(56) References Cited

U.S. PATENT DOCUMENTS

| | | | |
|---|---|---|---|
| 8,811,077 B2 * | 8/2014 | Hung ................. | G11C 13/0002 365/185.05 |
| 2014/0264520 A1 * | 9/2014 | Reisiger ............. | H01L 27/0288 257/300 |
| 2016/0293612 A1 * | 10/2016 | Park ................ | H01L 21/823437 |

* cited by examiner

*Primary Examiner* — Connie Yoha
(74) *Attorney, Agent, or Firm* — IP & T Group LLP

(57) ABSTRACT

An anti-fuse type one-time programmable (OTP) memory cell array includes a plurality of unit cells which are respectively located at cross points of a plurality of rows and a plurality of columns, a well region shared by the plurality of unit cells, a plurality of anti-fuse gates respectively disposed in the plurality of columns to intersect the well region, a plurality of source/drain regions respectively disposed in portions of the well region between the plurality of anti-fuse gates, and a plurality of drain regions respectively disposed in portions of the well region located at one sides of the anti-fuse gates arrayed in a last column, which are opposite to the anti-fuse gates arrayed in a first column. Each of the unit cells includes one anti-fuse transistor having a MOS transistor structure without a selection transistor.

9 Claims, 44 Drawing Sheets

ANTI-FUSE TYPE ONE-TIME PROGRAMMABLE MEMORY CELL ARRAY AND METHOD OF OPERATING THE SAME

CROSS-REFERENCE TO RELATED APPLICATION

This application is a continuation of U.S. patent application Ser. No. 14/697,355, filed on Apr. 27, 2015, entitled "ANTI-FUSE TYPE ONE-TIME PROGRAMMABLE MEMORY CELL ARRAY AND METHOD OF OPERATING THE SAME", which claims priority of Korean patent application number 10-2014-0161183 filed on Nov. 18, 2014. The disclosure of each of the foregoing applications is incorporated herein by reference in its entirety.

BACKGROUND

1. Technical Field

Various embodiments of the present disclosure relate to a nonvolatile memory device and, more particularly, to an anti-fuse type one-time programmable (OTP) memory cell array and a method of operating the same.

2. Related Art

Nonvolatile memory devices retain stored data even when their power supplies are interrupted. Nonvolatile memory devices include read only memory (ROM) devices, OTP memory devices and rewritable memory devices. Nonvolatile memory devices are generally fabricated using a complementary metal-oxide-semiconductor (CMOS) process.

One-time programmable memory devices may be categorized as either fuse type or anti-fuse type OTP memory devices. All of the memory cells included in a fuse type OTP memory device are short circuited before they are programmed and then form an open circuit after programming. In contrast, all of memory the cells in an anti-fuse type OTP memory device may have an open circuit before programming and may be short circuited after programming. Considering the characteristics of MOS transistors, the CMOS processes is likely best suited for fabricating anti-fuse type OTP memory devices.

SUMMARY

Various embodiments are directed to an anti-fuse type OTP memory cell array and a method of operating the same.

According to one embodiment, there is provided an anti-fuse type OTP memory cell array including a plurality of unit cells which are respectively located at cross points of a plurality of rows and a plurality of columns. The anti-fuse type OTP memory cell array comprises a plurality of well regions respectively disposed in the plurality of rows, a plurality of anti-fuse gates respectively disposed in the plurality of columns to intersect the plurality of well regions, a plurality of source/drain regions respectively disposed in portions of the well regions between the plurality of anti-fuse gates, and a plurality of drain regions respectively disposed in the well regions located at one side of a last anti-fuse gate disposed in a last column, which is opposite to a first anti-fuse gate disposed in a first column. Each of the unit cells is composed of one anti-fuse transistor having a metal-oxide-semiconductor (MOS) transistor structure without any selection transistor.

According to another embodiment, an anti-fuse type OTP memory cell array comprises a plurality of unit cells respectively located at cross points of a plurality of rows and a plurality of columns. Each of the unit cells is composed of an anti-fuse transistor having a metal-oxide-semiconductor (MOS) transistor structure. A plurality of word lines are respectively disposed in the plurality of columns. The anti-fuse transistors arrayed in each column share any one of the plurality of word lines. A plurality of well bias lines are respectively disposed in the plurality of rows. The anti-fuse transistors arrayed in each row share any one of the plurality of well bias lines. A plurality of bit lines are respectively connected to drain terminals of the anti-fuse transistors arrayed in a last column of the plurality of columns.

According to another embodiment, there is provided an anti-fuse type OTP memory cell array including a plurality of unit cells which are respectively located at cross points of a plurality of rows and a plurality of columns. The anti-fuse type OTP memory cell array comprises a well region which is shared by the plurality of unit cells, a plurality of anti-fuse gates respectively disposed at cross points of the plurality of rows and the plurality of columns to constitute the plurality of unit cells, a plurality of source/drain regions respectively disposed in portions of the well region between the plurality of anti-fuse gates arrayed in each of the plurality of rows, and a plurality of drain regions respectively disposed in portions of the well region located at one sides of the anti-fuse gates arrayed in a last column of the plurality of columns, which are opposite to the anti-fuse gates arrayed in a first column of the plurality of columns. Each of the unit cells is composed of one anti-fuse transistor having a metal-oxide-semiconductor (MOS) transistor structure without any selection transistor.

According to another embodiment, an anti-fuse type OTP memory cell array comprises a plurality of unit cells respectively located at cross points of a plurality of rows and a plurality of columns. Each of the unit cells is composed of an anti-fuse transistor having a metal-oxide-semiconductor (MOS) transistor structure. A plurality of word lines are respectively connected to the anti-fuse transistors. The anti-fuse transistors share a well bias line with each other. A plurality of bit lines are respectively connected to drain terminals of the anti-fuse transistors which are arrayed in a last column of the plurality of columns.

According to another embodiment, there is provided a method of operating an anti-fuse type OTP memory cell array including a plurality of unit cells which are respectively located at cross points of a plurality of rows and a plurality of columns, a plurality of word lines respectively disposed in the plurality of columns, a plurality of well regions respectively disposed in the plurality of rows, a plurality of well bias lines respectively connected to the plurality of well regions, a plurality of bit lines respectively connected to drain terminals of the unit cells arrayed in a last column of the plurality of columns, and a plurality of PN diodes coupled between the plurality of well bias lines and the drain terminals of the plurality of unit cells. The method comprises selecting one of the plurality of rows and sequentially programming the unit cells which are arrayed in the selected row. Each of the plurality of unit cells is composed of an anti-fuse transistor having a metal-oxide-semiconductor (MOS) transistor structure without any selection transistor.

According to another embodiment, there is provided a method of operating an anti-fuse type OTP memory cell array including a plurality of unit cells which are respectively located at cross points of a plurality of rows and a plurality of columns, a plurality of word lines respectively disposed in the plurality of columns, a plurality of well regions respectively disposed in the plurality of rows, a plurality of well bias lines respectively connected to the plurality of well regions, a plurality of bit lines respectively connected to drain terminals of the unit cells arrayed in a last column of the plurality of columns, and a plurality of PN diodes coupled between the plurality of well bias lines and the drain terminals of the plurality of unit cells. The method comprises selecting one of the plurality of columns and simultaneously programming at least one of the unit cells which are arrayed in the selected column. Each of the plurality of unit cells is composed of an anti-fuse transistor having a metal-oxide-semiconductor (MOS) transistor structure without any selection transistor.

According to another embodiment, there is provided a method of operating an anti-fuse type OTP memory cell array including a plurality of unit cells which are respectively located at cross points of a plurality of rows and a plurality of columns, a plurality of word lines respectively connected to the plurality of unit cells, a well region which is shared by the plurality of unit cells, a well bias line connected to the well region, a plurality of bit lines respectively connected to drain terminals of the unit cells arrayed in a last column of the plurality of columns, and a plurality of PN diodes coupled between the well bias line and the drain terminals of the plurality of unit cells. The method comprises selecting one of the plurality of rows and sequentially programming the unit cells which are arrayed in the selected row. Each of the plurality of unit cells is composed of an anti-fuse transistor having a metal-oxide-semiconductor (MOS) transistor structure without any selection transistor.

According to another embodiment, there is provided a method of operating an anti-fuse type OTP memory cell array including a plurality of unit cells which are respectively located at cross points of a plurality of rows and a plurality of columns, a plurality of word lines respectively connected to the plurality of unit cells, a well region which is shared by the plurality of unit cells, a well bias line connected to the well region, a plurality of bit lines respectively connected to drain terminals of the unit cells arrayed in a last column of the plurality of columns, and a plurality of PN diodes coupled between the well bias line and the drain terminals of the plurality of unit cells. The method comprises selecting one of the plurality of columns and simultaneously programming at least one of the unit cells which are arrayed in the selected column. Each of the plurality of unit cells is composed of an anti-fuse transistor having a metal-oxide-semiconductor (MOS) transistor structure without a selection transistor.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

An anti-fuse element may be formed to initially have an insulated state, i.e., an electrical open state, and may be programmed to have a conductive state, i.e., an electrical short state, when a voltage equal to or greater than a critical voltage is applied thereto. Accordingly, a programmable anti-fuse element may be employed in each of a plurality of unit cells constituting an anti-fuse type OTP memory cell array. The programmable anti-fuse element may be realized to have a metal-oxide-semiconductor (MOS) transistor structure. Each of the unit cells constituting the anti-fuse type OTP memory cell array may include at least one anti-fuse transistor and at least one selection transistor. The selection transistors may be used to select at least one of the unit cells during a program operation or a read operation. However, according to the following embodiments, each of the unit cells constituting the anti-fuse type OTP memory cell array may be configured to include only a single anti-fuse transistor without a selection transistor. That is, according to the embodiments, one or more specific unit cells may be selectively programmed and read out even without any selection transistors. Thus, a planar area that an anti-fuse type OTP memory cell array occupies may be reduced to increase the integration density of a semiconductor memory device including the anti-fuse type OTP memory cell array.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
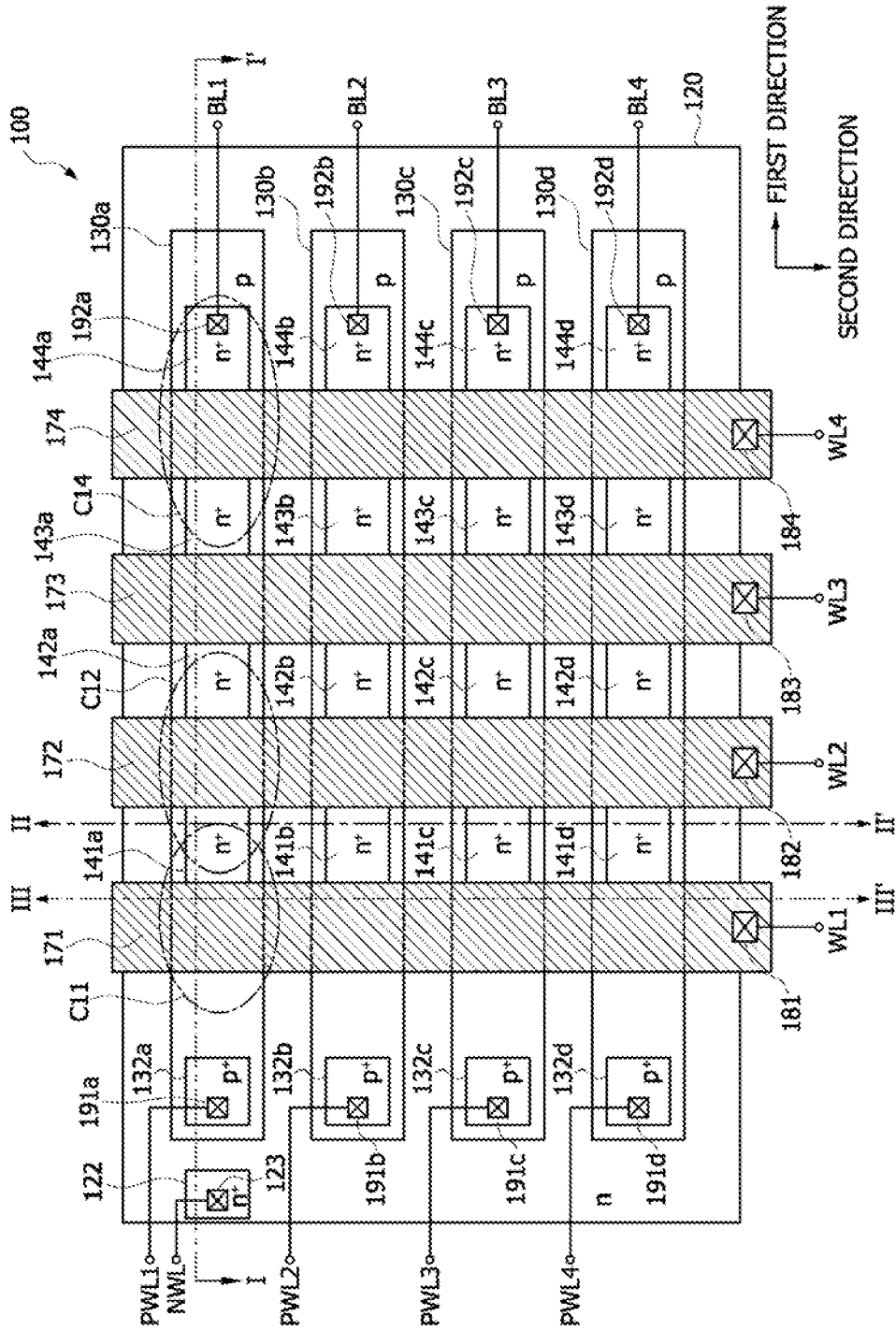
FIG. 1 is a layout diagram illustrating an anti-fuse type OTP memory cell array according to an embodiment.

FIG. 1 is a layout diagram illustrating an anti-fuse type OTP memory cell array 100 according to an embodiment.

Referring to FIG. 1, the anti-fuse type OTP memory cell array 100 may include a plurality of well regions 130a, 130b, 130c and 130d. Sidewalls and bottom surfaces of the well regions 130a, 130b, 130c and 130d may be surrounded by a deep well region 120. The deep well region 120 may have a first conductivity type, and the well regions 130a, 130b, 130c and 130d may have a second conductivity type which is opposite to the first conductivity type. In the present embodiment, the deep well region 120 may be N-type and the well regions 130a, 130b, 130c and 130d may be P-type. Alternatively, the deep well region 120 may be P-type and the well regions 130a, 130b, 130c and 130d may be N-type. The deep well region 120 may be formed by performing an ion implantation process with a mask pattern and a diffusion process. Similarly, the well regions 130a, 130b, 130c and 130d may also be formed by performing an ion implantation process with a mask pattern and a diffusion process. Each of the well regions 130a, 130b, 130c and 130d may be disposed to have a stripe or line shape extending in a first direction, e.g., a horizontal direction in FIG. 1. The well regions 130a, 130b, 130c and 130d may be arrayed in a second direction, e.g., a vertical direction in FIG. 1, and may be spaced apart from each other by a certain distance in the second direction. The well regions 130a, 130b, 130c and 130d may be disposed in a plurality of rows, respectively. For example, the first well region 130a may be disposed in a first row, the second well region 130b may be disposed in a second row, the third well region 130c may be disposed in a third row, and the fourth well region 130d may be disposed in a fourth row. The second direction may be perpendicular to the first direction, as illustrated in FIG. 1. However, in some embodiments, the second direction may intersect the first direction at a non-right angle.

A plurality of anti-fuse gates 171, 172, 173 and 174 may be disposed over the deep well region 120 to cross the well regions 130a, 130b, 130c and 130d. Each of the anti-fuse gates 171, 172, 173 and 174 may have a stripe or line shape extending in the second direction. The anti-fuse gates 171, 172, 173 and 174 may be arrayed in the first direction and may be spaced apart from each other by a certain distance in the first direction. Although not shown in FIG. 1, anti-fuse insulation layers may be disposed between the anti-fuse gates 171, 172, 173 and 174 and the well regions 130a, 130b, 130c and 130d. The anti-fuse insulation layers may extend to be disposed between the anti-fuse gates 171, 172, 173 and 174 and the deep well region 120. That is, the anti-fuse gates 171, 172, 173 and 174 may be electrically insulated from the deep well region 120 and the well regions 130a, 130b, 130c and 130d by the anti-fuse insulation layers. The anti-fuse gates 171, 172, 173 and 174 may be disposed in a plurality of columns, respectively. For example, the first anti-fuse gate 171 may be disposed in a first column, the second anti-fuse gate 172 may be disposed in a second column, the third anti-fuse gate 173 may be disposed in a third column, and the fourth anti-fuse gate 174 may be disposed in a fourth column. Accordingly, the anti-fuse gates 171, 172, 173 and 174 respectively disposed in the first to fourth columns may intersect the well regions 130a, 130b, 130c and 130d respectively disposed in the first to fourth rows to provide a plurality of cross-points thereof.

A plurality of unit cells of the anti-fuse type OTP memory cell array 100 may be located at the cross-points of the first to fourth well regions 130a, 130b, 130c and 130d and the first to fourth anti-fuse gates 171, 172, 173 and 174, respectively. Accordingly, the anti-fuse type OTP memory cell array 100 may include sixteen unit cells which are arrayed to have a '4×4' matrix form. Each of the unit cells of the anti-fuse type OTP memory cell array 100 may be defined by one of the rows in which the well regions 130a, 130b, 130c and 130d are disposed and one of the columns in which the anti-fuse gates 171, 172, 173 and 174 are disposed. For example, a unit cell located at a cross point of the first row and the first column may correspond to a unit cell C11 disposed at a cross point of the first well region 130a and the first anti-fuse gate 171. Similarly, a unit cell located at a cross point of the first row and the second column may correspond to a unit cell C12 disposed at a cross point of the first well region 130a and the second anti-fuse gate 172. As such, the remaining unit cells may also be defined by one of the rows and one of the columns.

A plurality of first source/drain regions 141a, 142a and 143a and a first drain region 144a may be disposed in the first well region 130a which is located in the first row. Although not shown in FIG. 1, sidewalls and bottom surfaces of the first source/drain regions 141a, 142a and 143a and the first drain region 144a may be surrounded by the first well region 130a. The first source/drain regions 141a, 142a and 143a and the first drain region 144a may be arrayed in the first direction and may be spaced apart from each other. The first drain region 144a may be disposed at a side of the fourth anti-fuse gate 174 opposite to the third anti-fuse gate 173 and may be exposed at a top surface of the first well region 130a. The first source/drain region 141a may be located and exposed between the first and second anti-fuse gates 171 and 172 in a plan view. The first source/drain region 142a may be located and exposed between the second and third anti-fuse gates 172 and 173 in a plan view. The first source/drain region 143a may be located and exposed between the third and fourth anti-fuse gates 173 and 174 in a plan view. The first source/drain regions 141a, 142a and 143a may be self-aligned with the first, second, third and fourth anti-fuse gates 171, 172, 173 and 174. Although not shown in FIG. 1, each of the first source/drain regions 141a, 142a and 143a may have two opposite sidewalls that partially overlap with two of the adjacent first to fourth anti-fuse gates 171, 172, 173 and 174. The first drain region 144a may have a sidewall that partially overlaps with the fourth anti-fuse gate 174. The first source/drain regions 141a, 142a and 143a and the first drain region 144a may be N-type when the first well region 130a is P-type.

A plurality of second source/drain regions 141b, 142b and 143b and a second drain region 144b may be disposed in the second well region 130b which is located in the second row. Although not shown in FIG. 1, sidewalls and bottom surfaces of the second source/drain regions 141b, 142b and 143b and the second drain region 144b may be surrounded by the second well region 130b. The second source/drain regions 141b, 142b and 143b and the second drain region 144b may be arrayed in the first direction and may be spaced apart from each other. The second drain region 144b may be disposed at a side of the fourth anti-fuse gate 174 opposite to the third anti-fuse gate 173 and may be exposed at a top surface of the second well region 130b. The second source/drain region 141b may be located and exposed between the first and second anti-fuse gates 171 and 172 in a plan view. The second source/drain region 142b may be located and exposed between the second and third anti-fuse gates 172 and 173 in a plan view. The second source/drain region 143b may be located and exposed between the third and fourth anti-fuse gates 173 and 174 in a plan view. The second source/drain regions 141b, 142b and 143b may be self-aligned with the first, second, third and fourth anti-fuse gates 171, 172, 173 and 174. Although not shown in FIG. 1, each of the second source/drain regions 141b, 142b and 143b may have two opposite sidewalls that partially overlap with two of the adjacent first to fourth anti-fuse gates 171, 172, 173 and 174. The second drain region 144b may have a sidewall that partially overlaps with the fourth anti-fuse gate 174. The second source/drain regions 141b, 142b and 143b and the second drain region 144b may be N-type when the second well region 130b is P-type.

A plurality of third source/drain regions 141c, 142c and 143c and a third drain region 144c may be disposed in the third well region 130c which is located in the third row. Although not shown in FIG. 1, sidewalls and bottom surfaces of the third source/drain regions 141c, 142c and 143c and the third drain region 144c may be surrounded by the third well region 130c. The third source/drain regions 141c, 142c and 143c and the third drain region 144c may be arrayed in the first direction and may be spaced apart from each other. The third drain region 144c may be disposed at a side of the fourth anti-fuse gate 174 opposite to the third anti-fuse gate 173 and may be exposed at a top surface of the third well region 130c. The third source/drain region 141c may be located and exposed between the first and second anti-fuse gates 171 and 172 in a plan view. The third source/drain region 142c may be located and exposed between the second and third anti-fuse gates 172 and 173 in a plan view. The third source/drain region 143c may be located and exposed between the third and fourth anti-fuse gates 173 and 174 in a plan view. The third source/drain regions 141c, 142c and 143c may be self-aligned with the first, second, third and fourth anti-fuse gates 171, 172, 173 and 174. Although not shown in FIG. 1, each of the third source/drain regions 141c, 142c and 143c may have two opposite sidewalls that are partially overlap with two of the adjacent first to fourth anti-fuse gates 171, 172, 173 and 174. The third drain region 144c may have a sidewall that partially overlaps with the fourth anti-fuse gate 174. The third source/drain regions 141c, 142c and 143c and the third drain region 144c may be N-type when the third well region 130c is P-type.

A plurality of fourth source/drain regions 141d, 142d and 143d and a fourth drain region 144d may be disposed in the fourth well region 130d which is located in the fourth row. Although not shown in FIG. 1, sidewalls and bottom surfaces of the fourth source/drain regions 141d, 142d and 143d and the fourth drain region 144d may be surrounded by the fourth well region 130d. The fourth source/drain regions 141d, 142d and 143d and the fourth drain region 144d may be arrayed in the first direction and may be spaced apart from each other. The fourth drain region 144d may be disposed at a side of the fourth anti-fuse gate 174 opposite to the third anti-fuse gate 173 and may be exposed at a top surface of the fourth well region 130d. The fourth source/drain region 141d may be located and exposed between the first and second anti-fuse gates 171 and 172 in a plan view. The fourth source/drain region 142d may be located and exposed between the second and third anti-fuse gates 172 and 173 in a plan view. The fourth source/drain region 143d may be located and exposed between the third and fourth anti-fuse gates 173 and 174 in a plan view. The fourth source/drain regions 141d, 142d and 143d may be self-aligned with the first, second, third and fourth anti-fuse gates 171, 172, 173 and 174. Although not shown in FIG. 1, each of the fourth source/drain regions 141d, 142d and 143d may have two opposite sidewalls that partially overlap with two of the adjacent first to fourth anti-fuse gates 171, 172, 173 and 174. The fourth drain region 144d may have a sidewall that partially overlaps with the fourth anti-fuse gate 174. The fourth source/drain regions 141d, 142d and 143d and the fourth drain region 144d may be N-type when the fourth well region 130d is P-type.

Any one of the source/drain regions may be disposed in each row between the first anti-fuse gate 171 located in the first column and the second anti-fuse gate 172 located in the second column. That is, the first source/drain region 141a may be disposed in the first well region 130a located in the first row between the first and second anti-fuse gates 171 and 172, and the second source/drain region 141b may be disposed in the second well region 130b located in the second row between the first and second anti-fuse gates 171 and 172. Similarly, the third source/drain region 141c may be disposed in the third well region 130c located in the third row between the first and second anti-fuse gates 171 and 172, and the fourth source/drain region 141d may be disposed in the fourth well region 130d located in the fourth row between the first and second anti-fuse gates 171 and 172. The first, second, third and fourth source/drain regions 141a, 141b, 141c and 141d may serve as drain regions of cell transistors constituting the unit cells arrayed in the first column and may also serve as source regions of cell transistors constituting the unit cells arrayed in the second column.

Any one of the source/drain regions may be disposed in each row between the second anti-fuse gate 172 located in the second column and the third anti-fuse gate 173 located in the third column. That is, the first source/drain region 142a may be disposed in the first well region 130a located in the first row between the second and third anti-fuse gates 172 and 173, and the second source/drain region 142b may be disposed in the second well region 130b located in the second row between the second and third anti-fuse gates 172 and 173. Similarly, the third source/drain region 142c may be disposed in the third well region 130c located in the third row between the second and third anti-fuse gates 172 and 173, and the fourth source/drain region 142d may be disposed in the fourth well region 130d located in the fourth row between the second and third anti-fuse gates 172 and 173. The first, second, third and fourth source/drain regions 142a, 142b, 142c and 142d may serve as drain regions of cell transistors constituting the unit cells arrayed in the second column and may also serve as source regions of cell transistors constituting the unit cells arrayed in the third column.

Any one of the source/drain regions may be disposed in each row between the third anti-fuse gate 173 located in the third column and the fourth anti-fuse gate 174 located in the fourth column. That is, the first source/drain region 143a may be disposed in the first well region 130a located in the first row between the third and fourth anti-fuse gates 173 and 174, and the second source/drain region 143b may be disposed in the second well region 130b located in the second row between the third and fourth anti-fuse gates 173 and 174. Similarly, the third source/drain region 143c may be disposed in the third well region 130c located in the third row between the third and fourth anti-fuse gates 173 and 174, and the fourth source/drain region 143d may be disposed in the fourth well region 130d located in the fourth row between the third and fourth anti-fuse gates 173 and 174. The first, second, third and fourth source/drain regions 143a, 143b, 143c and 143d may serve as drain regions of cell transistors constituting the unit cells arrayed in the third column and may also serve as source regions of cell transistors constituting the unit cells arrayed in the fourth column.

A unit cell of the anti-fuse type OTP memory cell array 100 may be configured to have a single MOS transistor structure. For example, the unit cell C12 located at a cross point of the first row and the second column may be an MOS transistor which is composed of the first well region 130a, the first source/drain regions 141a and 142a, and the second anti-fuse gate 172. The first source/drain region 141a may serve as a source region of the unit cell C12, and the first source/drain region 142a may serve as a drain region of the unit cell C12. As described above, the anti-fuse insulation layer, i.e., a second anti-fuse insulation layer, may be disposed between the first well region 130a and the second anti-fuse gate 172. Each of the other unit cells arrayed in the second and third columns except for the first column and the last column, i.e., the fourth column, may also have the same structure as the unit cell C12.

Each of the unit cells arrayed in the last column, i.e., the fourth column, may also have a single MOS transistor structure. For example, a unit cell C14 located at a cross point of the first row and the fourth column may be a MOS transistor which is composed of the first well region 130a, the first source/drain region 143a, the first drain region 144a and the fourth anti-fuse gate 174. The first source/drain region 143a may serve as a source region of the unit cell C14, and the first drain region 144a may serve as a drain region of the unit cell C14. Each of the remaining unit cells arrayed in the last column, i.e., the fourth column, may also have the same structure as the unit cell C14.

In contrast, each of the unit cells arrayed in the first column may have a half MOS transistor structure. For example, the unit cell C11 located at a cross point of the first row and the first column may be a half MOS transistor which is composed of the first well region 130a, the first source/drain region 141a and the first anti-fuse gate 171. The first source/drain region 141a may serve as a drain region of the unit cell C11, and no source region is provided in the unit cell C11. Each of the remaining the unit cells arrayed in the first column may also have the same structure as the unit cell C11.

A deep well contact region 122 may be disposed in the deep well region 120. The deep well contact region 122 may be spaced apart from the first to fourth well regions 130a, 130b, 130c and 130d. The deep well contact region 122 may have the same conductivity type, e.g., the first conductivity type, as the deep well region 120 and may have an impurity concentration which is higher than an impurity concentration of the deep well region 120. The deep well contact region 122 may be electrically connected to a deep well bias line NWL through a deep well bias line contact 123. Although FIG. 1 illustrates an example in which a single deep well contact region 122 is disposed in the deep well region 120, the present disclosure is not limited thereto. For example, in some embodiments, a plurality of deep well contact regions may be disposed in the deep well region 120. In this case, the plurality of deep well contact regions may be connected to the deep well bias line NWL.

A first well contact region 132a, a second well contact region 132b, a third well contact region 132c and a fourth well contact region 132d may be disposed in the first to fourth well regions 130a, 130b, 130c and 130d, respectively. The first to fourth well contact regions 132a, 132b, 132c and 132d may have the same conductivity type, e.g, the second conductivity type, as the first to fourth well regions 130a, 130b, 130c and 130d. In addition, the first to fourth well contact regions 132a, 132b, 132c and 132d may have an impurity concentration which is higher than an impurity concentration of the first to fourth well regions 130a, 130b, 130c and 130d.

The first anti-fuse gate 171 may be electrically connected to a first word line WL1 through a first word line contact 181, and the second anti-fuse gate 172 may be electrically connected to a second word line WL2 through a second word line contact 182. Similarly, the third anti-fuse gate 173 may be electrically connected to a third word line WL3 through a third word line contact 183, and the fourth anti-fuse gate 174 may be electrically connected to a fourth word line WL4 through a fourth word line contact 184. The first well contact region 132a may be electrically connected to a first well bias line PWL1 through a first well bias line contact 191a, and the second well contact region 132b may be electrically connected to a second well bias line PWL2 through a second well bias line contact 191b. Similarly, the third well contact region 132c may be electrically connected to a third well bias line PWL3 through a third well bias line contact 191c, and the fourth well contact region 132d may be electrically connected to a fourth well bias line PWL4 through a fourth well bias line contact 191d. The first drain region 144a in the first well region 130a may be electrically connected to a first bit line BL1 through a first bit line contact 192a, and the second drain region 144b in the second well region 130b may be electrically connected to a second bit line BL2 through a second bit line contact 192b. Similarly, the third drain region 144c in the third well region 130c may be electrically connected to a third bit line BL3 through a third bit line contact 192c, and the fourth drain region 144d in the fourth well region 130d may be electrically connected to a fourth bit line BL4 through a fourth bit line contact 192d.

Although FIG. 1 illustrates an example in which the anti-fuse type OTP memory cell array 100 includes sixteen unit cells which are arrayed in a '4×4' matrix form defined by the first to fourth well regions 130a, 130b, 130c and 130d and the first to fourth anti-fuse gates 171, 172, 173 and 174, the present disclosure is not limited thereto. For example, in some embodiments, the anti-fuse type OTP memory cell array 100 may include a plurality of unit cells which are arrayed in another matrix form defined by one, two, three, five or more well regions and one, two, three, five or more anti-fuse gates. In some other embodiments, the number of well regions may be different from the number of anti-fuse gates. In any case, an anti-fuse type OTP memory cell array according to the present disclosure may be based on the configuration described with reference to FIG. 1.

Figure 2:
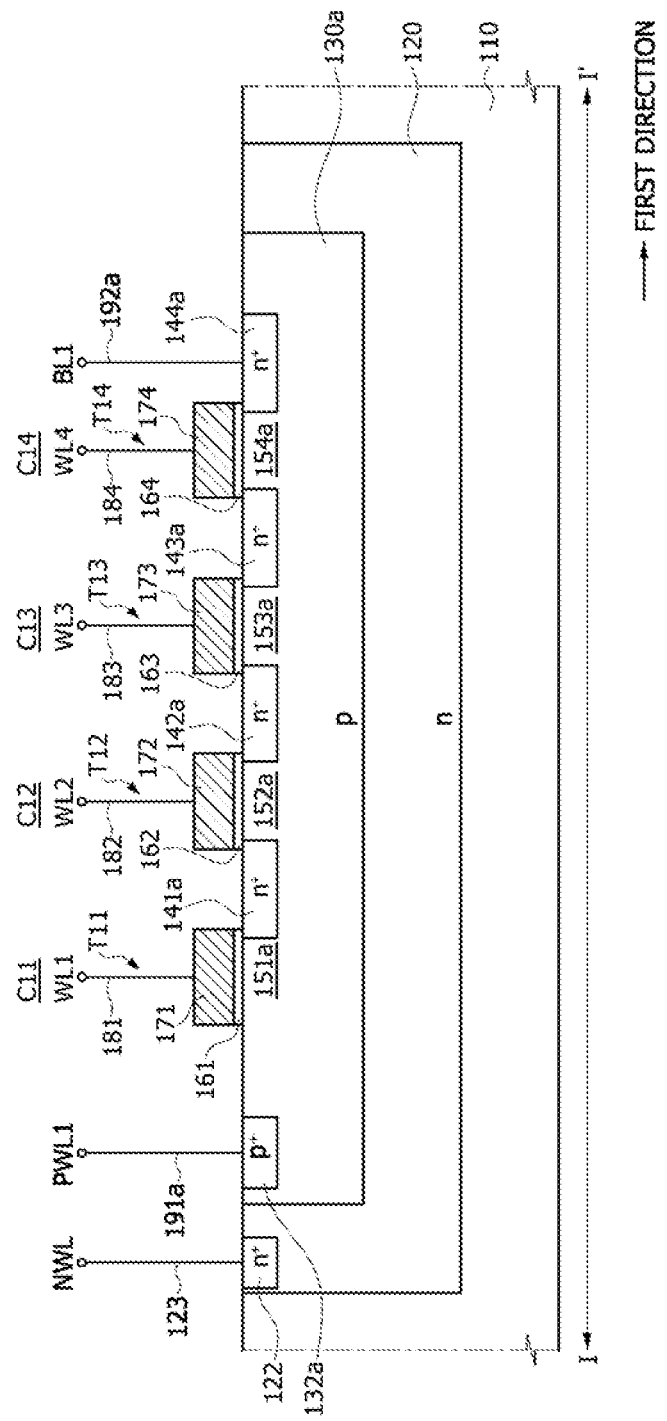
FIG. 2 is a cross-sectional view taken along a line I-I' of FIG. 1.

FIG. 2 is a cross-sectional view taken along a line of I-I' of FIG. 1. FIG. 2 illustrates cross-sectional views of first transistors T11, T12, T13 and T14 corresponding to the unit cells C11, C12, C13 and C14 that are respectively disposed at cross points of the first row and the first to fourth columns in FIG. 1. Each of cross-sectional views taken along the second, third and fourth rows may be substantially the same as the cross-sectional view illustrated in FIG. 2. In FIGS. 1 and 2, the same reference numerals or the same reference designators denote the same elements.

Referring to FIGS. 1 and 2, the deep well region 120 of the first conductivity type, for example, an N-type deep well region may be disposed in an upper region of a substrate 110. The deep well contact region 122 and the first well region 130a may be disposed in an upper region of the deep well region 120. Accordingly, sidewalls and a bottom surface of the deep well contact region 122 as well as sidewalls and a bottom surface of the first well region 130a may be surrounded by the deep well region 120. As described with reference to FIG. 1, the number of the deep well contact regions 122 disposed in the deep well region 120 may be equal to or greater than one. The deep well contact region 122 may have the same conductivity type as the deep well region 120. However, the impurity concentration of the deep well contact region 122 may be higher than the impurity concentration of the deep well region 120.

The first well contact region 132a, the plurality of first source/drain regions 141a, 142a and 143a, and the first drain region 144a may be sequentially arrayed in an upper region of the first well region 130a to be spaced apart from each other in the first direction. The first well contact region 132a may have the same conductivity type as the first well region 130a. However, the impurity concentration of the first well contact region 132a may be higher than the impurity concentration of the first well region 130a. All of the first source/drain regions 141a, 142a and 143a and the first drain region 144a may be N-type. A first channel region 151a in the first column may be disposed at a side of the first source/drain region 141a opposite to the first drain region 144a. A first channel region 152a in the second column may be disposed between the first source/drain regions 141a and 142a. A first channel region 153a in the third column may be disposed between the first source/drain regions 142a and 143a. Moreover, a first channel region 154a in the fourth column may be disposed between the first source/drain region 143a and the first drain region 144a.

A first anti-fuse insulation layer 161 and the first anti-fuse gate 171 may be sequentially stacked on the first channel region 151a in the first column. One sidewalls of the first anti-fuse insulation layer 161 and the first anti-fuse gate 171 may be vertically aligned with a first sidewall of the first source/drain region 141a. A second anti-fuse insulation layer 162 and the second anti-fuse gate 172 may be sequentially stacked on the first channel region 152a in the second column. One sidewalls of the second anti-fuse insulation layer 162 and the second anti-fuse gate 172 may be vertically aligned with a second sidewall of the first source/drain region 141a, and second sidewalls of the second anti-fuse insulation layer 162 and the second anti-fuse gate 172 may be vertically aligned with a first sidewall of the first source/drain region 142a. A third anti-fuse insulation layer 163 and the third anti-fuse gate 173 may be sequentially stacked on the first channel region 153a in the third column. One sidewalls of the third anti-fuse insulation layer 163 and the third anti-fuse gate 173 may be vertically aligned with a second sidewall of the first source/drain region 142a, and second sidewalls of the third anti-fuse insulation layer 163 and the third anti-fuse gate 173 may be vertically aligned with a first sidewall of the first source/drain region 143a. A fourth anti-fuse insulation layer 164 and the fourth anti-fuse gate 174 may be sequentially stacked on the first channel region 154a in the fourth column. One sidewall of the fourth anti-fuse insulation layer 164 and the fourth anti-fuse gate 174 may be vertically aligned with a second sidewall of the first source/drain region 143a, and second sidewalls of the fourth anti-fuse insulation layer 164 and the fourth anti-fuse gate 174 may be vertically aligned with a first sidewall of the first drain region 144a.

The first transistor T11 in the first column among the first transistors T11, T12, T13 and T14 arrayed in the first row may have a half MOS transistor structure. Each of the remaining first transistors T12, T13 and T14 in the first row may have a complete MOS transistor structure.

The first to fourth anti-fuse gates 171, 172, 173 and 174 may be electrically connected to the first to fourth word lines WL1, WL2, WL3 and WL4 through the first to fourth word line contacts 181, 182, 183 and 184, respectively. The deep well contact region 122 may be electrically connected to the deep well bias line NWL through the deep well bias line contact 123. The first well contact region 132a may be electrically connected to the first well bias line PWL1 through the first well bias line contact 191a. The first drain region 144a may be electrically connected to the first bit line BL1 through the first bit line contact 192a.

Figure 3:
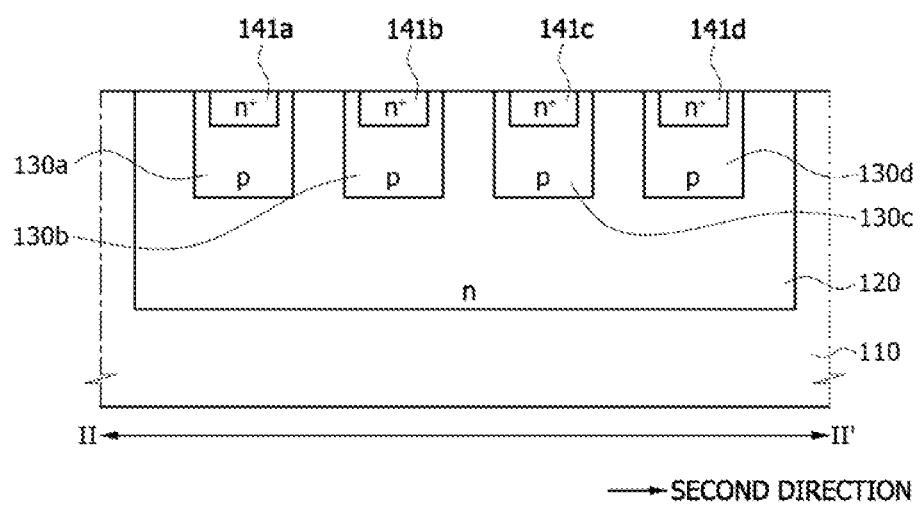
FIG. 3 is a cross-sectional view taken along a line II-II' of FIG. 1.

FIG. 3 is a cross-sectional view taken along a line II-II' of FIG. 1. In FIGS. 1, 2 and 3, the same reference numerals or the same reference designators denote the same elements.

Referring to FIGS. 1 and 3, the first to fourth well regions 130a, 130b, 130c and 130d doped with P-type impurities may be sequentially arrayed in an upper region of the N-type deep well region 120 to be spaced apart from each other in the second direction. The first source/drain regions 141a, 141b, 141c and 141d doped with N-type impurities may be disposed in upper regions of the first to fourth well regions 130a, 130b, 130c and 130d, respectively.

Since sidewalls and bottom surfaces of the first to fourth well regions 130a, 130b, 130c and 130d doped with P-type impurities are surrounded by the N-type deep well region 120, the first to fourth well regions 130a, 130b, 130c and 130d may be electrically isolated from each other by the N-type deep well region 120. Specifically, when any one of the first to fourth well regions, for example, the first well region 130a is grounded and a positive bias voltage is applied to the deep well region 120, a PN junction between the first well region 130a and the deep well region 120 may be reverse-biased to electrically isolate the first well region 130a from the other well regions, i.e., the second, third and fourth well regions 130b, 130c and 130d. That is, when a positive voltage is applied to the deep well region 120 and a ground voltage is applied to a specific well region, electrical operations executed in the specific well region may not influence the other well regions. Even though the same bias voltage is applied to both of the first well region 130a and the deep well region 120, the first well region 130a may still be electrically isolated from the second, third and fourth well regions 130b, 130c and 130d because of a built-in potential existing in the PN junction between the first well region 130a and the deep well region 120.

Figure 4:
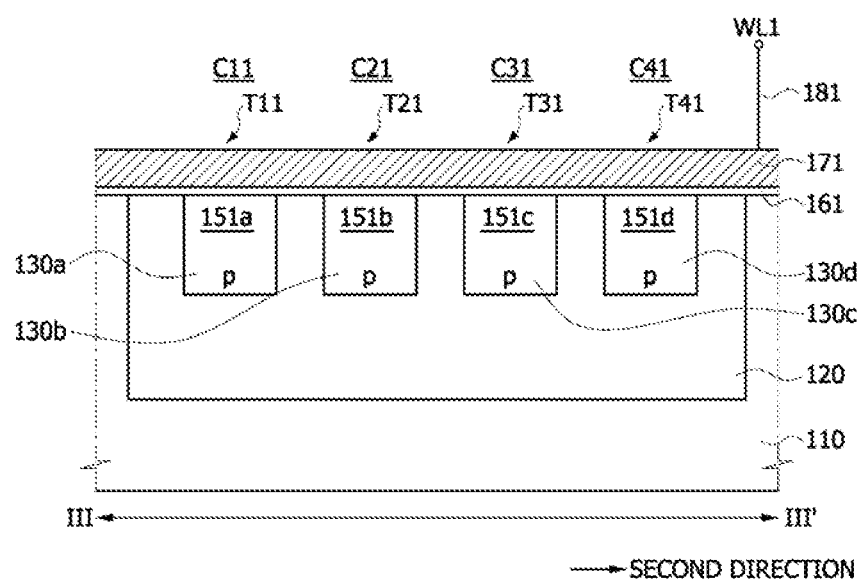
FIG. 4 is a cross-sectional view taken along a line III-III' of FIG. 1.

FIG. 4 is a cross-sectional view taken along a line III-III' of FIG. 1. FIG. 4 illustrates cross-sectional views of channel regions of transistors T11, 121, T31 and T41 corresponding to unit cells C11, C21, C31 and C41 that are respectively disposed at cross points of the first column and the first to fourth rows in FIG. 1. Each of cross-sectional views taken along the second, third and fourth columns may be substantially the same as the cross-sectional view illustrated in FIG. 4. In FIGS. 1, 2, 3 and 4, the same reference numerals or the same reference designators denote the same elements.

Referring to FIGS. 1 and 4, the first to fourth well regions 130a, 130b, 130c and 130d doped with P-type impurities may be sequentially arrayed in an upper region of the N-type deep well region 120 to be spaced apart from each other in the second direction, as described with reference to FIG. 3. The first channel region 151a located at a cross point of the first row and the first column may be disposed in an upper region of the first well region 130a overlapping with the first anti-fuse insulation layer 161 and the first anti-fuse gate 171. A second channel region 151b located at a cross point of the second row and the first column may be disposed in an upper region of the second well region 130b overlapping with the first anti-fuse insulation layer 161 and the first anti-fuse gate 171. A third channel region 151c located at a cross point of the third row and the first column may be disposed in an upper region of the third well region 130c overlapping with the first anti-fuse insulation layer 161 and the first anti-fuse gate 171. A fourth channel region 151d located at a cross point of the fourth row and the first column may be disposed in an upper region of the fourth well region 130d overlapping with the first anti-fuse insulation layer 161 and the first anti-fuse gate 171. When the first to fourth well regions 130a, 130b, 130c and 130d are grounded and a positive gate voltage, greater than a threshold voltage, is applied to the first anti-fuse gate 171, inversion channels may be formed in the first to fourth channel regions 151a, 151b, 151c and 151d to provide conductive paths between adjacent source/drain regions or between a source/drain region and a drain region.

Figure 5:
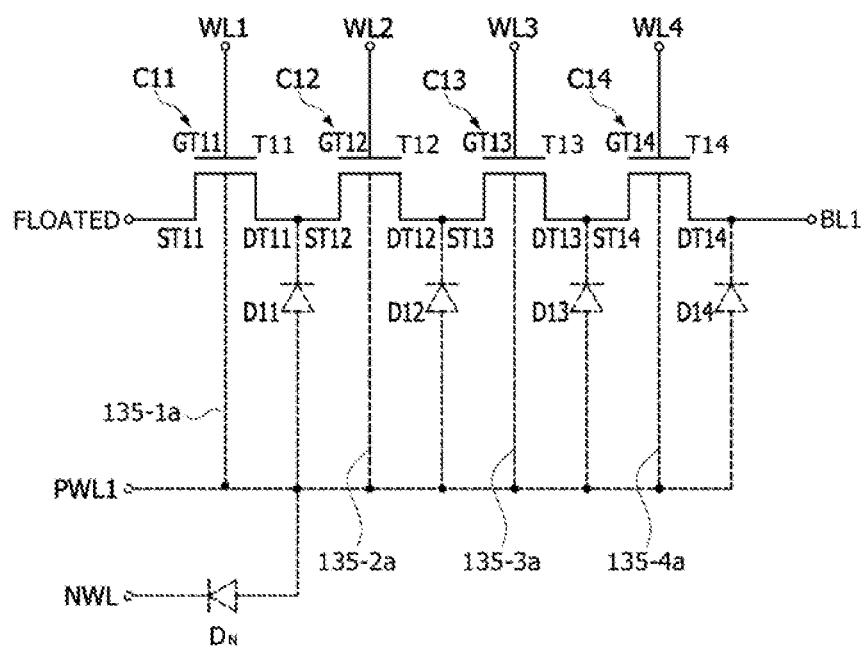
FIG. 5 is an equivalent circuit diagram illustrating the cross-sectional view shown in FIG. 2.

FIG. 5 is an equivalent circuit diagram illustrating the cross-sectional view shown in FIG. 2. Although FIG. 5 illustrates only the equivalent circuit diagram of the unit cells C11, C12, C13 and C14 arrayed in the first row, each of equivalent circuit diagrams corresponding to cross-sectional views taken along the other rows, i.e., the second, third and fourth rows, may also be substantially the same as the equivalent circuit diagram shown in FIG. 5.

Referring to FIGS. 1, 2 and 5, the unit cell C11 in the first row may correspond to the transistor T11 having a half MOS transistor structure, and the remaining unit cells C12, C13 and C14 arrayed in the first row may correspond to the transistors T12, T13 and T14, each of which has a complete MOS transistor structure. That is, the anti-fuse type OTP memory cell array 100 does not include any selection transistor for selecting a specific unit cell among the unit cells C11, C12, C13 and C14 arrayed in the first row. The transistors T11, T12, T13 and T14 may be sequentially connected in series. That is, a drain terminal DT11 of the transistor T11 located at a cross point of the first row and the first column may be electrically connected to a source terminal ST12 of the transistor T12 located at a cross point of the first row and the second column, a drain terminal DT12 of the transistor T12 located at a cross point of the first row and the second column may be electrically connected to a source terminal ST13 of the transistor T13 located at a cross point of the first row and the third column, and a drain terminal DT13 of the transistor T13 located at a cross point of the first row and the third column may be electrically connected to a source terminal ST14 of the transistor T14 located at a cross point of the first row and the fourth column. A source terminal ST11 of the transistor T11 located at a cross point of the first row and the first column may electrically float, and a drain terminal DT14 of the transistor T14 located at a cross point of the first row and the fourth column may be electrically connected to the first bit line BL1.

A gate terminal GT11 of the transistor T11 located at a cross point of the first row and the first column may be electrically connected to the first word line WL1. A gate terminal GT12 of the transistor T12 located at a cross point of the first row and the second column may be electrically connected to the second word line WL2. A gate terminal GT13 of the transistor T13 located at a cross point of the first row and the third column may be electrically connected to the third word line WL3. A gate terminal GT14 of the transistor T14 located at a cross point of the first row and the fourth column may be electrically connected to the fourth word line WL4. The drain terminal DT11 of the transistor T11 and the source terminal ST12 of the transistor T12 may be electrically connected to a cathode of a first diode D11 located at a cross point of the first row and the first column, and the drain terminal DT12 of the transistor T12 and the source terminal ST13 of the transistor T13 may be electrically connected to a cathode of a first diode D12 located at a cross point of the first row and the second column. Similarly, the drain terminal DT13 of the transistor T13 and the source terminal ST14 of the transistor T14 may be electrically connected to a cathode of a first diode D13 located at a cross point of the first row and the third column, and the drain terminal DT14 of the transistor T14 may be electrically connected to a cathode of a first diode D14 located at a cross point of the first row and the fourth column. Anodes of the first diodes D11, D12, D13 and D14 may be electrically connected to the first well bias line PWL1. The anodes of the first diodes D11, D12, D13 and D14 may also be electrically connected to an anode of a deep well diode $D_N$. A cathode of the deep well diode $D_N$ may be electrically connected to the deep well bias line NWL.

The gate terminal GT11 and the drain terminal DT11 of the transistor T11 constituting the unit cell C11 located at a cross point of the first row and the first column may correspond to the first anti-fuse gate 171 and the first source/drain region 141a described with reference to FIGS. 1 and 2, respectively. No diffusion region corresponding to the floated source terminal ST11 of the transistor T11 may be present in the substrate 110. The gate terminal GT12, the source terminal ST12 and the drain terminal DT12 of the transistor T12 constituting the unit cell C12 located at a cross point of the first row and the second column may correspond to the second anti-fuse gate 172, the first source/drain region 141a and the first source/drain region 142a, respectively. The first source/drain region 141a may serve as the drain terminal DT11 of the transistor T11 and the source terminal ST12 of the transistor T12. The gate terminal GT13, the source terminal ST13 and the drain terminal DT13 of the transistor T13 constituting the unit cell C13 located at a cross point of the first row and the third column may correspond to the third anti-fuse gate 173, the first source/drain region 142a and the first source/drain region 143a, respectively. The first source/drain region 142a may serve as the drain terminal DT12 of the transistor T12 and the source terminal ST13 of the transistor T13. The gate terminal GT14, the source terminal ST14 and the drain terminal DT14 of the transistor T14 constituting the unit cell C14 located at a cross point of the first row and the fourth column may correspond to the fourth anti-fuse gate 174, the first source/drain region 143a and the first drain region 144a, respectively. The first source/drain region 143a may serve as the drain terminal DT13 of the transistor T13 and the source terminal ST14 of the transistor T14.

The first diode D11 may correspond to a parasitic diode component which is composed of the first well region 130a and the first source/drain region 141a, and the first diode D12 may correspond to a parasitic diode component which is composed of the first well region 130a and the first source/drain region 142a. Moreover, the first diode D13 may correspond to a parasitic diode component which is composed of the first well region 130a and the first source/drain region 143a, and the first diode D14 may correspond to a parasitic diode component which is composed of the first well region 130a and the first drain region 144a. In addition, the deep well diode $D_N$ may correspond to a parasitic diode component which is composed of the first well region 130a and the deep well region 120.

The first well region 130a may serve as a common bulk region of the transistors T11, T12, T13 and T14 arrayed in the first row. Thus, the first channel region 151a of the transistor T11 may be electrically connected to the first well bias line PWL1 through a line 135-1a, and the first channel region 152a of the transistor T12 may be electrically connected to the first well bias line PWL1 through a line 135-2a. Similarly, the first channel region 153a of the transistor T13 may be electrically connected to the first well bias line PWL1 through a line 135-3a, and the first channel region 154a of the transistor T14 may be electrically connected to the first well bias line PWL1 through a line 135-4a.

Figure 6:
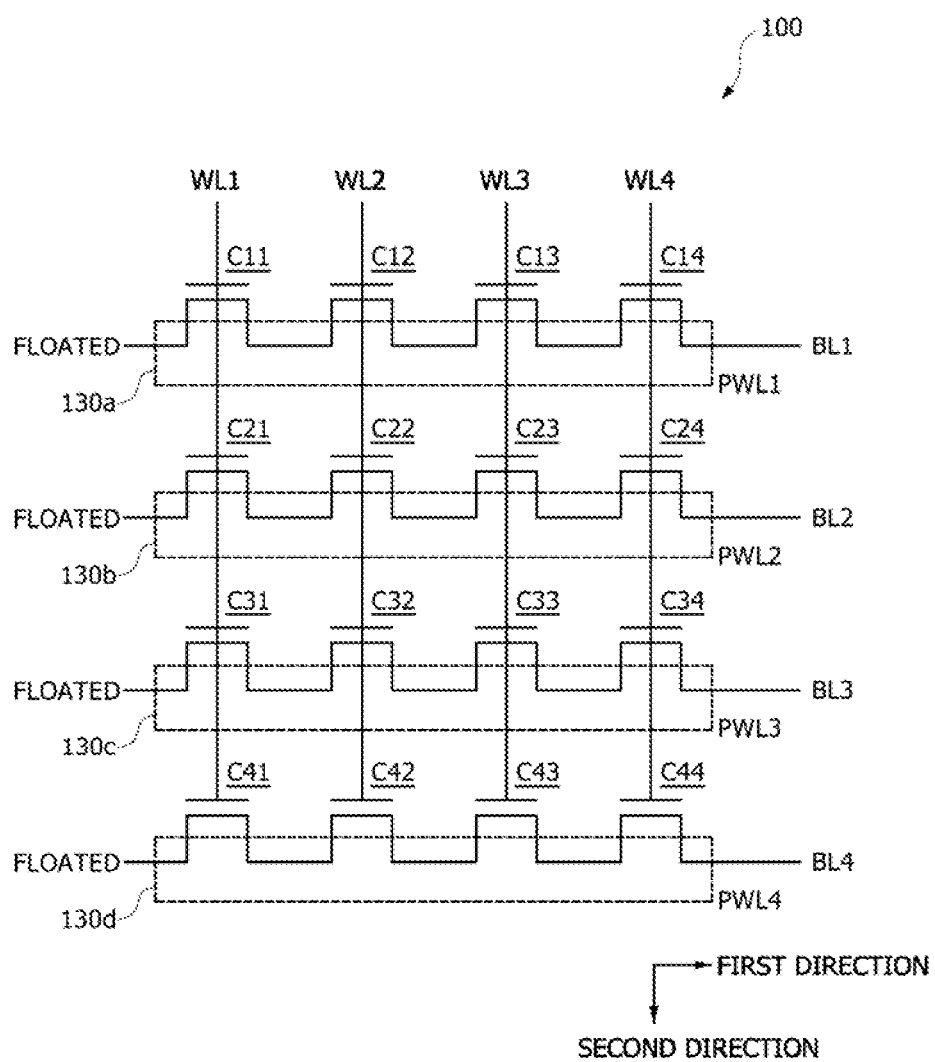
FIG. 6 is an equivalent circuit diagram illustrating the anti-fuse type OTP memory cell array shown in FIG. 1.

FIG. 6 is an equivalent circuit diagram illustrating the anti-fuse type OTP memory cell array 100 shown in FIG. 1. The anti-fuse type OTP memory cell array 100 of FIG. 6 may correspond to an equivalent circuit diagram of a plurality of rows, each of which has substantially the same configuration as the first row described with reference to FIG. 5. FIG. 6 illustrates the equivalent circuit diagram of the anti-fuse type OTP memory cell array 100 without the parasitic diodes D11, D12, D13, D14 and $D_N$ shown in FIG. 5. In addition, FIG. 6 illustrates the well regions 130a, 130b, 130c and 130d as rectangular boxes plotted by dotted lines.

Referring to FIG. 6, the plurality of word lines WL1, WL2, WL3 and WL4 may be arrayed in the first direction, and the plurality of well regions 130a, 130b, 130c and 130d may be arrayed in the second direction. As described with reference to FIG. 1, the first to fourth well regions 130a, 130b, 130c and 130d may be electrically connected to the first to fourth well bias lines PWL1, PWL2, PWL3 and PWL4, respectively. Accordingly, the plurality of word lines WL1, WL2, WL3 and WL4 may be disposed to be parallel with the columns, and the plurality of well bias lines PWL1, PWL2, PWL3 and PWL4 may be disposed to be parallel with the rows. This arrangement of the word lines WL1, WL2, WL3 and WL4 and the well bias lines PWL1, PWL2, PWL3 and PWL4 is merely an example of many suitable layout diagrams. Accordingly, in some embodiments, the plurality of word lines WL1, WL2, WL3 and WL4 may be disposed to be parallel with the rows, and the plurality of well bias lines PWL1, PWL2, PWL3 and PWL4 may be disposed to be parallel with the columns.

The unit cells C11, C12, C13 and C14 arrayed in the first row may be connected in series in the first direction, i.e., a row direction, and may share the first well bias line PWL1 with each other. The source terminal of the unit cell C11 among the unit cells C11, C12, C13 and C14 arrayed in the first row may float, and the drain terminal of the unit cell C14 may be electrically connected to the first bit line BL1. The unit cells C21, C22, C23 and C24 arrayed in the second row may also be connected in series in the first direction and may share the second well bias line PWL2 with each other. The source terminal of the unit cell C21 among the unit cells C21, C22, C23 and C24 arrayed in the second row may float, and the drain terminal of the unit cell C24 may be electrically connected to the second bit line BL2. The unit cells C31, C32, C33 and C34 arrayed in the third row may also be connected in series in the first direction and may share the third well bias line PWL3 with each other. The source terminal of the unit cell C31 among the unit cells C31, C32, C33 and C34 arrayed in the third row may float, and the drain terminal of the unit cell C34 may be electrically connected to the third bit line BL3. The unit cells C41, C42, C43 and C44 arrayed in the fourth row may also be connected in series in the first direction and may share the fourth well bias line PWL4 with each other. The source terminal of the unit cell C41 among the unit cells C41, C42, C43 and C44 arrayed in the fourth row may float, and the drain terminal of the unit cell C44 may be electrically connected to the fourth bit line BL4.

The unit cells C11, C21, C31 and C41 arrayed in the first column may share the first word line WL1 with each other, and the unit cells C12, C22, C32 and C42 arrayed in the second column may share the second word line WL2 with each other. Similarly, the unit cells C13, C23, C33 and C43 arrayed in the third column may share the third word line WL3 with each other, and the unit cells C14, C24, C34 and C44 arrayed in the fourth column may share the fourth word line WL4 with each other.

FIGS. 7 to 20 are schematic views illustrating program operations of the anti-fuse type OTP memory cell array 100 shown in FIG. 6. In FIGS. 7 to 20, the same reference numerals or the same reference designators as used in FIGS. 1 to 6 denote the same elements.

A program operation of the anti-fuse type OTP memory cell array 100 may include sequentially programming the plurality of unit cells arrayed in any of the rows. For example, the program operation of the anti-fuse type OTP memory cell array 100 may include sequentially programming the plurality of unit cells C11, C12, C13 and C14 arrayed in the first row. That is, according to the program operation of the anti-fuse type OTP memory cell array 100, the unit cell C11 located at a cross point of the first row and the first column may be programmed, and the unit cell C12 located at a cross point of the first row and the second column may then be programmed. Subsequently, the unit cell C13 located at a cross point of the first row and the third column may be programmed, and the unit cell C14 located at a cross point of the first row and the fourth column may then be programmed. In addition, after all of the unit cells C11 C12, C13 and C14 arrayed in the first row are sequentially programmed, any one of the non-programmed rows, for example, the second row may be selected and the unit cells C21, C22, C23 and C24 arrayed in the second row may be sequentially programmed using the same method as used in programming the unit cells C11, C12, C13 and C14. Moreover, after all of the unit cells C21, C22, C23 and C24 arrayed in the second row are sequentially programmed, any one of the non-programmed rows, for example, the third row may be selected and the unit cells C31, C32, C33 and C34 arrayed in the third row may be sequentially programmed using the same method as used in programming the unit cells C11, C12, C13 and C14. Finally, after all of the unit cells C31, C32, C33 and C34 arrayed in the third row are sequentially programmed, the remaining non-programmed row, for example, the fourth row may be selected and the unit cells C41, C42, C43 and C44 arrayed in the fourth row may be sequentially programmed using the same method as used in programming the unit cells C11, C12, C13 and C14. In some embodiments, the rows may be selected in random sequence during the program operation. Hereinafter, a program operation for sequentially programming the unit cells C11, C12, C13 and C14 arrayed in the first row will be described.

Figure 7:
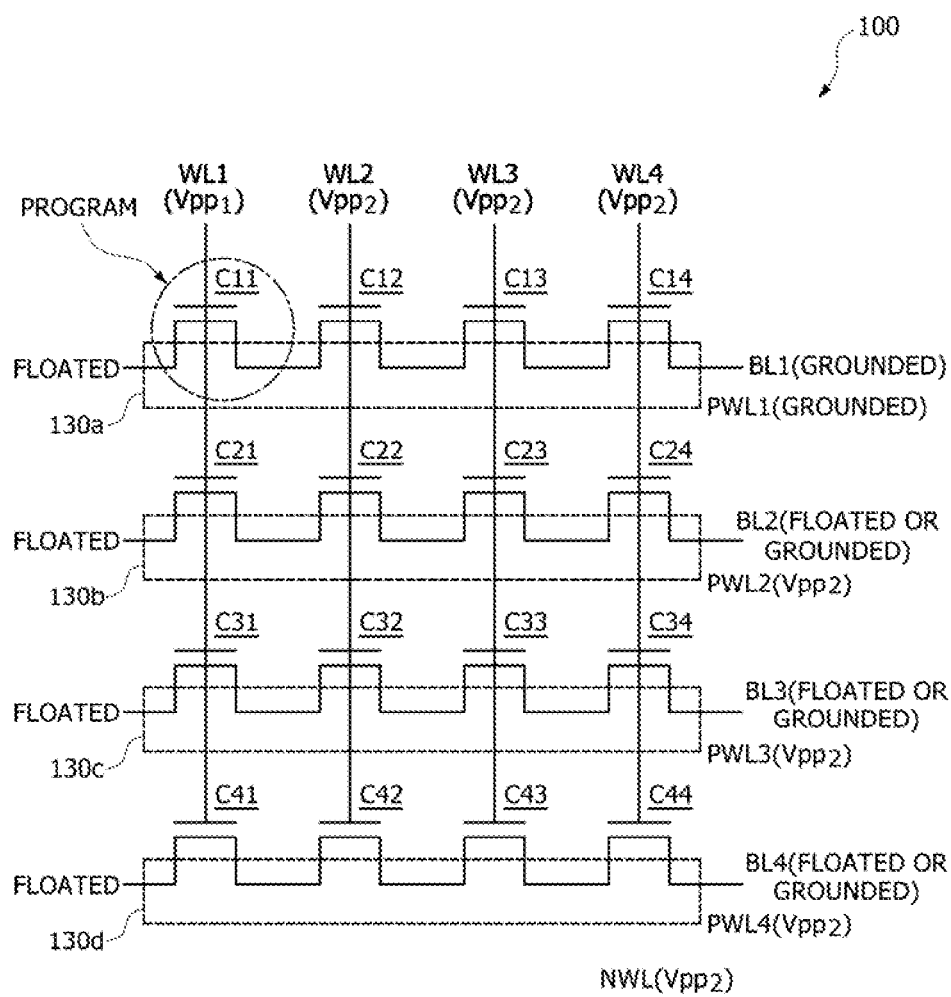
FIGS. 7 to 20 are schematic views illustrating program operations of the anti-fuse type OTP memory cell array shown in FIG. 6.

First, referring to FIG. 7, the unit cell C11 among the unit cells C11, C12, C13 and C14 arrayed in the first row may be programmed. In order to selectively program the unit cell C11, a first program voltage Vpp1 may be applied to the first word line WL1 connected to the selected unit cell C11. The first program voltage Vpp1 may be set to have a voltage level which is capable of rupturing the anti-fuse insulation layer (161 of FIG. 2) of the selected unit cell C11 to form a resistive path. In some embodiments, the first program voltage Vpp1 may have a voltage level of about 10 V to about 20 V. In addition, a second program voltage Vpp2 may be applied to the second, third and fourth word lines WL2, WL3 and WL4 which are respectively connected to the non-selected unit cells C12, C13 and C14. The second program voltage Vpp2 may be set to have a voltage level which is greater than a threshold voltage of the transistors constituting the non-selected unit cells C12, C13 and C14 and capable of preventing the anti-fuse insulation layers (162, 163 and 164 of FIG. 2) of the non-selected unit cells C12, C13 and C14 from being ruptured. In addition, a voltage difference between the first and second program voltages Vpp1 and Vpp2 may be set to prevent the anti-fuse insulation layers (162, 163 and 164 of FIG. 2) of the non-selected unit cells C12, C13 and C14 from being ruptured. In some embodiments, the second program voltage Vpp2 may have a voltage level of about 2 V to about 5 V. Moreover, the first bit line BL1 and the first well bias line PWL1 may be grounded while the unit cells C11, C12, C13 and C14 arrayed in the first row are programmed. Furthermore, the second program voltage Vpp2 may also be applied to the deep well bias line NWL, the second well bias line PWL2, the third well bias line PWL3, and the fourth well bias line PWL4. The other bit lines, that is, the second, third and fourth bit lines BL2, BL3 and BL4 may be floated or grounded.

Figure 8:
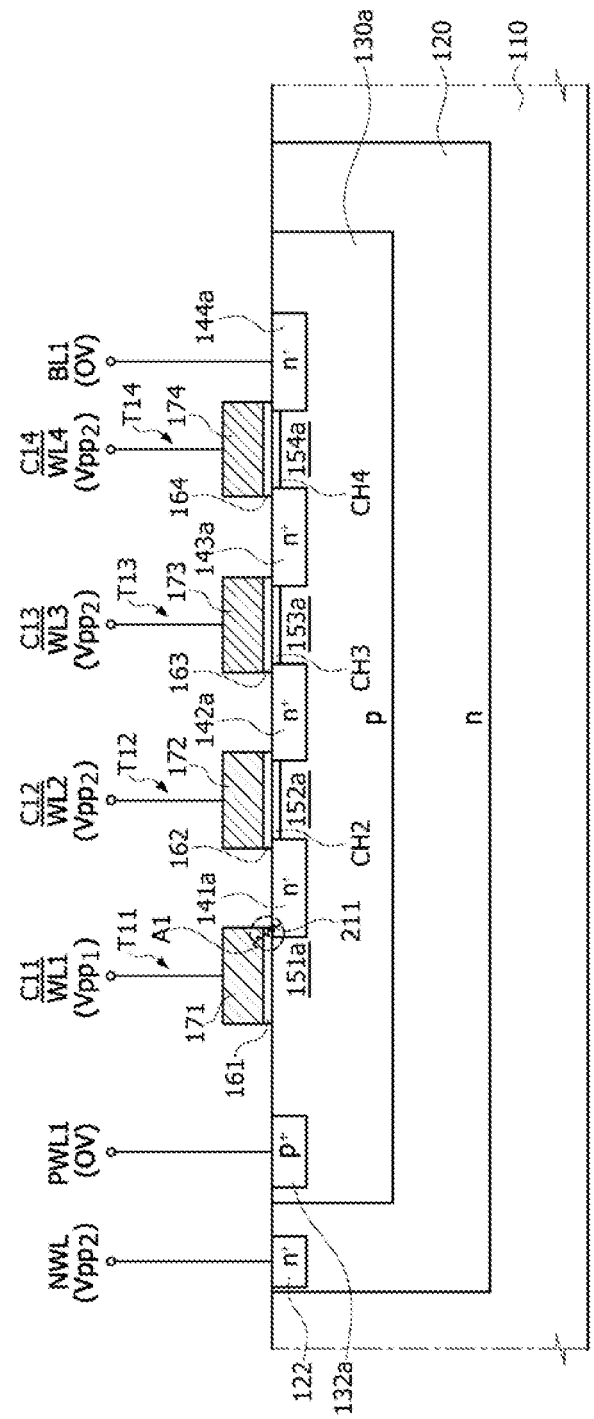

FIG. 8 illustrates a program mechanism of the selected unit cell C11 under the above bias conditions.

As illustrated in FIG. 8, since the second program voltage Vpp2 greater than the threshold voltage of the non-selected unit cells C12, C13 and C14 is applied to all of the second, third and fourth word lines WL2, WL3 and WL4 connected to the non-selected unit cells C12, C13 and C14, the transistors T12, T13 and T14 constituting the non-selected unit cells C12, C13 and C14 may be turned on. As a result, inversion channels CH2, CH3 and CH4 may be formed in the first channel regions 152a, 153a and 154a of the transistors T12, T13 and T14, respectively. An inversion channel may also be formed in the first channel region 151a of the transistor T11 constituting the selected unit cell C11 under the above bias condition. However, the inversion channel formed in the first channel region 151a of the transistor T11 may not influence the program operation of the selected unit cell C11. Thus, no inversion channel is drawn in the first channel region 151a of the transistor T11, as illustrated in FIG. 8.

The ground voltage applied to the first bit line BL1 may be finally transmitted to the inversion channel under the first anti-fuse gate 171 through the first drain region 144a, the inversion channel CH4, the first source/drain region 143a, the inversion channel CH3, the first source/drain region 142a, the inversion channel CH2, and the first source/drain region 141a. Thus, a voltage difference, i.e., the first program voltage Vpp1, between the first program voltage Vpp1 and the ground voltage may be applied between the first anti-fuse gate 171 and the first source/drain region 141a as well as between the first anti-fuse gate 171 and the inversion channel under the first anti-fuse gate 171. The electric field between the first anti-fuse gate 171 and the first source/drain region 141a may be stronger than the electric field between the first anti-fuse gate 171 and the inversion channel under the first anti-fuse gate 171. Accordingly, the first anti-fuse insulation layer 161 between the first anti-fuse gate 171 and the first source/drain region 141a may be ruptured by the first program voltage Vpp1 to form a resistive path 211 through which current flows, as indicated by a portion 'A1' of FIG. 8. As a result, the selected unit cell C11 may be programmed.

In the non-selected unit cell C12 sharing the first well bias line PWL1 with the selected unit cell C11, the second program voltage Vpp2 may be applied between the second anti-fuse gate 172 and the first source/drain region 142a. Since the second program voltage Vpp2 has an insufficient voltage level to rupture the second anti-fuse insulation layer 162, no resistive path is formed in the second anti-fuse insulation layer 162 between the second anti-fuse gate 172 and the first source/drain region 142a. This program inhibition mechanism of the non-selected unit cell C12 may be equally applied to the remaining non-selected unit cells C13 and C14 that share the first well bias line PWL1 with the selected unit cell C11. Furthermore, the program inhibition mechanism of the non-selected unit cell C12 may also be applied to the remaining non-selected unit cells C22, C32 and C42 sharing the second word line WL2 with the non-selected unit cell C12, the remaining non-selected unit cells C23, C33 and C43 sharing the third word line WL3 with the non-selected unit cell C13, and the remaining non-selected unit cells C24, C34 and C44 sharing the fourth word line WL4 with the non-selected unit cell C14.

Referring again to FIG. 7, the non-selected unit cells C21, C31 and C41 sharing the first word line WL1 with the selected unit cell C11 may not be programmed because no inversion channels are formed in the transistors constituting the non-selected unit cells C22, C23, C24, C32, C33, C34, C42, C43 and C44.

Figure 9:
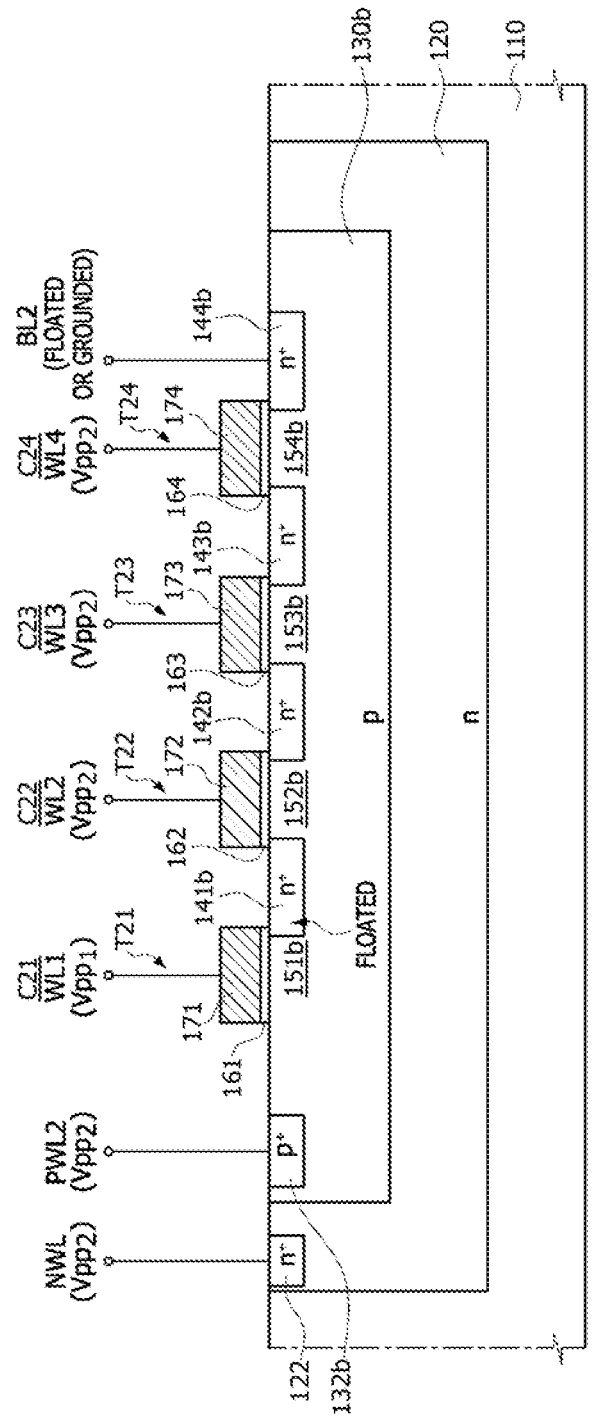

FIG. 9 illustrates the program inhibition mechanism of the non-selected unit cells the above bias condition. In particular, FIG. 9 illustrates a cross-sectional view taken along the second row under the above bias condition.

In order to program the non-selected unit cell C21, a voltage difference between the first program voltage Vpp1 applied to the first anti-fuse gate 171 and a voltage induced at the second source/drain region 141b has to be large enough to rupture the first anti-fuse insulation layer 161. However, since the second program voltage Vpp2 may be applied to the second, third and fourth anti-fuse gates 172, 173 and 174 and the second well region 130b, there may be no voltage difference between the second well region 130b and the anti-fuse gates 172, 173 and 174. Accordingly, no inversion channel is formed in each of the second channel regions 152b, 153b and 154b of the transistors T22, T23 and T24 arrayed in the second row. Thus, even though a ground voltage is applied to the second bit line BL2, the ground voltage may not be transmitted to the second source/drain region 141b. As a result, the second source/drain region 141b may be floated. Even if the second bit line BL2 is floated, the second source/drain region 141b may still be floated regardless of voltage levels applied to the second, third and fourth anti-fuse gates 172, 173 and 174.

In addition, as described above, a voltage difference between the first program voltage Vpp1 applied to the first anti-fuse gate 171 and the second program voltage Vpp2 applied to the second well region 130b may have an insufficient voltage level to rupture the anti-fuse insulation layers 161, 162, 163 and 164. Accordingly, under the above bias condition, no resistive path is formed in the first anti-fuse insulation layer 161 of the non-selected unit cells C21, C31 and C41. As a result, the non-selected unit cells C21, C31 and C41 may not be programmed.

Figure 10:
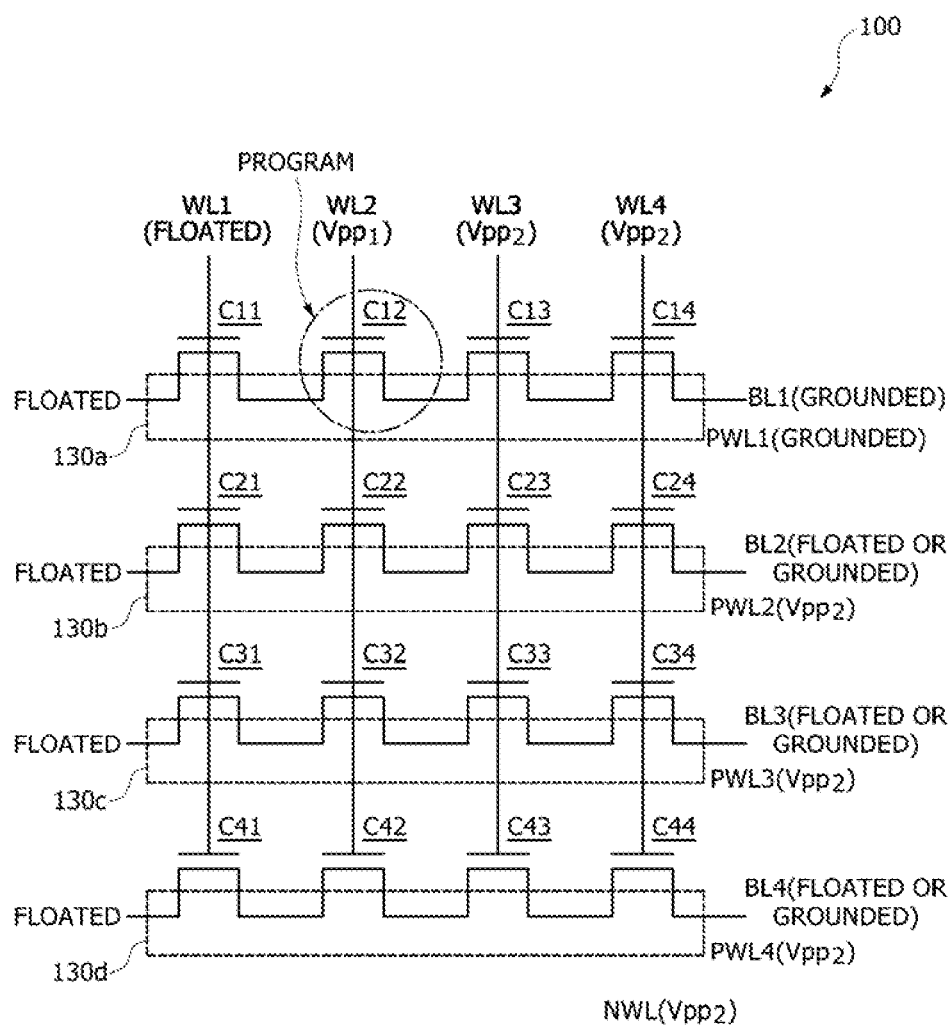

Referring to FIG. 10, after the unit cell C11 among the unit cells C11, C12, C13 and C14 arrayed in the first row is programmed, a program operation for selectively programming the unit cell C12 located in the second column may be performed. Specifically, in a state where the first word line WL1 connected to the programmed unit cell C11 is floated, the first program voltage Vpp1 may be applied to the second word line WL2 connected to the selected unit cell C12, and the second program voltage Vpp2 may be applied to the third and fourth word lines WL3 and WL4 connected to the non-selected unit cells C13 and C14 among the non-programmed unit cells. In addition, a ground voltage may be applied to the first bit line BL1 and the first well bias line PWL1 which are connected to the selected unit cell C12, and the remaining bit lines BL2, BL3 and BL4 may be floated or grounded. Furthermore, the second program voltage Vpp2 may also be applied to the remaining well bias lines, for example, the second, third and fourth well bias lines PWL2, PWL3 and PWL4. The second program voltage Vpp2 may also be applied to the deep well bias line NWL.

Figure 11:
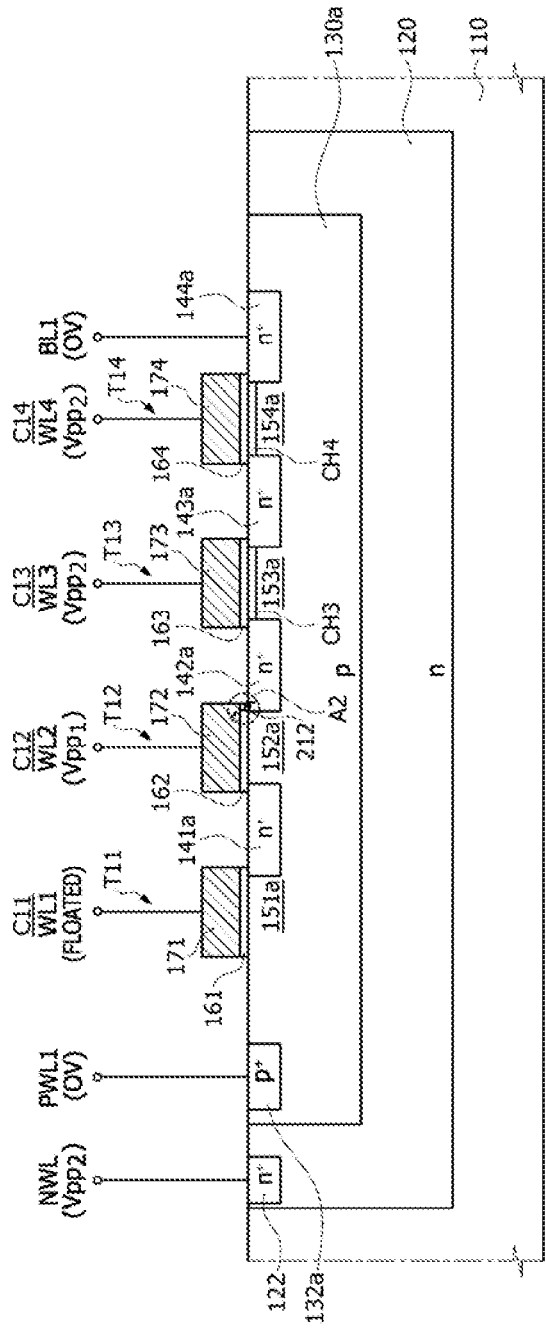

FIG. 11 illustrates a program mechanism of the selected unit cell C12 under the above bias condition.

As illustrated in FIG. 11, since the first word line WL1 connected to the programmed unit cell C11 is floated, the program operation for programming the selected unit cell C12 may not influence the unit cell C11 regardless of whether the unit cell C11 has a programmed state. Because the second program voltage Vpp2 greater than the threshold voltage of the non-selected unit cells C13 and C14 is applied to the third and fourth word lines WL3 and WL4 connected to the non-selected unit cells C13 and C14, the transistors T13 and T14 constituting the non-selected unit cells C13 and C14 may be turned on. As a result, inversion channels CH3 and CH4 may be formed in the first channel regions 153a and 154a of the transistors T13 and T14, respectively. The inversion channel CH2 may also be formed in the first channel region 152a of the transistor T12 constituting the selected unit cell C12.

The ground voltage applied to the first bit line BL1 may be transmitted to the first source/drain region 141a through the first drain region 144a, the inversion channel CH4, the first source/drain region 143a, the inversion channel CH3, and the first source/drain region 142a. Thus, a voltage difference, i.e., the first program voltage Vpp1, between the first program voltage Vpp1 and the ground voltage may be applied between the second anti-fuse gate 172 and the first source/drain region 142a. Accordingly, the first anti-fuse insulation layer 162 between the second anti-fuse gate 172 and the first source/drain region 142a may be ruptured by the first program voltage Vpp1 to form a resistive path 212 through which current flows, as indicated by a portion 'A2' of FIG. 11. As a result, the selected unit cell C12 may be programmed.

In the non-selected unit cell C13 sharing the first well bias line PWL1 with the selected unit cell C12, the second program voltage Vpp2 may be applied between the third anti-fuse gate 173 and the first source/drain region 143a. Since the second program voltage Vpp2 has an insufficient voltage level to rupture the third anti-fuse insulation layer 163, no resistive path is formed in the third anti-fuse insulation layer 163 between the third anti-fuse gate 173 and the first source/drain region 143a. This program inhibition mechanism of the non-selected unit cell C13 may be equally applied to the remaining non-selected unit cell C14 that shares the first well bias line PWL1 with the selected unit cell C12. Furthermore, the program inhibition mechanism of the non-selected unit cell C13 may also be applied to the remaining non-selected unit cells C23, C33 and C43 sharing the third word line WL3 with the non-selected unit cell C13, and the remaining non-selected unit cells C24, C34 and C44 sharing the fourth word line WL4 with the non-selected unit cell C14.

Referring again to FIG. 10, the non-selected unit cells C21, C31 and C41 sharing the first word line WL1 with the programmed unit cell C11 may not be influenced by the program operation of the selected unit cell C12 because the first word line WL1 floats. In addition, the non-selected unit cells C22, C32 and C42 sharing the second word line WL2 with the selected unit cell C12 may not be programmed because no inversion channel is formed in each of the transistors constituting the non-selected unit cells C23, C24, C33, C34, C43 and C44.

Figure 12:
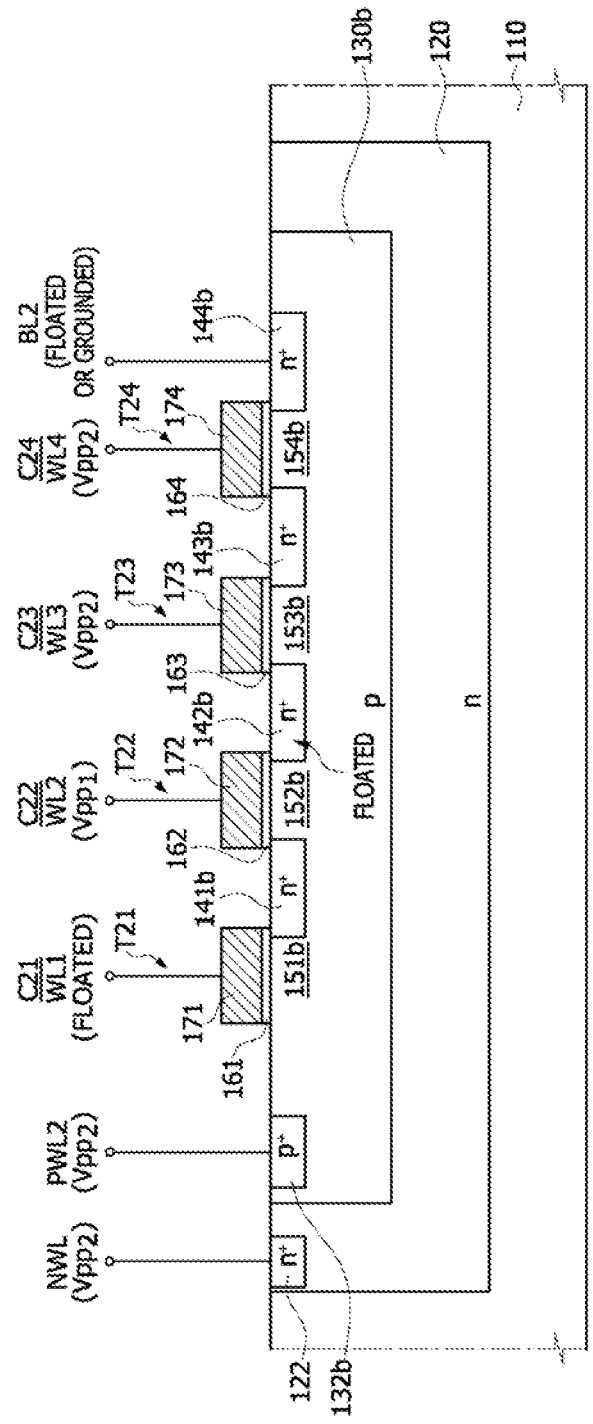

FIG. 12 illustrates the program inhibition mechanism of the non-selected unit cells with the above bias condition. In particular, FIG. 12 illustrates a cross-sectional view taken along the second row under the above bias condition.

In order to program the non-selected unit cell C22, a voltage difference between the first program voltage Vpp1 applied to the second anti-fuse gate 172 and a voltage induced at the second source/drain region 142b has to be large enough to rupture the second anti-fuse insulation layer 162. However, since the second program voltage Vpp2 may be applied to the third and fourth anti-fuse gates 173 and 174 and the second well region 130b, a voltage difference between the second well region 130b and the anti-fuse gates 173 and 174 may be zero volts. Accordingly, no inversion channel is formed in each of the second channel regions 153b and 154b of the transistors T23 and T24 arrayed in the second row. Thus, even though a ground voltage is applied to the second bit line BL2, the ground voltage may not be transmitted to the second source/drain region 142b. As a result, since the second source/drain region 142b floats, the second anti-fuse insulation layer 162 of the non-selected unit cell C22 may not be ruptured. Therefore, no resistive path is formed in the second anti-fuse insulation layer 162 of the non-selected unit cell C22. When the second bit line BL2 floats, the second source/drain region 142b may still float regardless of voltage levels applied to the third and fourth anti-fuse gates 173 and 174.

Meanwhile, as described above, a voltage difference between the first program voltage Vpp1 applied to the second anti-fuse gate 172 and the second program voltage Vpp2 applied to the second well region 130b may have an insufficient voltage level to rupture the anti-fuse insulation layers 161, 162, 163 and 164. Accordingly, under the above bias condition, no resistive path is formed in the second anti-fuse insulation layer 162 of the non-selected unit cells C22, C32 and C42. As a result, the non-selected unit cells C22, C32 and C42 may not be programmed.

Figure 13:
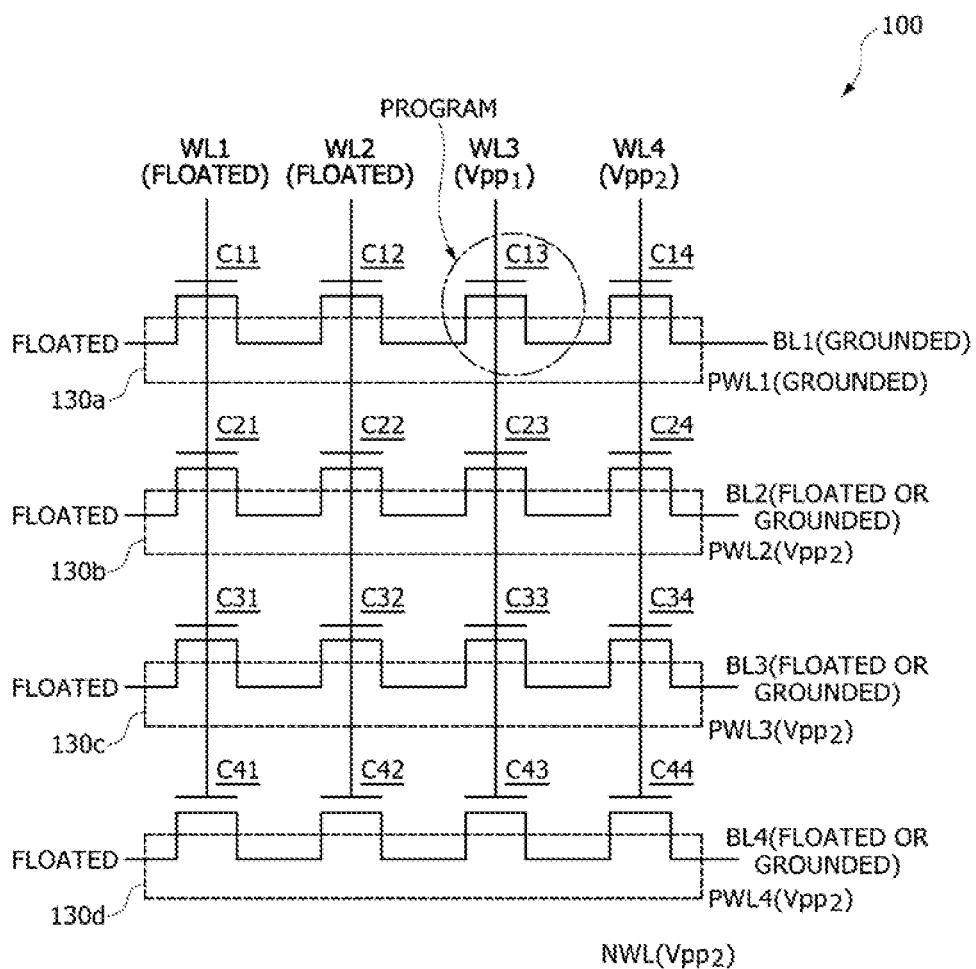

Referring to FIG. 13, after the unit cells C11 and C12 among the unit cells C11, C12, C13 and C14 arrayed in the first row are programmed, a program operation for selectively programming the unit cell C13 located in the third column may be performed. Specifically, in a state where the first and second word lines WL1 and WL2 connected to the programmed unit cells C11 and C12 are floated, the first program voltage Vpp1 may be applied to the third word line WL3 connected to the selected unit cell C13, and the second program voltage Vpp2 may be applied to the fourth word lines WL4 connected to the non-selected unit cell C14 among the non-programmed unit cells. In addition, a ground voltage may be applied to the first bit line BL1 and the first well bias line PWL1 which are connected to the selected unit cell C13, and the remaining bit lines BL2, BL3 and BL4 may be floated or grounded. Furthermore, the second program voltage Vpp2 may also be applied to the remaining well bias lines, for example, the second, third and fourth well bias lines PWL2, PWL3 and PWL4. The second program voltage Vpp2 may also be applied to the deep well bias line NWL.

Figure 14:
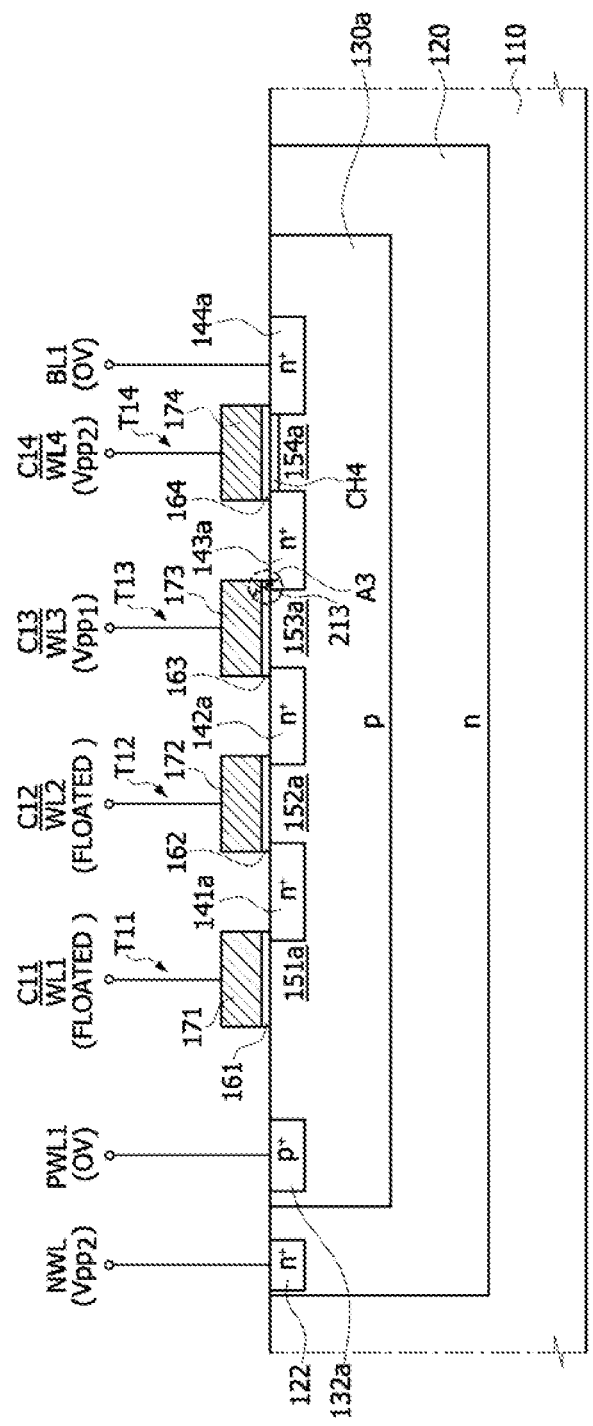

FIG. 14 illustrates a program mechanism of the selected unit cell C13 under the above bias condition.

As illustrated in FIG. 14, since the first and second word lines WL1 and WL2 connected to the programmed unit cells C11 and C12 are floated, the program operation for programming the selected unit cell C13 may not influence the unit cells C11 and C12 regardless of whether the unit cells C11 and C12 have a programmed state. Because the second program voltage Vpp2 greater than the threshold voltage of the non-selected unit cell C14 is applied to the fourth word line WL4 and a ground voltage is applied to the first well bias line PWL1, the transistor T14 constituting the non-selected unit cell C14 may be turned on. Accordingly, an inversion channel CH4 may be formed in the first channel region 154a of the transistor T14. An inversion channel (not shown) may also be formed in the first channel region 153a of the transistor T13 constituting the selected unit cell C13 under the above bias condition. However, the inversion channel formed in the first channel region 153a of the transistor T13 may not influence the program operation of the selected unit cell C13.

The ground voltage applied to the first bit line BL1 may be transmitted to the first source/drain region 143a through the first drain region 144a and the inversion channel CH4. Thus, a voltage difference, i.e., the first program voltage Vpp1, between the first program voltage Vpp1 and the ground voltage may be applied between the third anti-fuse gate 173 and the first source/drain region 143a. Accordingly, the third anti-fuse insulation layer 163 between the third anti-fuse gate 173 and the first source/drain region 143a may be ruptured by the first program voltage Vpp1 to form a resistive path 213 through which current flows, as indicated by a portion 'A3' of FIG. 14. As a result, the selected unit cell C13 may be programmed.

In the non-selected unit cell C14 sharing the first well bias line PWL1 with the selected unit cell C13, the second program voltage Vpp2 may be applied between the fourth anti-fuse gate 174 and the first drain region 144a. Since the second program voltage Vpp2 has an insufficient voltage level to rupture the fourth anti-fuse insulation layer 164, no resistive path is formed in the fourth anti-fuse insulation layer 164 between the fourth anti-fuse gate 174 and the first drain region 144a. This program inhibition mechanism of the non-selected unit cell C14 may be equally applied to the remaining non-selected unit cells C24, C34 and C44 that share the fourth word line WL4 with the non-selected unit cell C14.

Referring again to FIG. 13, the non-selected unit cells C21, C31 and C41 sharing the first word line WL1 with the programmed unit cell C11 and the non-selected unit cells C22, C32 and C42 sharing the second word line WL2 with the programmed unit cell C12 may not be influenced by the program operation of the selected unit cell C13 because the first and second word lines WL1 and WL2 are floated. In addition, the non-selected unit cells C23, C33 and C43 sharing the third word line WL3 with the selected unit cell C13 may not be programmed because no inversion channel is formed in each of the transistors constituting the non-selected unit cells C24, C34 and C44.

Figure 15:
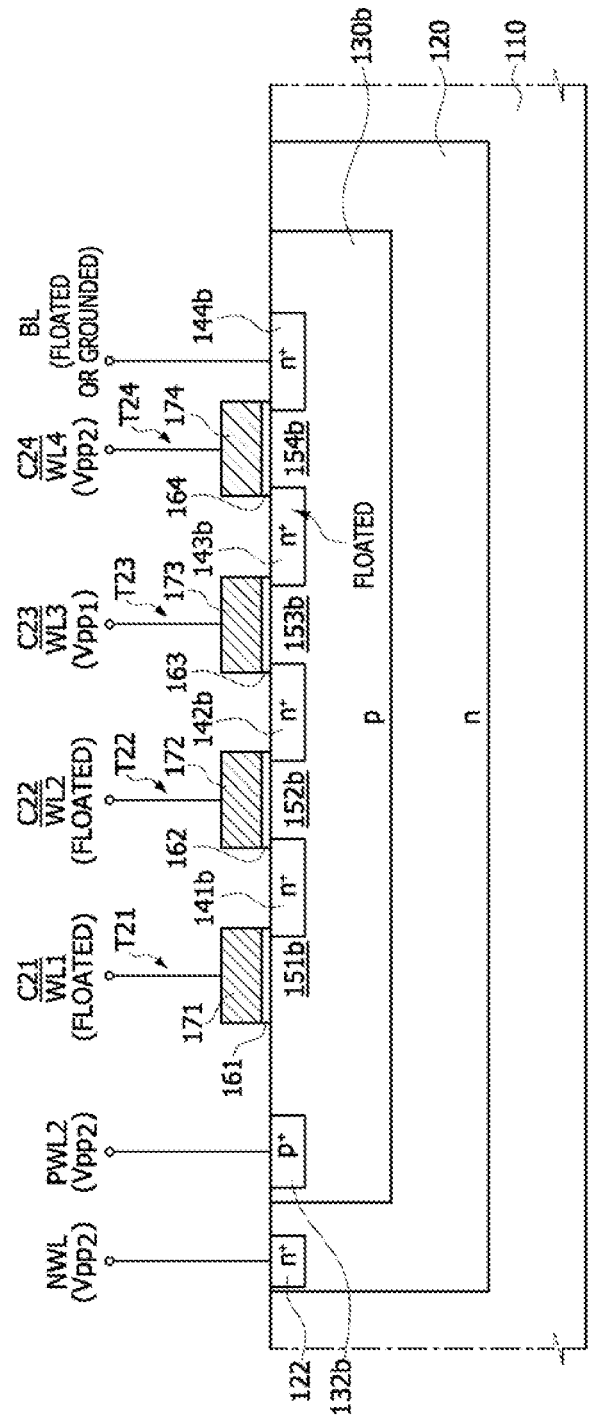

FIG. 15 illustrates the program inhibition mechanism of the non-selected unit cells with the above bias condition. In particular, FIG. 15 illustrates a cross-sectional view taken along the second row under the above bias condition.

In order to program the non-selected unit cell C23, a voltage difference between the first program voltage Vpp1 applied to the third anti-fuse gate 173 and a voltage induced at the second source/drain region 143b has to be large enough to rupture the third anti-fuse insulation layer 163. However, since the second program voltage Vpp2 may be applied to the fourth anti-fuse gate 174 and the second well region 130b, a voltage difference between the second well region 130b and the anti-fuse gate 174 may be actually zero volt. Accordingly, no inversion channel is formed in each of the second channel region 154b of the transistor T24 arrayed in the second row. Thus, even though a ground voltage is applied to the second bit line BL2, the ground voltage may not be transmitted to the second source/drain region 143b. As a result, since the second source/drain region 143b is floated, the third anti-fuse insulation layer 163 of the non-selected unit cell C23 may not be ruptured. Therefore, no resistive path is formed in the third anti-fuse insulation layer 163 of the non-selected unit cell C23. In case where the second bit line BL2 is floated, the second source/drain region 143b may still be floated regardless of a voltage level applied to the fourth anti-fuse gate 174.

Meanwhile, as described above, a voltage difference between the first program voltage Vpp1 applied to the third anti-fuse gate 173 and the second program voltage Vpp2 applied to the second well region 130b may have an insufficient voltage level to rupture the anti-fuse insulation layers 161, 162, 163 and 164. Accordingly, under the above bias condition, no resistive path is formed in the third anti-fuse insulation layer 163 of the non-selected unit cells C23, C33 and C43. As a result, the non-selected unit cells C23, C33 and C43 may not be programmed.

Figure 16:
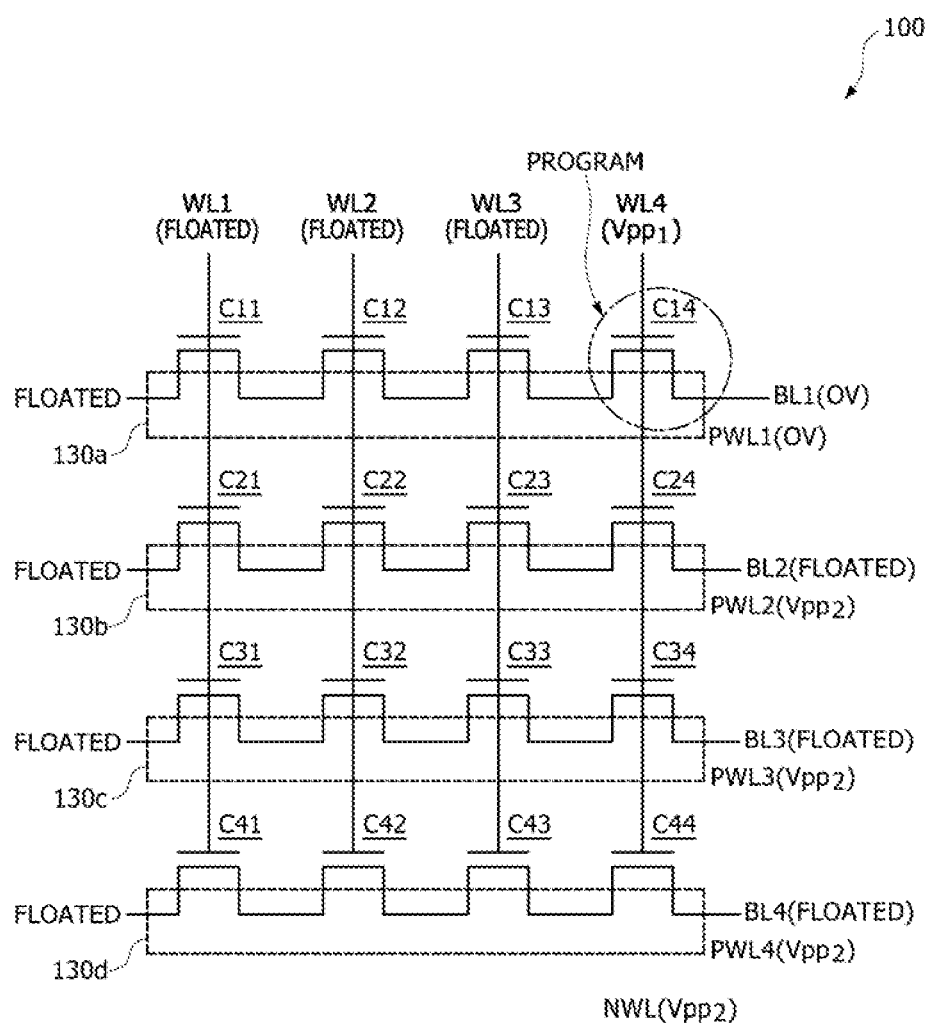

Referring to FIG. 16, after the unit cells C11, C12 and C13 among the unit cells C11, C12, C13 and C14 arrayed in the first row are programmed, a program operation for selectively programming the unit cell C14 located in the final column, i.e., the fourth column, may be performed. Specifically, in a state where the first, second and third word lines WL1, WL2 and WL3 connected to the programmed unit cells C11, C12 and C13 may be floated, the first program voltage Vpp1 may be applied to the fourth word line WL4 connected to the selected unit cell C14. In addition, a ground voltage may be applied to the first bit line BL1 and the first well bias line PWL1 which are connected to the selected unit cell C14. In the previous program operations for programming the unit cells C11, C12 and C13, the remaining bit lines, for example, the second, third and fourth bit lines BL2, BL3 and BL4 are floated or grounded. However, in order to selectively program the unit cell arrayed in the final column, i.e., the unit cell C14 arrayed in the fourth column, the non-selected bit lines, for example, the second, third and fourth bit lines BL2, BL3 and BL4 are not grounded but floated. Furthermore, the second program voltage Vpp2 may be applied to the remaining well bias lines, for example, the second, third and fourth well bias lines PWL2, PWL3 and PWL4. The second program voltage Vpp2 may also be applied to the deep well bias line NWL.

Figure 17:
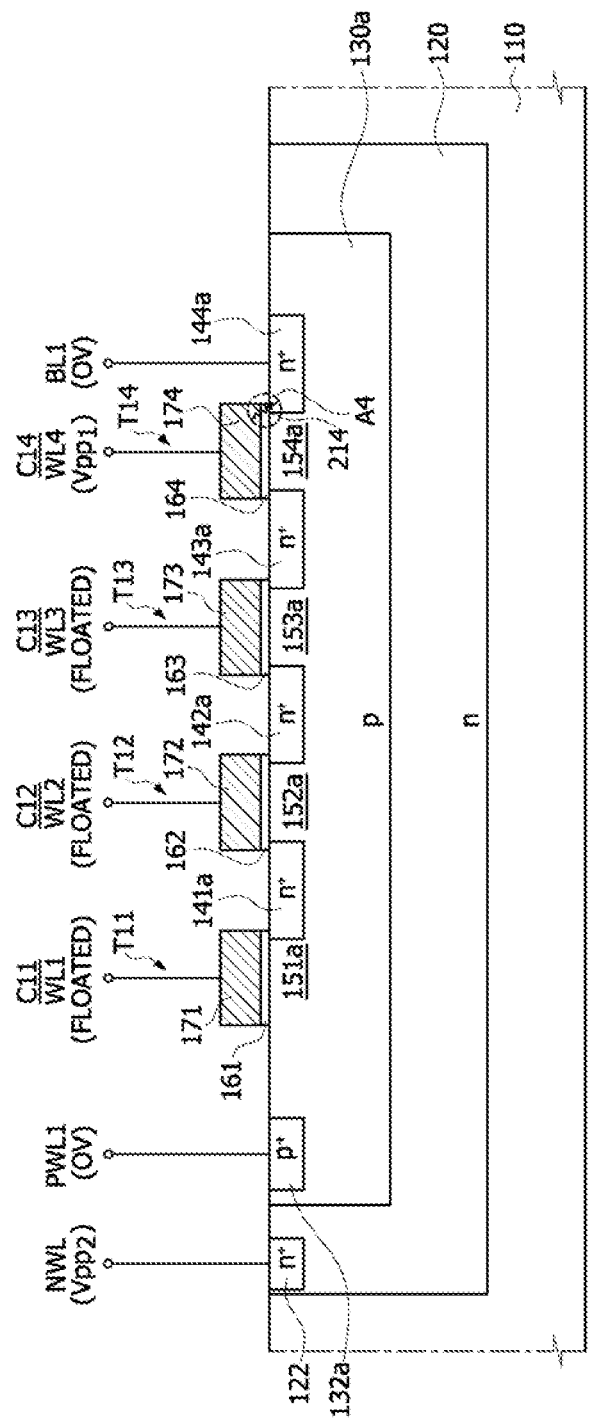

FIG. 17 illustrates a program mechanism of the selected unit cell C14 under the above bias condition.

As illustrated in FIG. 17, since the first, second and third word lines WL1, WL2 and WL3 connected to the programmed unit cells C11, C12 and C13 are floated, the program operation for programming the selected unit cell C14 may not influence the unit cells C11, C12 and C13 regardless of whether the unit cells C11, C12 and C13 have a programmed state. The ground voltage applied to the first bit line BL1 may be directly transmitted to the first drain region 144a. Thus, a voltage difference, i.e., the first program voltage Vpp1, between the first program voltage Vpp1 and the ground voltage may be applied between the fourth anti-fuse gate 174 and the first drain region 144a. Accordingly, the fourth anti-fuse insulation layer 164 between the fourth anti-fuse gate 174 and the first drain region 144a may be ruptured by the first program voltage Vpp1 to form a resistive path 214 through which current flows, as indicated by a portion 'A4' of FIG. 17. As a result, the selected unit cell C14 may be programmed.

Referring again to FIG. 16, the non-selected unit cells C21, C31 and C41 sharing the first word line WL1 with the programmed unit cell C11, the non-selected unit cells C22, C32 and C42 sharing the second word line WL2 with the programmed unit cell C12, and the non-selected unit cells C23, C33 and C43 sharing the third word line WL3 with the programmed unit cell C13 may not be influenced by the program operation of the selected unit cell C14. This may be because the first, second and third word lines WL1, WL2 and WL3 are floated. In addition, the non-selected unit cells C24, C34 and C44 sharing the fourth word line WL4 with the selected unit cell C14 may not be programmed because the bit lines BL2, BL3 and BL4 are floated.

Figure 18:
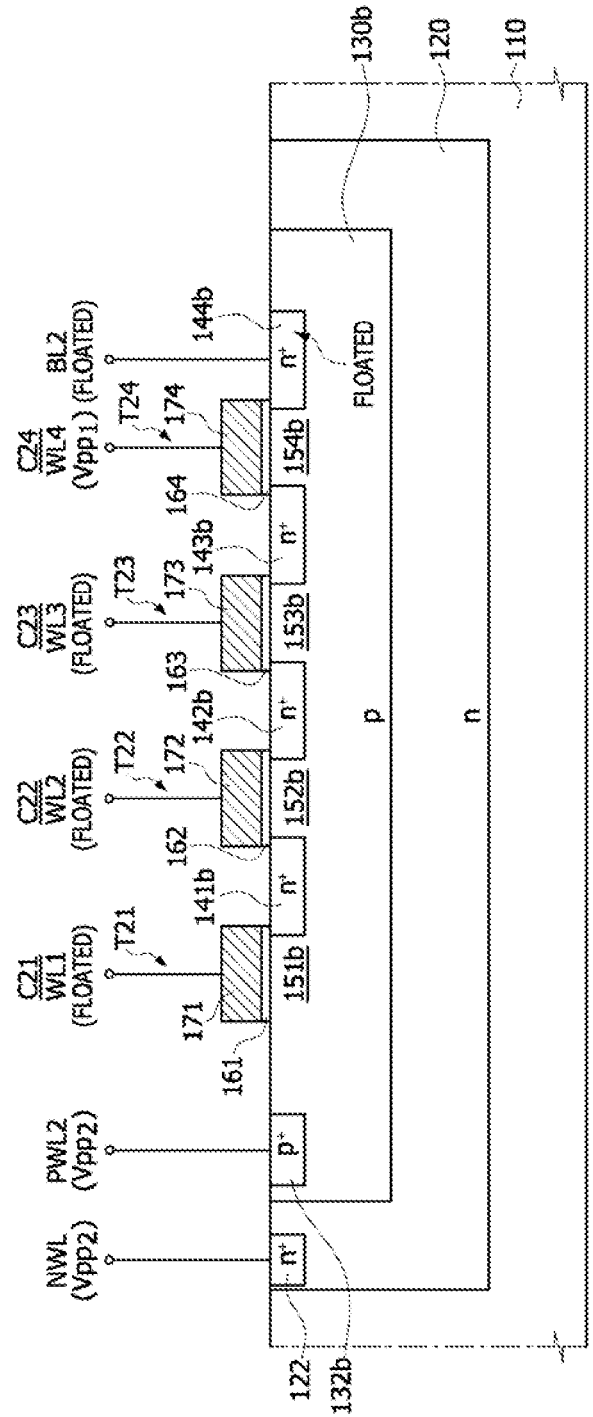

FIG. 18 illustrates the program inhibition mechanism of the non-selected unit cells under the above bias condition. In particular, FIG. 18 illustrates a cross-sectional view taken along the second row under the above bias condition.

In order to program the non-selected unit cell C24, a voltage difference between the first program voltage Vpp1 applied to the fourth anti-fuse gate 174 and a voltage induced at the second drain region 144b has to be large enough to rupture the fourth anti-fuse insulation layer 164. However, even though the first program voltage Vpp1 is applied to the fourth anti-fuse gate 174, the second drain region 144b may be floated to prevent the fourth anti-fuse insulation layer 164 of the non-selected unit cell C24 from being ruptured. As a result, no resistive path is formed in the fourth anti-fuse insulation layer 164 of the non-selected unit cell C24. This program inhibition mechanism of the non-selected unit cell C24 may be equally applied to the non-selected unit cells C34 and C44 that share the fourth word line WL4 with the selected unit cell C14.

Figure 19:
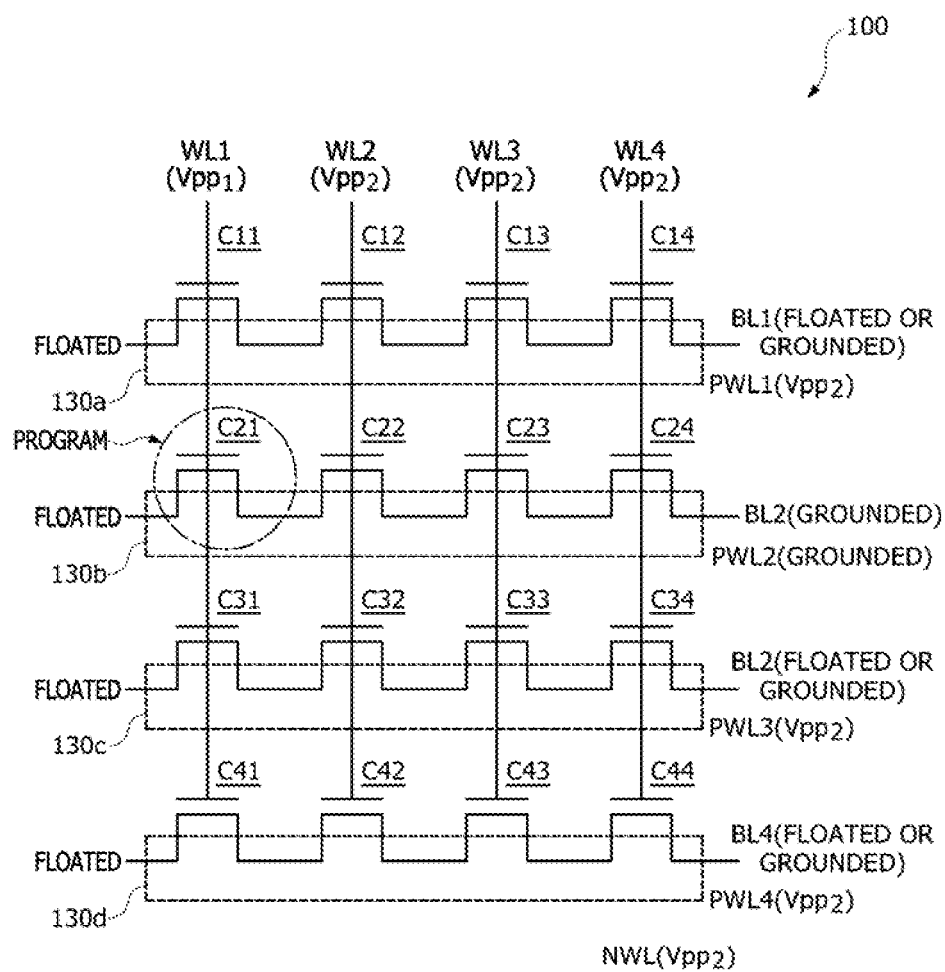

Referring to FIG. 19, after all of the unit cells C11, C12, C13 and C14 arrayed in the first row are programmed, the unit cells C21, C22, C23 and C24 arrayed in the second row may be programmed. Specifically, a program operation for selectively programming the unit cell C21 among the unit cells C21, C22, C23 and C24 arrayed in the second row may be primarily performed, and program operations for programming the unit cells C22 in the second column and the unit cell C23 in the third column may be sequentially performed. Finally, a program operation for selectively programming the unit cell C24 in the final column, i.e., the fourth column, may be performed. These program operations may be substantially the same as the program operations for programming the unit cells C11, C12, C13 and C14, which are described with reference to FIGS. 7 to 18.

In some embodiments, before the program operations for programming the unit cells C21, C22, C23 and C24 arrayed in the second row are performed, at least one of the unit cells C11, C12, C13 and C14 may have a non-programmed state or all of the unit cells C11, C12, C13 and C14 may have a programmed state. When any one of the unit cells C11, C12, C13 and C14 has a non-programmed state, at least one of the anti-fuse gate and the drain region of the non-programmed unit cell among the unit cells C11, C12, C13 and C14 may be floated or a voltage applied to the anti-fuse insulation layer of the non-programmed unit cell in the first row may be set to a voltage level which is insufficient to rupture the anti-fuse insulation layer while the unit cells C21, C22, C23 and C24 arrayed in the second row are programmed. Thus, the non-programmed unit cell in the first row may not be programmed while the unit cells C21, C22, C23 and C24 in the second row are programmed. That is, even though at least one of the unit cells C11, C12, C13 and C14 arrayed in the first row has a non-programmed state, the non-programmed unit cell in the first row may not be influenced by the program operations for programming the unit cells C21, C22, C23 and C24 arrayed in the second row.

Figure 20:
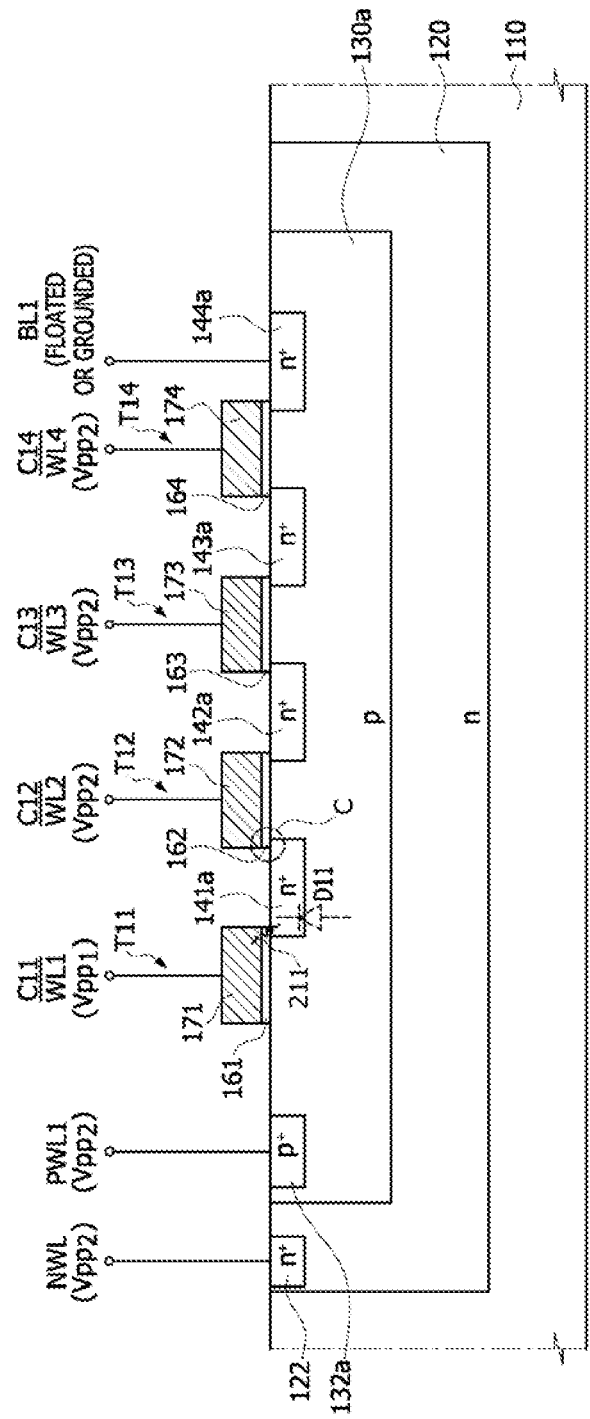

FIG. 20 illustrates a bias condition applied to the unit cell C11 having the resistive path 211 during the program operation for selectively programming the unit cell C21 located at a cross point of the second row and the first column.

As illustrated in FIG. 20, the first program voltage Vpp1 may be applied to the first word line WL1 which is shared by the unit cell C11 and the selected unit cell C21, and the second program voltage Vpp2 may be applied to the second, third and fourth word lines WL2, WL3 and WL4. The first bit line BL1 may be floated or grounded, and the second program voltage Vpp2 may also be applied to the deep well bias line NWL.

The unit cell C11 may have a programmed state with the resistive path 211. Thus, the first anti-fuse gate 171 may be electrically connected to the first source/drain region 141a through the resistive path 211. In this case, when the first program voltage Vpp1 is applied to the first word line WL1 which is shared by the unit cell C11 and the selected unit cell C21, a voltage obtained by subtracting a voltage drop of the resistive path 211 from the first program voltage Vpp1 may be applied to the first source/drain region 141a. Since a resistance value of the resistive path 211 may be small enough to be negligible, it may be assumed that the first program voltage Vpp1 is applied to the first source/drain region 141a. Since the second program voltage Vpp2 is applied to the first well bias line PWL1, the second program voltage Vpp2 may also be applied to the first well region 130a. Thus, the first parasitic diode D11 composed of the first well region 130a doped with P-type impurities and the first source/drain region 141a doped with N-type impurities may be reverse-biased. Accordingly, because no current flows through the first parasitic diode D11, the first parasitic diode D11 may provide an open circuit between the first well region 130a and the first source/drain region 141a. As a result, the programmed unit cell C11 may not be influenced by fluctuation in the electric potential of the first well region 130a.

The second program voltage Vpp2 may be applied to all of the second to fourth word lines WL2, WL3 and WL4 and the first well bias line PWL1. Thus, no inversion channel may be formed in each of the transistors T12, 113 and T14 constituting the unit cells C12, C13 and C14 arrayed in the first row. Accordingly, the first source/drain regions 142a and 143a may be electrically floated regardless of a voltage level of the first bit line BL1. As a result, the programmed unit cell C11 may not be influenced by a voltage applied to the first bit line BL1.

The first program voltage Vpp1 may be applied to the first word line WL1 which is shared by the unit cell C11 and the selected unit cell C21, and the second program voltage Vpp2 may be applied to the second word line WL2 adjacent to the first word line WL1. Thus, a voltage difference between the first and second program voltages Vpp1 and Vpp2 may be applied between the second anti-fuse gate 172 and the first source/drain region 141a. However, the voltage difference between the first and second program voltages Vpp1 and Vpp2 may be insufficient to rupture the second anti-fuse insulation layer 162 in a portion 'C' of FIG. 20. Thus, since no resistive path is formed in the second anti-fuse insulation layer 162 in the portion 'C', the first source/drain region 141a may still be floated.

FIGS. 21 to 24 are schematic views illustrating other program operations of the anti-fuse type OTP memory cell array 100 shown in FIG. 6.

According to the present embodiment, the program operations may be performed in units of columns. That is, a program operation for selectively programming at least one target unit cell among the unit cells C11, C21, C31 and C41 arrayed in the first column may be performed, and a program operation for selectively programming at least one target unit cell among the unit cells C12, C22, C32 and C42 arrayed in the second column may then be performed. Subsequently, a program operation for selectively programming at least one target unit cell among the unit cells C13, C23, C33 and C43 arrayed in the third column may be performed, and a program operation for selectively programming at least one target unit cell among the unit cells C14, C24, C34 and C44 arrayed in the final column, i.e., the fourth column, may be finally performed. Accordingly, at least one target unit cell among the plurality of unit cells arrayed in each column may be programmed at once to reduce the number of the program operations. That is, according to the present embodiment, the anti-fuse type OTP memory cell array 100 may be programmed by repeatedly executing the program operations the same number of times as the number of the columns of the anti-fuse type OTP memory cell array 100.

Figure 21:
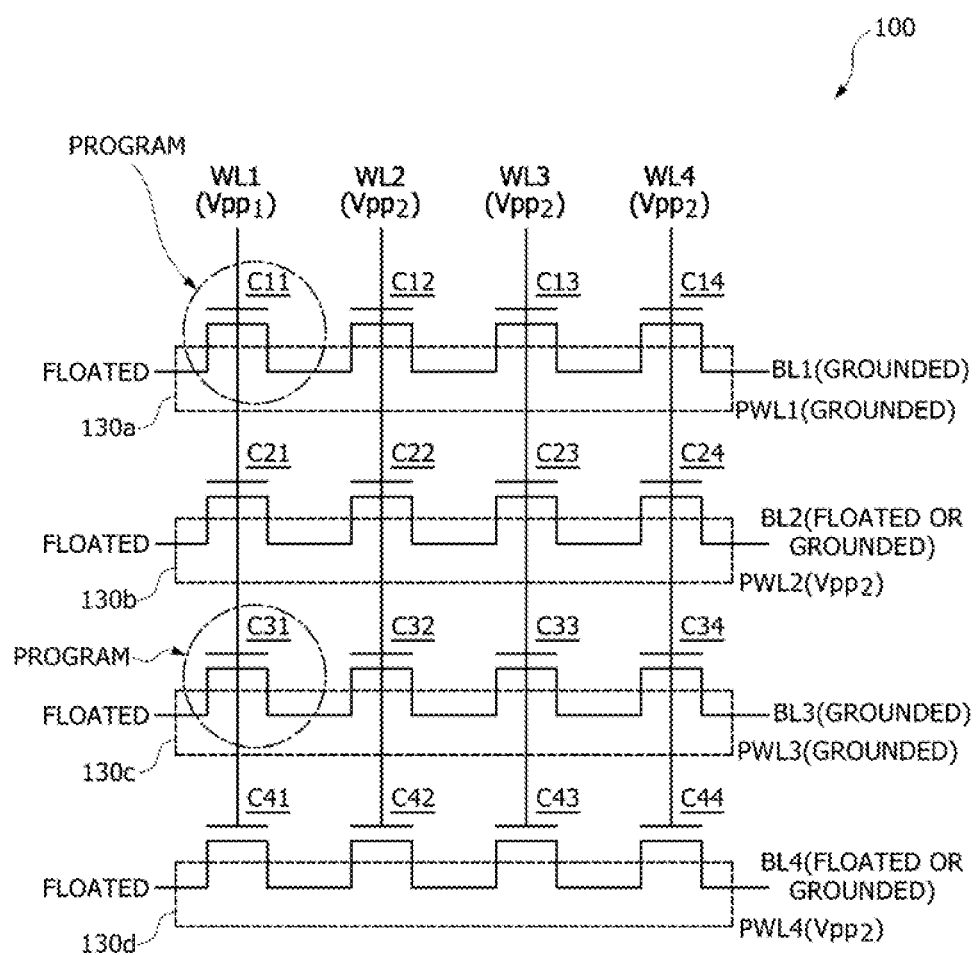
FIGS. 21 to 24 are schematic views illustrating other program operations of the anti-fuse type OTP memory cell array shown in FIG. 6.

Referring to FIG. 21, an example in which the unit cell C11 and the unit cell C31 among the unit cells C11, C21, C31 and C41 arrayed in the first column are simultaneously programmed will be primarily described. Specifically, the first program voltage Vpp1 may be applied to the first word line WL1 which is connected in common to both of the selected unit cells C11 and C31, and the second program voltage Vpp2 may be applied to the remaining word lines WL2, WL3 and WL4. The first and second program voltages Vpp1 and Vpp2 may have the same voltage levels as described with reference to FIGS. 7 to 20. In addition, a ground voltage may be applied to the first bit line BL1 and the third bit line BL3 which are connected to the selected unit cells C11 and C31, respectively. The second bit line BL2 and the fourth bit line BL4, which are respectively connected to the non-selected unit cells C21 and C41, may be floated or grounded. Moreover, a ground voltage may be applied to the first well bias line PWL1 and the third well bias line PWL3 which are respectively connected to the selected unit cells C11 and C31, and the second program voltage Vpp2 may be applied to the second well bias line PWL2 and the fourth well bias line PWL4 which are respectively connected to the non-selected unit cells C21 and C41. Although not shown in FIG. 21, the second program voltage Vpp2 may also be applied to the deep well bias line NWL.

Under the above bias condition, the selected unit cells C11 and C31 may be simultaneously programmed. That is, a resistive path may be formed in the first anti-fuse insulation layer 161 of each of the selected unit cells C11 and C31. The selected unit cells C11 and C31 may be programmed by the same mechanism as described with reference to FIG. 8. The unit cells C21 and C41 among the unit cells C11, C21, C31 and C41 arrayed in the first column may not be programmed by the same program inhibition mechanism as described with reference to FIG. 9. That is, since no inversion channel may be formed in each of the transistors constituting the non-selected unit cells C22, C23 and C24 sharing the second well bias line PWL2 with the unit cell C21, the ground voltage applied to the second bit line BL2 may not be transmitted to the source/drain region of the unit cell C21. As a result, no resistive path may be formed in the first anti-fuse insulation layer of the unit cell C21. Similarly, since no inversion channel may be formed in each of the transistors constituting the non-selected unit cells C42, C43 and C44 sharing the fourth well bias line PWL4 with the unit cell C41, the ground voltage applied to the fourth bit line BL4 may not be transmitted to the source/drain region of the unit cell C41. As a result, no resistive path may be formed in the first anti-fuse insulation layer of the unit cell C41.

The non-selected unit cells C12, C13 and C14 sharing the first well bias line PWL1 with the selected unit cell C11 may not be programmed because an electric field formed across the anti-fuse insulation layers of the non-selected unit cells C12, C13 and C14 is insufficient to form a resistive path in each of the anti-fuse insulation layers. This program inhibition mechanism may also be equally applied to the non-selected unit cells C32, C33 and C34 sharing the third well bias line PWL3 with the selected unit cell C31.

Figure 22:
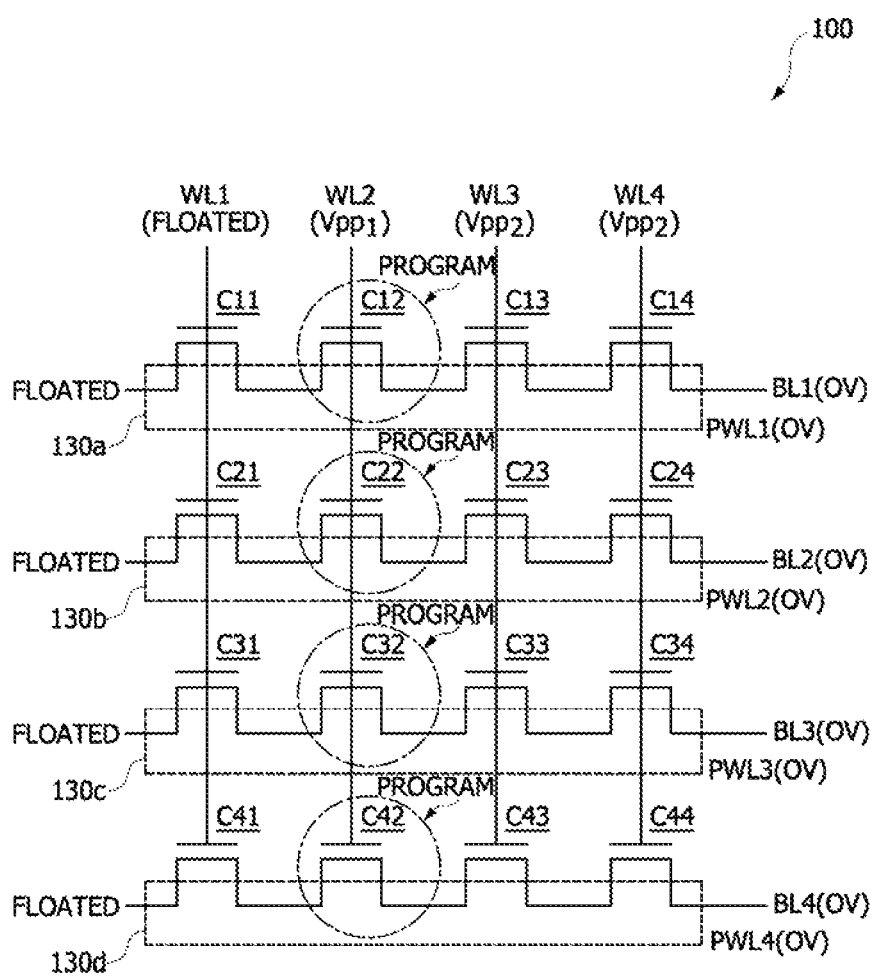

Referring to FIG. 22, after the program operation of the unit cells arrayed in the first column is performed, a program operation of the unit cells arrayed in the second column may be performed. As illustrated in FIG. 22, in order to selectively program all of the unit cells C12, C22, C32 and C42 arrayed in the second column, in a state where the first word line WL1 disposed in the first column including the programmed unit cells is floated, the first program voltage Vpp1 may be applied to the second word line WL2 disposed in the second column to be programmed, and the second program voltage Vpp2 may be applied to the remaining word lines WL3 and WL4. In addition, a ground voltage may be applied to the first to fourth bit lines BL1, BL2, BL3 and BL4 which are respectively connected to the selected unit cells C12, C22, C32 and C42. Moreover, a ground voltage may also be applied to the first to fourth well bias lines PWL1, PWL2, PWL3 and PWL4 which are respectively connected to the selected unit cells C12, C22, C32 and C42. Although not shown in FIG. 22, the second program voltage Vpp2 may also be applied to the deep well bias line NWL.

Under the above bias condition, the selected unit cells C12, C22, C32 and C42 may be simultaneously programmed. That is, a resistive path may be formed in the second anti-fuse insulation layer 162 of each of the selected unit cells C12, C22, C32 and C42. The selected unit cells C12, C22, C32 and C42 may be programmed by the same mechanism as described with reference to FIG. 11. The non-selected unit cells C11, C21, C31 and C41 arrayed in the first column may not be influenced by programming the selected unit cells C12, C22, C32 and C42 because the first word line WL1 is floated. The unit cells C13, C14, C23, C24, C33, C34, C43 and C44 arrayed in the third and fourth columns may not be programmed because the second program voltage Vpp2 applied to the third and fourth word lines WL3 and WL4 has a voltage level which is insufficient to rupture the third and fourth anti-fuse insulation layers disposed in the third and fourth columns, as described with reference to FIG. 11.

Figure 23:
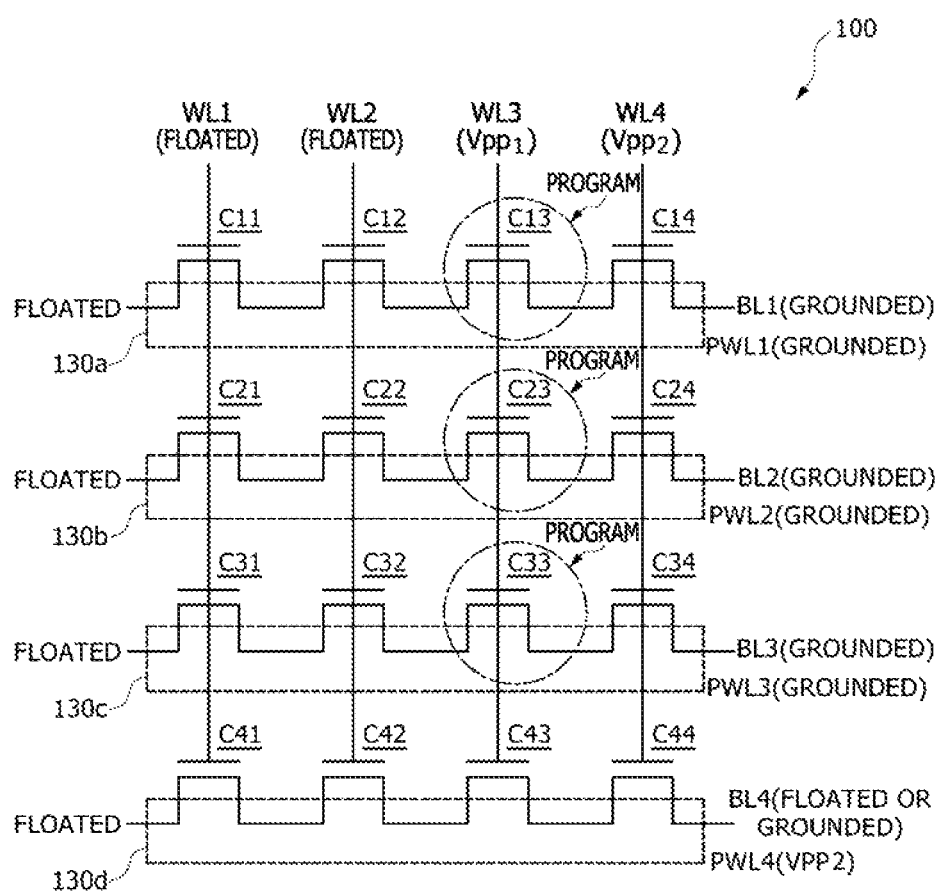

Referring to FIG. 23, after the program operations of the unit cells arrayed in the first and second columns are performed, a program operation of the unit cells arrayed in the third column may be performed. As illustrated in FIG. 23, an example in which the unit cells C13, C23 and C33 among the unit cells C13, C23, C33 and C43 arrayed in the third column are simultaneously programmed will be described. Specifically, when the first and second word lines WL1 and WL2 are floated, the first program voltage Vpp1 may be applied to the third word line WL3, and the second program voltage Vpp2 may be applied to the remaining word line WL4. In addition, a ground voltage may be applied to the first, second and third bit lines BL1, BL2 and BL3 which are respectively connected to the selected unit cells C13, C23 and C33. The fourth bit line BL4 connected to the unit cell C43 may be floated or grounded. Moreover, a ground voltage may be applied to the first, second and third well bias lines PWL1, PWL2 and PWL3 which are respectively connected to the selected unit cells C13, C23 and C33. The second program voltage Vpp2 may also be applied to the remaining well bias line, that is, the fourth well bias line PWL4. Although not shown in FIG. 23, the second program voltage Vpp2 may also be applied to the deep well bias line NWL.

Under the above bias condition, the selected unit cells C13, C23 and C33 may be simultaneously programmed. That is, a resistive path may be formed in the third anti-fuse insulation layer 163 of each of the selected unit cells C13, C23 and C33. The selected unit cells C13, C23 and C33 may be programmed by the same mechanism as described with reference to FIG. 14. The non-selected unit cells C11, C21, C31 and C41 arrayed in the first column may not be influenced by the program operation for programming the selected unit cells C13, C23 and C33 because the first word line WL1 is floated. Similarly, the non-selected unit cells C12, C22, C32 and C42 arrayed in the second column may not be influenced by the program operation for programming the selected unit cells C13, C23 and C33 because the second word line WL2 is floated. The unit cells C14, C24, C34 and C44 arrayed in the fourth column may not be programmed because the second program voltage Vpp2 applied to the fourth word line WL4 has a voltage level which is insufficient to rupture the fourth anti-fuse insulation layer disposed in the fourth column, as described with reference to FIG. 14. The unit cell C43 arrayed in the third column may not be programmed by the same program inhibition mechanism as described with reference to FIG. 15.

Figure 24:
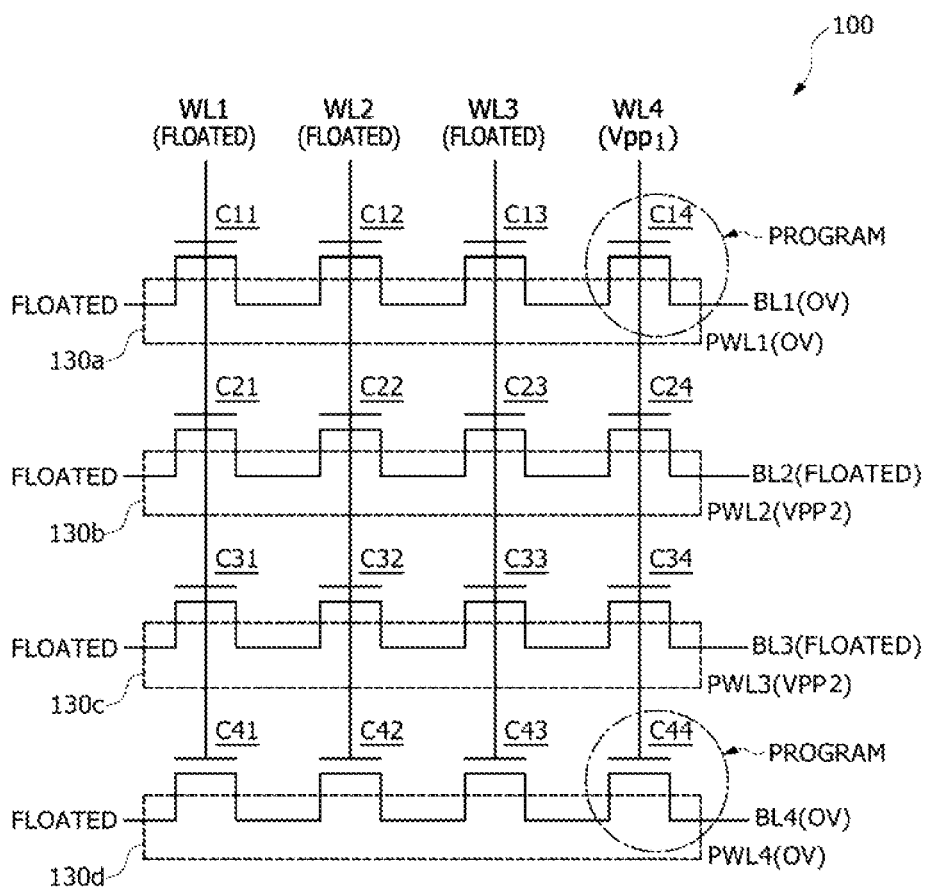

Referring to FIG. 24, after the program operations of the unit cells arrayed in the first, second and third columns are performed, a program operation of the unit cells arrayed in the final column, i.e., the fourth column, may be performed. As illustrated in FIG. 24, an example in which the unit cells C14 and C44 among the unit cells C14, C24, C34 and C44 arrayed in the fourth column are simultaneously programmed will be described. Specifically, in a state where the first, second and third word lines WL1, WL2 and WL3 may be floated, the first program voltage Vpp1 may be applied to the fourth word line WL4. In addition, a ground voltage may be applied to the first and fourth bit lines BL1 and BL4 which are respectively connected to the selected unit cells C14 and C44. The remaining bit lines, that is, the second and third bit lines BL2 and BL3, may be floated. Moreover, a ground voltage may be applied to the first and fourth well bias lines PWL1 and PWL4 which are respectively connected to the selected unit cells C14 and C44, and the second program voltage Vpp2 may be applied to the remaining well bias line, that is, the second and third well bias lines PWL2 and PWL3. Although not shown in FIG. 24, the second program voltage Vpp2 may also be applied to the deep well bias line NWL.

Under the above bias condition, the selected unit cells C14 and C44 may be simultaneously programmed. That is, a resistive path may be formed in the fourth anti-fuse insulation layer 164 of each of the selected unit cells C14 and C44. The selected unit cells C14 and C44 may be programmed by the same mechanism as described with reference to FIG. 17. The non-selected unit cells C11, C21, C31 and C41 arrayed in the first column may not be influenced by the program operation for programming the selected unit cells C14 and C44 because the first word line WL1 is floated. The non-selected unit cells C12, C22, C32 and C42 arrayed in the second column may not be influenced by programming the selected unit cells C14 and C44 because the second word line WL2 is floated. The non-selected unit cells C13, C23, C33 and C43 arrayed in the third column may not be influenced programming the selected unit cells C14 and C44 because the third word line WL3 is floated. The unit cells C24 and C34 arrayed in the fourth column may not be programmed by the same program inhibition mechanism as described with reference to FIG. 18.

Figure 25:
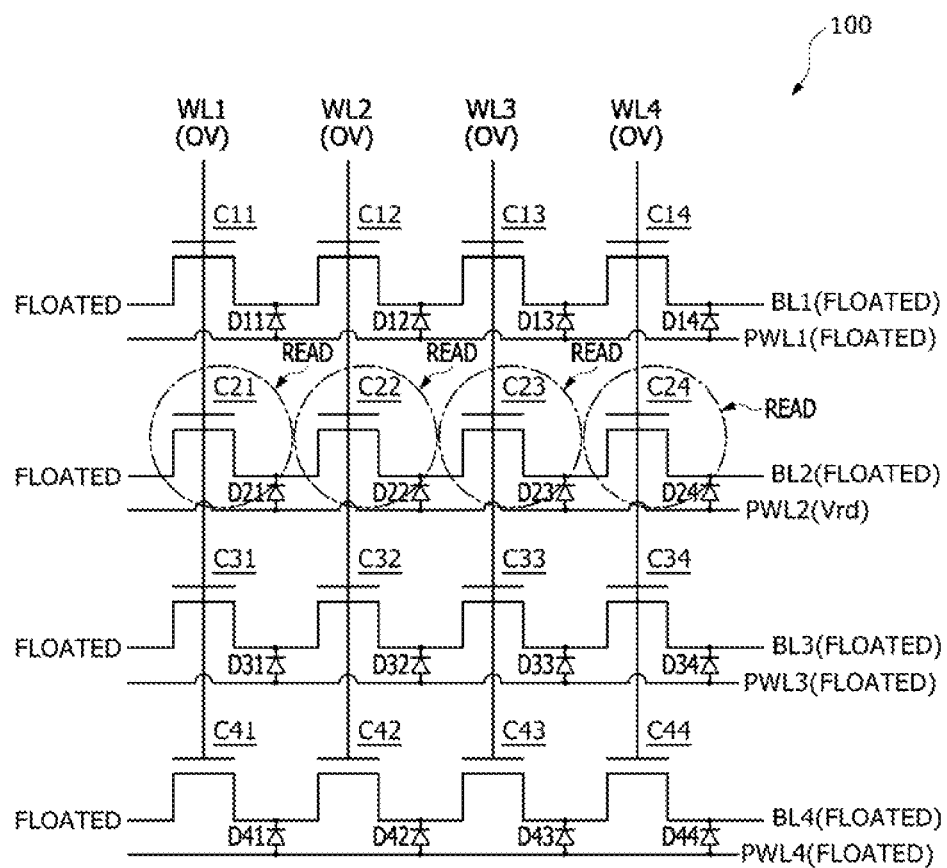
FIGS. 25 to 27 are schematic views illustrating read operations of the anti-fuse type OTP memory cell array shown in FIG. 6.
Figure 27:
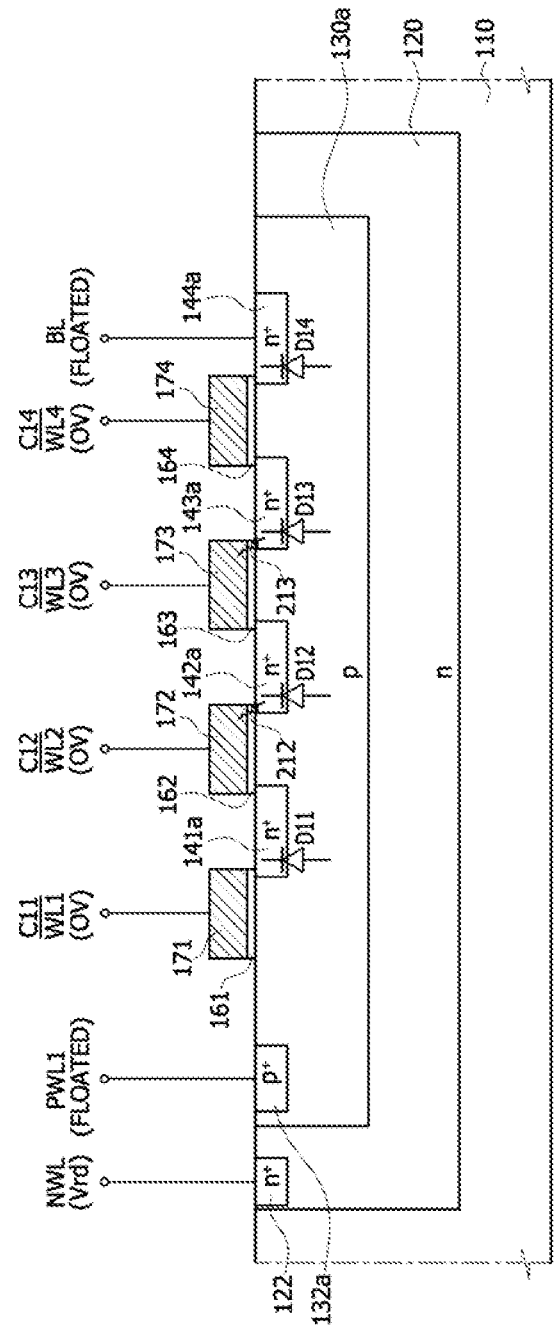

FIGS. 25 and 27 are schematic views illustrating read operations of the anti-fuse type OTP memory cell array 100 shown in FIG. 6.

The read operation according to the present embodiment may be performed in units of rows. Thus, all of data stored in the anti-fuse type OTP memory cell array 100 may be read out by executing the read operation by the same number of times as there are rows. In order to selectively read out the data stored in the unit cells arrayed in a selected row, a read voltage Vrd may be applied to a well bias line disposed in the selected row. In addition, all of the word lines may be grounded, and all of the bit lines may be floated. Moreover, the remaining well bias lines disposed in non-selected rows other than the selected row may be floated.

FIG. 25 illustrates an example in which data of the unit cells C21, C22, C23 and C24 arrayed in the second row are read out.

Referring to FIG. 25, in order to read out the data of the unit cells C21, C22, C23 and C24 arrayed in the second row, the read voltage Vrd may be applied to the second well bias line PWL2 which is connected in common to the unit cells C21, C22, C23 and C24. The read voltage Vrd may have a voltage level which is greater than a turn-on voltage of a general PN diode. In some embodiments, the read voltage Vrd may be within the range of about 1 V to about 3 V. The remaining well bias lines, that is, the first, third and fourth well bias lines PWL1, PWL3 and PWL4 may be floated. All of the word lines WL1, WL2, WL3 and WL4 may be grounded, and all of the bit lines BL1, BL2, BL3 and BL4 may be floated. Although not shown in FIG. 25, the read voltage Vrd or a voltage greater than the read voltage Vrd may be applied to the deep well bias line NWL.

Figure 26:
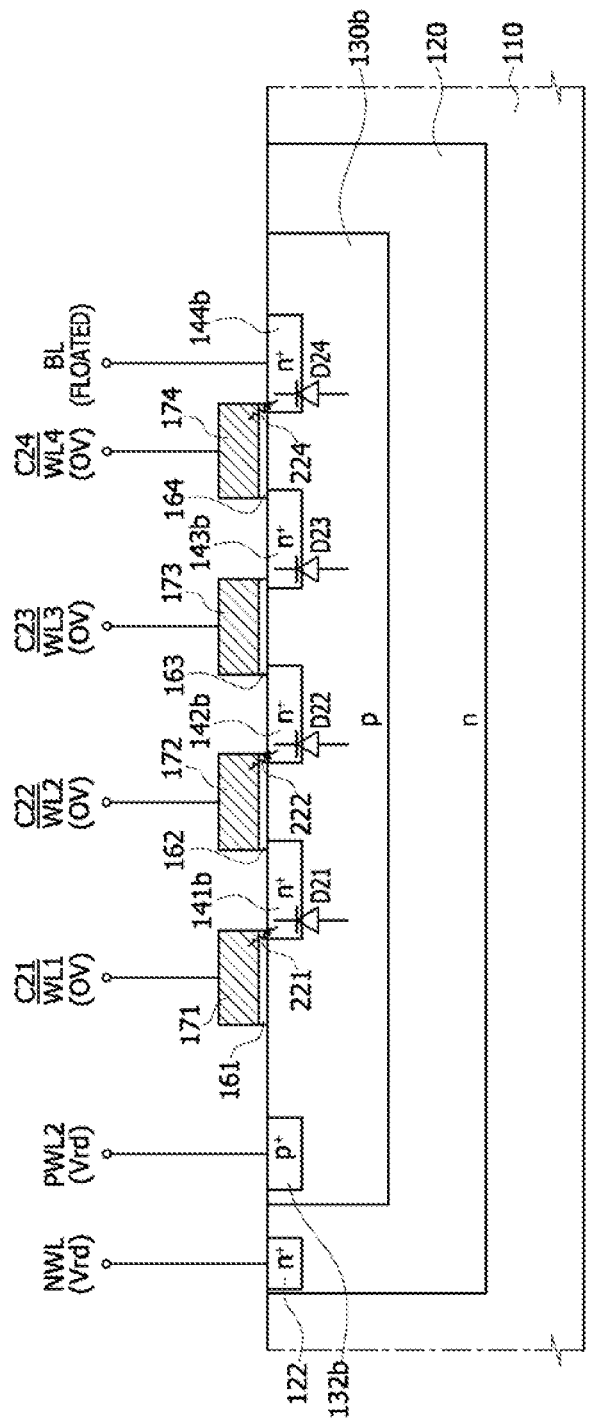

FIG. 26 is a cross-sectional view illustrating the unit cells C21, C22, C23 and C24 which are arrayed in the second row.

As illustrated in FIG. 26, the unit cells C21, C22 and C24 among the unit cells C21, C22, C23 and C24 arrayed in the second row may have a first state, e.g., a programmed state, with resistive paths 221, 222 and 224, respectively. In contrast, the unit cell C23 among the unit cells C21, C22, C23 and C24 arrayed in the second row may have a second state, e.g., an erased state, without a resistive path. The unit cell C21 located at a cross point of the second row and the first column may include a parasitic PN diode D21 which is composed of the second well region 130b and the second source/drain region 141b, and the unit cell C22 located at a cross point of the second row and the second column may include a parasitic PN diode D22 which is composed of the second well region 130b and the second source/drain region 142b. In addition, the unit cell C23 located at a cross point of the second row and the third column may include a parasitic PN diode D23 which is composed of the second well region 130b and the second source/drain region 143b, and the unit cell C24 located at a cross point of the second row and the fourth column may include a parasitic PN diode D24 which is composed of the second well region 130b and the second drain region 144b.

The read voltage Vrd may be applied to the second well region 130b through the second well bias line PWL2. All of the parasitic PN diodes D21, D22, D23 and D24 may be forward-biased to have a turned-on state. Even though the parasitic PN diodes D21, D22, D23 and D24 have a turned-on state, current flowing through each of the parasitic PN diodes D21, D22, D23 and D24 may depend on whether each of the unit cells C21, C22, C23 and C24 is programmed or not. Specifically, because the unit cell C21 has the programmed state with the resistive path 221, the second source/drain region 141b may be electrically connected to the first word line WL1 through the resistive path 221. If the voltage drop in the parasitic PN diode D21 is neglected, the read voltage Vrd may be applied to the second source/drain region 141b. Therefore, current may flow from the second well bias line PWL2 toward the grounded first word line WL1 through the parasitic PN diode D21. Thus, when the current flowing through the first word line WL1 is detected, the unit cell C21 connected to the first word line WL1 may be recognized to be programmed. This read operation of the unit cell C21 may be equally applied to the other selected unit cells C22 and C24 having a programmed state.

Meanwhile, because the unit cell C23 has the erased state without a resistive path, the third word line WL3 may be electrically isolated or insulated from the second source/drain regions 142b and 143b by the third anti-fuse insulation layer 163. Thus, even though the parasitic PN diodes D22 and D23 are forward-biased so that the read voltage Vrd is applied to the second source/drain regions 142b and 143b, no current may flow from the second well bias line PWL2 toward the grounded third word line WL3 because of the third anti-fuse insulation layer 163 serves as an electrical barrier layer. Accordingly, when the current flowing through the third word line WL3 is not detected, the unit cell C23 connected to the third word line WL3 may be recognized to be erased.

FIG. 27 is a cross-sectional view illustrating a bias condition of the unit cells C11, C12, C13 and C14 which are arrayed in the first row during the read operations for reading out data of the unit cells C21, C22, C23 and C24 arrayed in the second row.

The unit cells C11, C12, C13 and C14 arrayed in the first row may share the first, second, third and fourth word lines WL1, WL2, WL3 and WL4 with the unit cells C21, C22, C23 and C24 on which the read operations are performed, respectively. Thus, while the read operation for reading out the data of the unit cells C21, C22, C23 and C24 arrayed in the second row is performed, current must not flow through the unit cells C11, C12, C13 and C14 arrayed in the first row in order to correctly read out the data of the unit cells C21, C22, C23 and C24 arrayed in the second row.

When the unit cells C11 and C14 among the unit cells C11, C12, C13 and C14 arrayed in the first row have an erased state, the parasitic PN diodes D11 and D14 may not be forward-biased because the first well bias line PWL1 is floated. In addition, because there is no resistive path in the first and fourth anti-fuse insulation layers 161 and 164 of the unit cells C11 and C14, no current flows through the unit cells C11 and C14 regardless of the bias conditions of the parasitic PN diodes D11 and D14. The parasitic PN diodes D12 and D13 in the unit cells C12 and C13 may not be forward-biased because the first well bias line PWL1 is floated. Thus, even though the unit cells C12 and C13 have a programmed state with a resistive path 212 formed between the second word line WL2 and the first source/drain region 142a, and a resistive path 213 formed between the third word line WL3 and the first source/drain region 143a, no current flows through the unit cells C12 and C13. Similarly, during the read operations for reading out the data of the unit cells C21, C22, C23 and C24 arrayed in the second row, no current flows through the unit cells C31, C32, C33 and C34 arrayed in the third row and the unit cells C41, C42, C43 and C44 arrayed in the fourth row. That is, while the read operation for selectively reading out the data of the unit cells C21, C22, C23 and C24 arrayed in the second row are performed, the non-selected unit cells C11, C12, C13, C14, C31, C32, C33, C34, C41, C42, C43 and C44 arrayed in the first, third and fourth rows may not influence the read operation.

Figure 28:
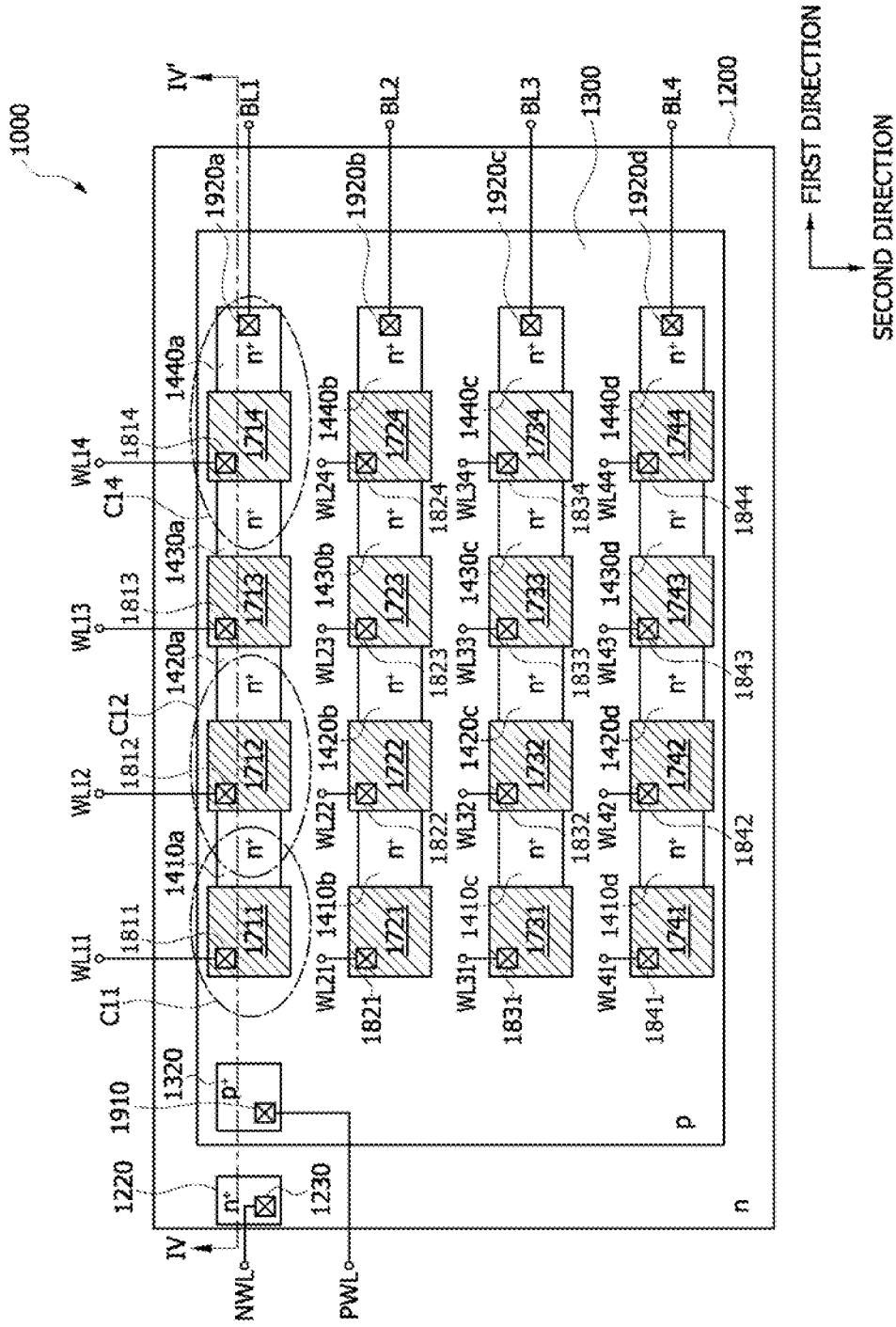
FIG. 28 is a layout diagram illustrating an anti-fuse type OTP memory cell array according to another embodiment.

FIG. 28 is a layout diagram illustrating an anti-fuse type OTP memory cell array 1000 according to another embodiment.

Referring to FIG. 28, the anti-fuse type OTP memory cell array 1000 may include a well region 1300. Sidewalls and a bottom surface of the well region 1300 may be surrounded by a deep well region 1200. The deep well region 1200 may have a first conductivity type, and the well region 1300 may have a second conductivity type which is opposite to the first conductivity type. In some embodiments, the deep well region 1200 may be N-type and the well region 1300 may be P-type. The deep well region 1200 may be formed by performing an ion implantation process with a mask pattern and a diffusion process. Similarly, the well region may also be formed by performing an ion implantation process with a mask pattern and a diffusion process.

A plurality of anti-fuse gates 1711 to 1714, 1721 to 1724, 1731 to 1734 and 1741 to 1744 may be disposed on the well region 1200. The anti-fuse gates 1711 to 1714, 1721 to 1724, 1731 to 1734 and 1741 to 1744 may be two-dimensionally arrayed to be spaced apart from each other in a first direction and a second direction. In some embodiments, the first and second directions may be perpendicular to each other. Although not shown in FIG. 28, an anti-fuse insulation layer may be disposed between each anti-fuse gate and the well region 1300. Each of the anti-fuse gates 1711 to 1714, 1721 to 1724, 1731 to 1734 and 1741 to 1744 may be defined by one of rows and one of columns. That is, the anti-fuse gates 1711 to 1714 may be sequentially located at cross points of the first row and the first to fourth columns, and the anti-fuse gates 1721 to 1724 may be sequentially located at cross points of the second row and the first to fourth columns. In addition, the anti-fuse gates 1731 to 1734 may be sequentially located at cross points of the third row and the first to fourth columns, and the anti-fuse gates 1741 to 1744 may be sequentially located at cross points of the fourth row and the first to fourth columns. As a result, the anti-fuse gates 1711 to 1714, 1721 to 1724, 1731 to 1734 and 1741 to 1744 may be arrayed to have a '4×4' matrix form.

First source/drain regions 1410a, 1420a and 1430a may be sequentially disposed in portions of the well region 1300 between the anti-fuse gates 1711 to 1714 arrayed in the first row. A first drain region 1440a may be disposed in a portion of the well region 1300 which is adjacent to one side of the anti-fuse gate 1714 opposite to the first source/drain region 1430a between the anti-fuse gate 1713 and the anti-fuse gate 1714. Second source/drain regions 1410b, 1420b and 1430b may be sequentially disposed in portions of the well region 1300 between the anti-fuse gates 1721 to 1724 arrayed in the second row. A second drain region 1440b may be disposed in a portion of the well region 1300 which is adjacent to one side of the anti-fuse gate 1724 opposite to the second source/drain region 1430b between the anti-fuse gate 1723 and the anti-fuse gate 1724. Third source/drain regions 1410c, 1420c and 1430c may be sequentially disposed in portions of the well region 1300 between the anti-fuse gates 1731 to 1734 arrayed in the third row. A third drain region 1440c may be disposed in a portion of the well region 1300 which is adjacent to one side of the anti-fuse gate 1734 opposite to the third source/drain region 1430c between the anti-fuse gate 1733 and the anti-fuse gate 1734. Fourth source/drain regions 1410d, 1420d and 1430d may be sequentially disposed in portions of the well region 1300 between the anti-fuse gates 1741 to 1744 arrayed in the fourth row. A fourth drain region 1440d may be disposed in a portion of the well region 1300 which is adjacent to one side of the anti-fuse gate 1744 opposite to the fourth source/drain region 1430d between the anti-fuse gate 1743 and the anti-fuse gate 1744.

As a result, a pair of source/drain regions may be disposed at both sides of each of the anti-fuse gates 1712 to 1742 arrayed in the second column, the anti-fuse gates 1713 to 1743 arrayed in the third column, and the anti-fuse gates 1714 to 1744 arrayed in the fourth column. For example, the first source/drain region 1410a may be disposed between the anti-fuse gate 1711 located at a cross point of the first row and the first column and the anti-fuse gate 1712 located at a cross point of the first row and the second column, and the first source/drain region 1420a may be disposed between the anti-fuse gate 1712 located at a cross point of the first row and the second column and the anti-fuse gate 1713 located at a cross point of the first row and the third column. Moreover, the first source/drain region 1430a may be disposed between the anti-fuse gate 1713 located at a cross point of the first row and the third column and the anti-fuse gate 1714 located at a cross point of the first row and the fourth column. The first source/drain regions 1410a, 1420a and 1430a, the second source/drain regions 1410b, 1420b and 1430b, the third source/drain regions 1410c, 1420c and 1430c, the fourth source/drain regions 1410d, 1420d and 1430d, the first drain region 1440a, the second drain region 1440b, the third drain region 1440c, and the fourth drain region 1440d may have the first conductivity type, i.e., N-type, which is opposite to the second conductivity type, i.e., P-type, of the well region 1300.

According to the anti-fuse type OTP memory cell array 1000, a single unit cell may be provided in each of the cross points where the anti-fuse gates 1711 to 1714, 1721 to 1724, 1731 to 1734 and 1741 to 1744 are disposed. Thus, the anti-fuse type OTP memory cell array 1000 may include sixteen unit cells which are arrayed to have a '4×4' matrix form. That is, each of the unit cells may be defined by one row and one column. Each of the unit cells may be configured to have a single MOS transistor structure. For example, a unit cell C12 located at a cross point of the first row and the second column may be a MOS transistor which is composed of the well region 1300, the first source/drain regions 1410a and 1420a, and the anti-fuse gate 1712. In this case, the first source/drain region 1410a may serve as a source region of the unit cell C12, and the first source/drain region 1420a may serve as a drain region of the unit cell C12. As described above, an anti-fuse insulation layer (not shown) may be disposed between the well region 1300 and the anti-fuse gate 1712. Each of the other unit cells arrayed in the second and third columns except for the first column and the last column, i.e., the fourth column, may also have the same structure as the unit cell C12.

In contrast, each of the unit cells arrayed in the first column may have a half MOS transistor structure. For example, a unit cell C11 located at a cross point of the first row and the first column may be a half MOS transistor which is composed of the well region 1300, the first source/drain region 1410a and the anti-fuse gate 1711. In this case, the first source/drain region 1410a may serve as a drain region of the unit cell C11, and no source region is provided in the unit cell C11. Each of the remaining unit cells arrayed in the first column may also have the same structure as the unit cell C11.

Each of the unit cells arrayed in the last column, i.e., the fourth column, may also have a single MOS transistor structure. For example, a unit cell C14 located at a cross point of the first row and the fourth column may be a MOS transistor which is composed of the well region 1300, the first source/drain region 1430a, the first drain 1440a and the anti-fuse gate 1714. In this case, the first source/drain region 1430a may serve as a source region of the unit cell C14. Each of the remaining the unit cells arrayed in the last column, i.e., the fourth column, may also have the same structure as the unit cell C14.

A deep well contact region 1220 may be disposed in the deep well region 1200. The deep well contact region 1220 may be spaced apart from the well region 1300. The deep well contact region 1220 may have the same conductivity type, e.g., the first conductivity type, as the deep well region 1200 and may have an impurity concentration which is higher than an impurity concentration of the deep well region 1200. The deep well contact region 1220 may be electrically connected to a deep well bias line NWL through a deep well bias line contact 1230. Although FIG. 28 illustrates an example in which a single deep well contact region 1220 is disposed in the deep well region 1200, the present disclosure is not limited thereto. For example, in some embodiments, a plurality of deep well contact regions may be disposed in the deep well region 1200. The plurality of deep well contact regions may be connected to the deep well bias line NWL.

A well contact region 1320 may be disposed in the well region 1300. The well contact region 1320 may have the same conductivity type, e.g., the second conductivity type, as the well region 1300. In addition, the well contact region 1320 may have an impurity concentration which is higher than an impurity concentration of the well region 1300. Although FIG. 28 illustrates an example in which a single well contact region 1320 is disposed in the well region 1300, the present disclosure is not limited thereto. For example, in some embodiments, a plurality of well contact regions may be disposed in the well region 1300.

The anti-fuse gates 1711 to 1714, 1721 to 1724, 1731 to 1734 and 1741 to 1744 may be electrically connected to word lines WL11 to WL14, WL21 to WL24, WL31 to WL34 and WL41 to WL44 through word line contacts 1811 to 1814, 1821 to 1824, 1831 to 1834 and 1841 to 1844, respectively. The well contact region 1320 may be electrically connected to a well bias line PWL through a well bias line contact 1910. The first drain region 1440a may be electrically connected to a first bit line BL1 through a first bit line contact 1920a, and the second drain region 1440b may be electrically connected to a second bit line BL2 through a second bit line contact 1920b. Similarly, the third drain region 1440c may be electrically connected to a third bit line BL3 through a third bit line contact 1920c, and the fourth drain region 1440d may be electrically connected to a fourth bit line BL4 through a fourth bit line contact 1920d.

Although FIG. 28 illustrates an example in which the anti-fuse type OTP memory cell array 1000 includes sixteen anti-fuse gates 1711 to 1714, 1721 to 1724, 1731 to 1734 and 1741 to 1744 which are arrayed in a '4×4' matrix form, the present disclosure is not limited thereto. In other words, there may be or any number of anti-fuse gates.

Figure 29:
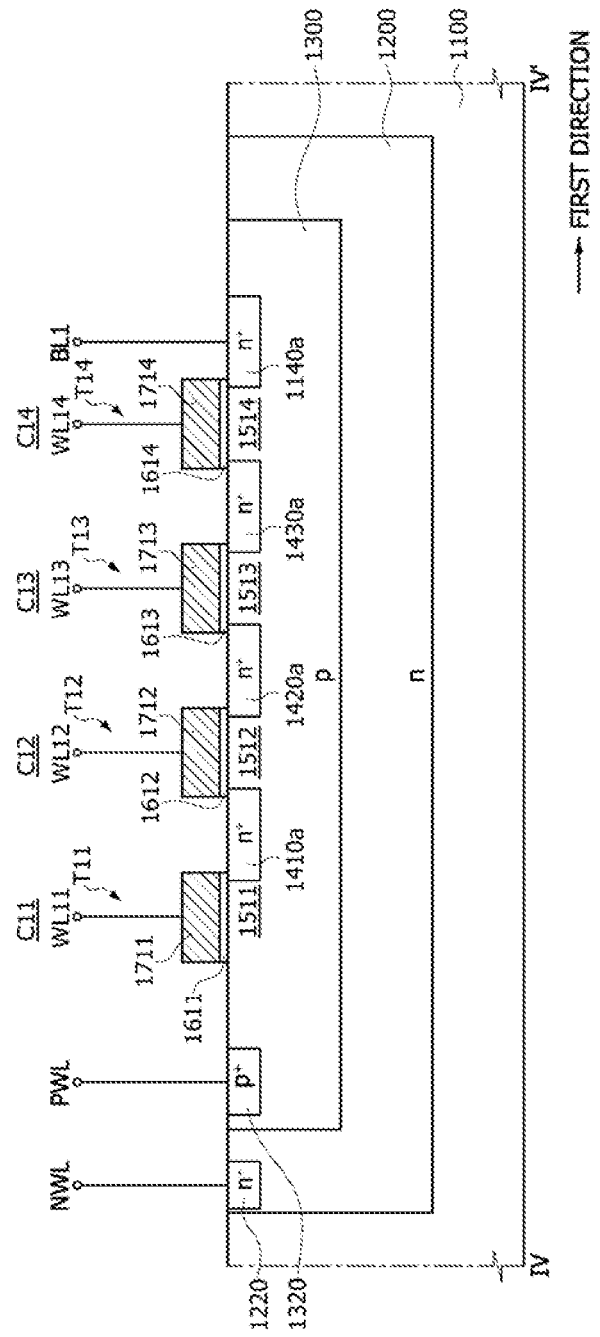
FIG. 29 is a cross-sectional view taken along a line IV-IV' of FIG. 28.

FIG. 29 is a cross-sectional view taken along a line IV-IV' of FIG. 28. That is, FIG. 29 illustrates cross-sectional views of first transistors T11, T12, T13 and T14 corresponding to the unit cells C11, C12, C13 and C14 that are respectively disposed at cross points of the first row and the first to fourth columns in FIG. 28. Each of cross-sectional views taken along the second, third and fourth rows may be substantially the same as the cross-sectional view illustrated in FIG. 29. In FIG. 29, the same reference numerals or the same reference designators as used in FIG. 28 denote the same elements.

Referring to FIGS. 28 and 29, the deep well region 1200 of the first conductivity type, for example, an N-type deep well region may be disposed in an upper region of a substrate 1100. The deep well contact region 1220 and the well region 1300 may be disposed in an upper region of the deep well region 1200. Accordingly, sidewalls and a bottom surface of the deep well contact region 1220 as well as sidewalls and a bottom surface of the well region 1300 may be surrounded by the deep well region 1200. Although not shown in FIG. 29, the unit cells arrayed in the second, third and fourth rows may share the well region 1300 with the unit cells C11, C12, C13 and C14 arrayed in the first row, as described with reference to FIG. 28. The deep well contact region 1220 may have the same conductivity type as the deep well region 1200, and have the impurity concentration higher than the impurity concentration of the deep well region 1200.

The well contact region 1320, the plurality of first source/drain regions 1410a, 1420a and 1430a, and the first drain region 1440a may be sequentially arrayed in an upper region of the well region 1300 to be spaced apart from each other in the first direction. The well contact region 1320 may have the same conductivity type as the well region 1300. However, the impurity concentration of the well contact region 1320 may be higher than the impurity concentration of the well region 1300. All of the first source/drain regions 1410a, 1420a and 1430a and the first drain region 1440a may be N-type. A first channel region 1511 in the first column may be disposed at a side of the first source/drain region 1410a opposite to the first drain region 1440a. A first channel region 1512 in the second column may be disposed between the first source/drain regions 1410a and 1420a. A first channel region 1513 in the third column may be disposed between the first source/drain regions 1420a and 1430a. Moreover, a first channel region 1514 in the fourth column may be disposed between the first source/drain region 1430a and the first drain region 1440a.

An anti-fuse insulation layer 1611 and the anti-fuse gate 1711 may be sequentially stacked on the first channel region 1511 located at a cross point of the first row and the first column. One sidewalls of the anti-fuse insulation layer 1611 and the anti-fuse gate 1711 may be vertically aligned with a first sidewall of the first source/drain region 1410a. An anti-fuse insulation layer 1612 and the anti-fuse gate 1712 may be sequentially stacked on the first channel region 1512 located at a cross point of the first row and the second column. One sidewalls of the anti-fuse insulation layer 1612 and the anti-fuse gate 1712 may be vertically aligned with a second sidewall of the first source/drain region 1410a, and second sidewalls of the anti-fuse insulation layer 1612 and the anti-fuse gate 1712 may be vertically aligned with a first sidewall of the first source/drain region 1420a. An anti-fuse insulation layer 1613 and the anti-fuse gate 1713 may be sequentially stacked on the first channel region 1513 located at a cross point of the first row and the third column. One sidewalls of the anti-fuse insulation layer 1613 and the anti-fuse gate 1713 may be vertically aligned with a second sidewall of the first source/drain region 1420a, and second sidewalls of the anti-fuse insulation layer 1613 and the anti-fuse gate 1713 may be vertically aligned with a first sidewall of the first source/drain region 1430a. An anti-fuse insulation layer 1614 and the anti-fuse gate 1714 may be sequentially stacked on the first channel region 1514 located at a cross point of the first row and the fourth column. One sidewalls of the anti-fuse insulation layer 1614 and the anti-fuse gate 1714 may be vertically aligned with a second sidewall of the first source/drain region 1430a, and second sidewalls of the anti-fuse insulation layer 1614 and the anti-fuse gate 1714 may be vertically aligned with a first sidewall of the first drain region 1440a.

The first transistor T11 in the first column among the first transistors T11, T12, T13 and T14 arrayed in the first row may have a half MOS transistor structure. Each of the remaining first transistors 112, T13 and T14 in the first row may have a complete MOS transistor structure.

The anti-fuse gates 1711, 1712, 1713 and 1714 arrayed in the first row may be electrically connected to the word lines WL11, WL12, WL13 and WL14 located at cross points of the first row and the first to fourth columns, respectively. The deep well contact region 1220 may be electrically connected to the deep well bias line NWL. The well contact region 1320 may be electrically connected to the well bias line PWL. The first drain region 1440a may be electrically connected to the first bit line BL1.

Figure 30:
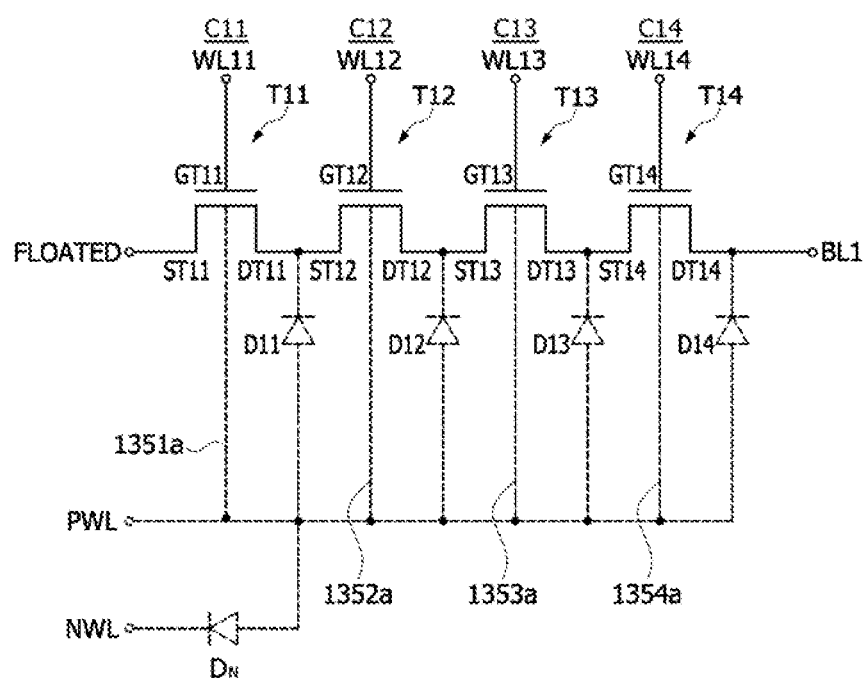
FIG. 30 is an equivalent circuit diagram illustrating the cross-sectional view shown in FIG. 29.

FIG. 30 is an equivalent circuit diagram illustrating the cross-sectional view shown in FIG. 29. Although FIG. 30 illustrates only the equivalent circuit diagram of the unit cells C11, C12, C13 and C14 arrayed in the first row, each of equivalent circuit diagrams corresponding to cross-sectional views taken along the other rows, i.e., the second, third and fourth rows, may also be substantially the same as the equivalent circuit diagram shown in FIG. 30.

Referring to FIGS. 28, 29 and 30, the unit cell C11 in the first row may correspond to the transistor T11 having a half MOS transistor structure, and the remaining unit cells C12, C13 and C14 arrayed in the first row may correspond to the transistors T12, T13 and 114, each of which has a complete MOS transistor structure. That is, the anti-fuse type OTP memory cell array 1000 does not include a selection transistor for selecting a specific unit cell among the unit cells C11, C12, C13 and C14 arrayed in the first row. The transistors T11, T12, T13 and T14 may be sequentially connected in series. That is, a drain terminal DT11 of the transistor T11 located at a cross point of the first row and the first column may be electrically connected to a source terminal ST12 of the transistor 112 located at a cross point of the first row and the second column, a drain terminal DT12 of the transistor T12 located at a cross point of the first row and the second column may be electrically connected to a source terminal ST13 of the transistor 113 located at a cross point of the first row and the third column, and a drain terminal DT13 of the transistor T13 located at a cross point of the first row and the third column may be electrically connected to a source terminal ST14 of the transistor T14 located at a cross point of the first row and the fourth column. A source terminal ST11 of the transistor T11 located at a cross point of the first row and the first column may be electrically floated, and a drain terminal DT14 of the transistor T14 located at a cross point of the first row and the fourth column may be electrically connected to the first bit line BL1.

A gate terminal GT11 of the transistor T11 located at a cross point of the first row and the first column may be electrically connected to the word line WL11. A gate terminal GT12 of the transistor T12 located at a cross point of the first row and the second column may be electrically connected to the word line WL12. A gate terminal GT13 of the transistor T13 located at a cross point of the first row and the third column may be electrically connected to the word line WL13. A gate terminal GT14 of the transistor T14 located at a cross point of the first row and the fourth column may be electrically connected to the word line WL14. The drain terminal DT11 of the transistor T11 and the source terminal ST12 of the transistor T12 may be electrically connected to a cathode of a first diode D11 located at a cross point of the first row and the first column, and the drain terminal DT12 of the transistor T12 and the source terminal ST13 of the transistor T13 may be electrically connected to a cathode of a first diode D12 located at a cross point of the first row and the second column. Similarly, the drain terminal DT13 of the transistor T13 and the source terminal ST14 of the transistor T14 may be electrically connected to a cathode of a first diode D13 located at a cross point of the first row and the third column, and the drain terminal DT14 of the transistor T14 may be electrically connected to a cathode of a first diode D14 located at a cross point of the first row and the fourth column. Anodes of the first diodes D11, D12, D13 and D14 may be electrically connected to the well bias line PWL. The anodes of the first diodes D11, D12, D13 and D14 may also be electrically connected to an anode of a deep well diode $D_N$. A cathode of the deep well diode $D_N$ may be electrically connected to the deep well bias line NWL.

The gate terminal GT11 and the drain terminal DT11 of the transistor T11 constituting the unit cell C11 located at a cross point of the first row and the first column may correspond to the anti-fuse gate 1711 and the first source/drain region 1410a described with reference to FIGS. 28 and 29, respectively. No diffusion region corresponding to the floated source terminal ST11 of the transistor T11 may be provided in the substrate 1100. The gate terminal GT12, the source terminal ST12 and the drain terminal DT12 of the transistor T12 constituting the unit cell C12 located at a cross point of the first row and the second column may correspond to the anti-fuse gate 1712, the first source/drain region 1410a and the first source/drain region 1420a, respectively. The first source/drain region 1410a may serve as the drain terminal DT11 of the transistor T11 and the source terminal ST12 of the transistor T12. The gate terminal GT13, the source terminal ST13 and the drain terminal DT13 of the transistor T13 constituting the unit cell C13 located at a cross point of the first row and the third column may correspond to the anti-fuse gate 1713, the first source/drain region 1420a and the first source/drain region 1430a, respectively. The first source/drain region 1420a may serve as the drain terminal DT12 of the transistor T12 and the source terminal ST13 of the transistor T13. The gate terminal GT14, the source terminal ST14 and the drain terminal DT14 of the transistor T14 constituting the unit cell C14 located at a cross point of the first row and the fourth column may correspond to the anti-fuse gate 1714, the first source/drain region 1430a and the first drain region 1440a, respectively. The first source/drain region 1430a may serve as the drain terminal DT13 of the transistor T13 and the source terminal ST14 of the transistor T14.

The first diode D11 may correspond to a parasitic diode component which is composed of the well region 1300 and the first source/drain region 1410a, and the first diode D12 may correspond to a parasitic diode component which is composed of the well region 1300 and the first source/drain region 1420a. Moreover, the first diode D13 may correspond to a parasitic diode component which is composed of the well region 1300 and the first source/drain region 1430a, and the first diode D14 may correspond to a parasitic diode component which is composed of the well region 1300 and the first drain region 1440a. In addition, the deep well diode $D_N$ may correspond to a parasitic diode component which is composed of the well region 1300 and the deep well region 1200.

The well region 1300 may serve as a common bulk region of the transistors T11, T12, T13 and T14 arrayed in the first row. Thus, the first channel region 1511 of the transistor T11 may be electrically connected to the well bias line PWL through a line 1351a, and the first channel region 1512 of the transistor T12 may be electrically connected to the well bias line PWL through a line 1352a. Similarly, the first channel region 1513 of the transistor T13 may be electrically connected to the well bias line PWL through a line 1353a, and the first channel region 1514 of the transistor T14 may be electrically connected to the well bias line PWL through a line 1354a.

Figure 31:
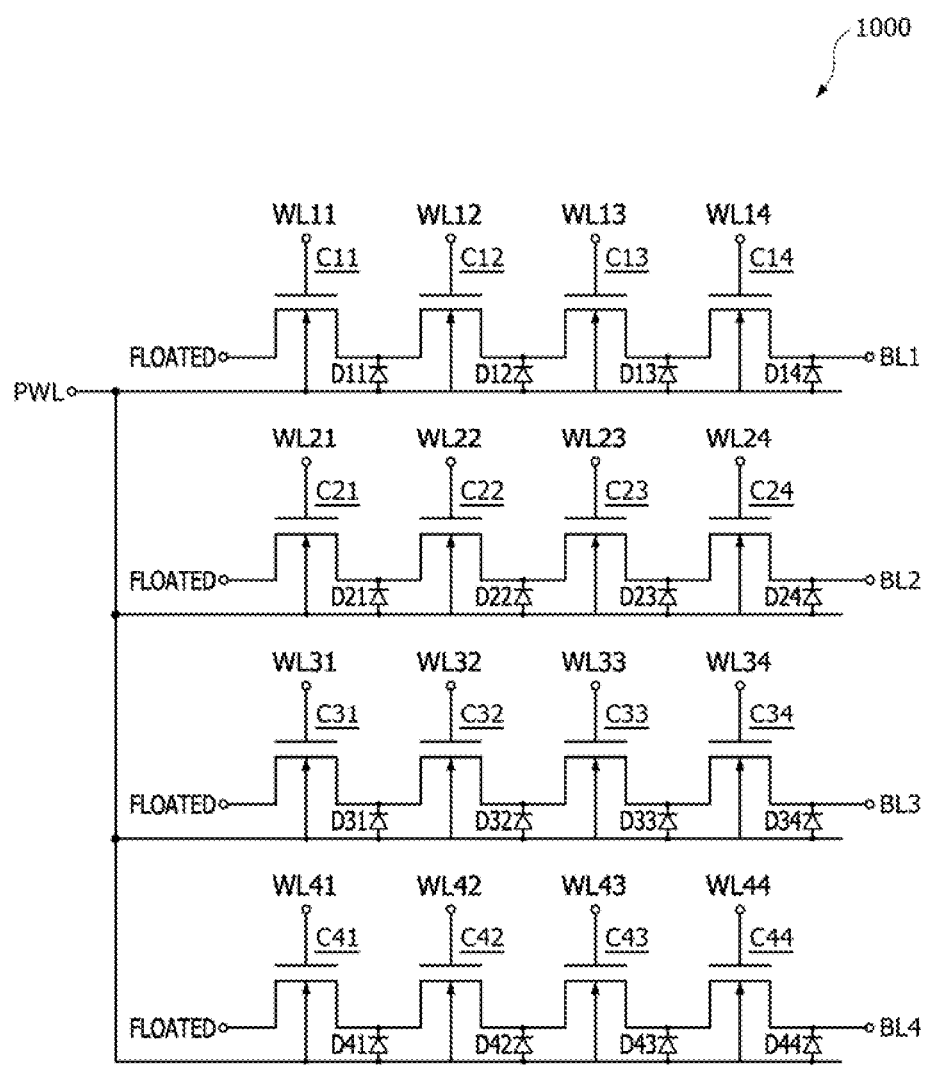
FIG. 31 is an equivalent circuit diagram illustrating the anti-fuse type OTP memory cell array shown in FIG. 28.

FIG. 31 is an equivalent circuit diagram illustrating the anti-fuse type OTP memory cell array 1000 shown in FIG. 28. The anti-fuse type OTP memory cell array 1000 of FIG. 31 may correspond to an equivalent circuit diagram of a plurality of rows, each of which has substantially the same configuration as the first row described with reference to FIG. 30.

Referring to FIG. 31, the plurality of word lines WL11 to WL14, WL21 to WL24, WL31 to WL34 and WL41 to WL44 may be connected to the gate terminals of the transistors constituting the unit cells which are located at cross points of the rows and the columns, respectively. As described with reference to FIG. 30, all of the unit cells located at the cross points of the rows and the columns may be connected to the well bias line PWL.

The unit cells C11, C12, C13 and C14 arrayed in the first row may be connected in series in the first direction, i.e., a row direction. The source terminal of the unit cell C11 among the unit cells C11, C12, C13 and C14 arrayed in the first row may be floated, and the drain terminal of the unit cell C14 may be electrically connected to the first bit line BL1. The unit cells C21, C22, C23 and C24 arrayed in the second row may also be connected in series in the first direction. The source terminal of the unit cell C21 among the unit cells C21, C22, C23 and C24 arrayed in the second row may be floated, and the drain terminal of the unit cell C24 may be electrically connected to the second bit line BL2. The unit cells C31, C32, C33 and C34 arrayed in the third row may also be connected in series in the first direction. The source terminal of the unit cell C31 among the unit cells C31, C32, C33 and C34 arrayed in the third row may be floated, and the drain terminal of the unit cell C34 may be electrically connected to the third bit line BL3. The unit cells C41, C42, C43 and C44 arrayed in the fourth row may also be connected in series in the first direction. The source terminal of the unit cell C41 among the unit cells C41, C42, C43 and C44 arrayed in the fourth row may be floated, and the drain terminal of the unit cell C44 may be electrically connected to the fourth bit line BL4. The parasitic PN diodes D11 to D14, D21 to D24, D31 to D34 and D41 to D44 may be provided between the well bias line PWL and the drain terminals of the transistors (hereinafter, referred to as "cell transistors") constituting the unit cells C11 to C14, C21 to C24, C31 to C34 and C41 to C44. Anodes of the parasitic PN diodes D11 to D14, D21 to D24, D31 to D34 and D41 to D44 may be electrically connected to the well bias line PWL, and cathodes of the parasitic PN diodes D11 to D14, D21 to D24, D31 to D34 and D41 to D44 may be electrically connected to the drain terminals of the cell transistors.

FIGS. 32 to 41 are schematic views illustrating program operations of the anti-fuse type OTP memory cell array 1000 shown in FIG. 31. In FIGS. 32 to 41, the same reference numerals or the same reference designators as used in FIGS. 28 to 31 denote the same elements.

The anti-fuse type OTP memory cell array 1000 may be programmed row by row. That is, a program operation may be repeatedly performed in units of rows. In addition, the unit cells arrayed in each row may be sequentially programmed from the first unit cell located in the first column to the last unit cell located in the last column.

Figure 32:
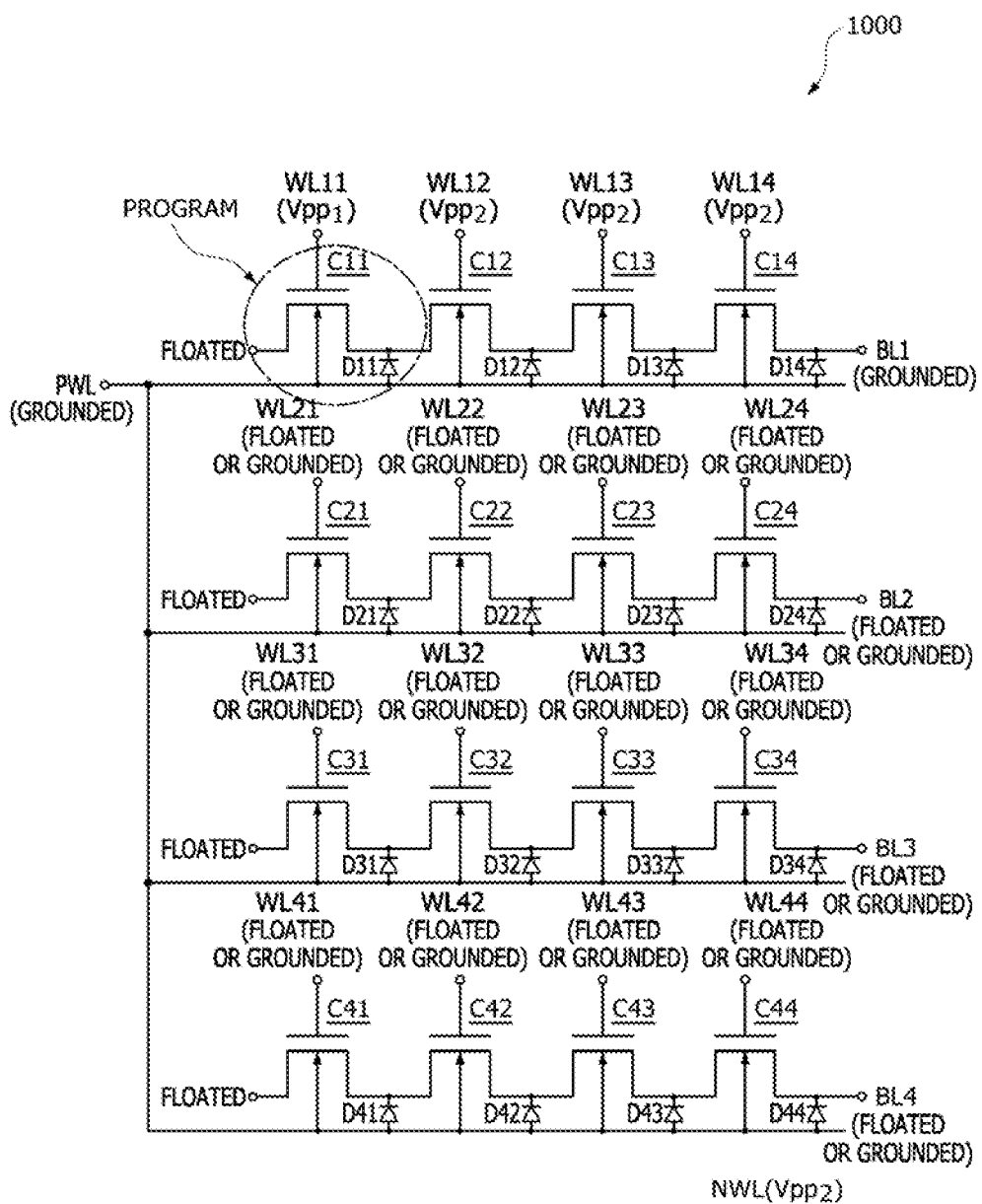
FIGS. 32 to 41 are schematic views illustrating program operations of the anti-fuse type OTP memory cell array shown in FIG. 31.

As illustrated in FIG. 32, the unit cell C11 located at a cross point of the first row and the first column may be primarily programmed in order to program the unit cells C11, C12, C13 and C14 arrayed in the first row. In order to selectively program the unit cell C11, a first program voltage Vpp1 may be applied to the word line WL11 connected to the selected unit cell C11. The first program voltage Vpp1 may be set to have a voltage level which is capable of rupturing the anti-fuse insulation layer (1611 of FIG. 29) of the selected unit cell C11 to form a resistive path. In some embodiments, the first program voltage Vpp1 may have a voltage level of about 10 V to about 20 V. In addition, a second program voltage Vpp2 may be applied to the word lines WL12, WL13 and WL14 which are respectively connected to the remaining non-selected unit cells C12, C13 and C14 arrayed in the first row. The second program voltage Vpp2 may be set to have a voltage level which is greater than a threshold voltage of the transistors constituting the non-selected unit cells C12, C13 and C14 and capable of preventing the anti-fuse insulation layers (1612, 1613 and 1614 of FIG. 29) of the non-selected unit cells C12, C13 and C14 from being ruptured. In some embodiments, the second program voltage Vpp2 may have a voltage level of about 2 V to about 5 V. Moreover, the first bit line BL1 and the well bias line PWL may be grounded while the unit cells C11, C12, C13 and C14 arrayed in the first row are programmed. Furthermore, the second program voltage Vpp2 may also be applied to the deep well bias line NWL. The other bit lines, that is, the second, third and fourth bit lines BL2, BL3 and BL4 may be floated or grounded. The other word lines, that is, the word lines WL21 to WL24 arrayed in the second row, the word lines WL31 to WL34 arrayed in the third row, and the word lines WL41 to WL44 arrayed in the fourth row may also be floated or grounded.

Figure 33:
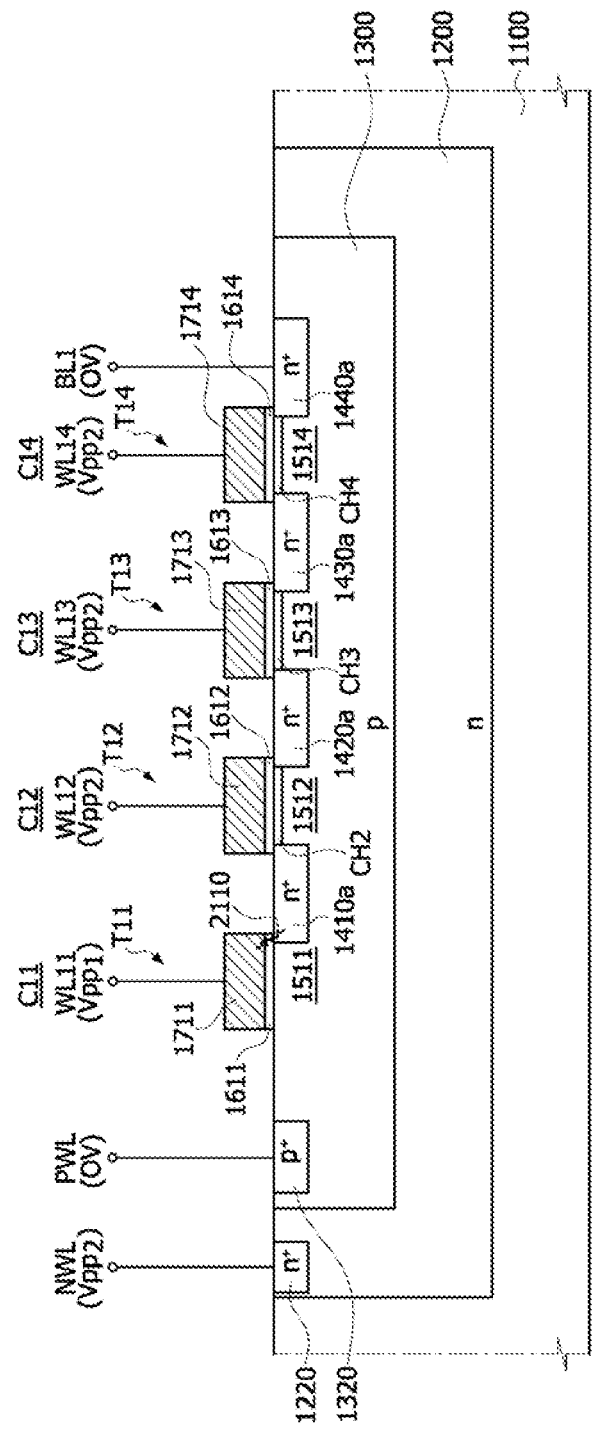

FIG. 33 is a cross-sectional view of the unit cells C11, C12, C13 and C14 arrayed in the first row to illustrate a program mechanism of the selected unit cell C11 under the above bias condition.

As illustrated in FIG. 33, since the second program voltage Vpp2 greater than the threshold voltage of the non-selected unit cells C12, C13 and C14 is applied to all of the word lines WL12, WL13 and WL14 connected to the non-selected unit cells C12, C13 and C14, the transistors T12, T13 and T14 constituting the non-selected unit cells C12, C13 and C14 may be turned on. As a result, inversion channels CH2, CH3 and CH4 may be formed in the first channel regions 1512, 1513 and 1514 of the transistors T12, T13 and T14, respectively.

The ground voltage applied to the first bit line BL1 may be transmitted to the first source/drain region 1410a through the first drain region 1440a, the inversion channel CH4, the first source/drain region 1430a, the inversion channel CH3, the first source/drain region 1420a, and the inversion channel CH2. Thus, a voltage difference, i.e., the first program voltage Vpp1, between the first program voltage Vpp1 and the ground voltage may be applied between the first anti-fuse gate 1711 and the first source/drain region 1410a. Accordingly, the anti-fuse insulation layer 1611 between the first anti-fuse gate 1711 and the first source/drain region 1410a may be ruptured by the first program voltage Vpp1 to form a resistive path 2110 through which current flows. As a result, the selected unit cell C11 may be programmed.

In the non-selected unit cell C12 arrayed in the first row, the second program voltage Vpp2 may be applied between the anti-fuse gate 1712 and the first source/drain region 1420a. Since the second program voltage Vpp2 has an insufficient voltage level to rupture the anti-fuse insulation layer 1612, no resistive path is formed in the anti-fuse insulation layer 1612 between the second anti-fuse gate 1712 and the first source/drain region 1420a. This program inhibition mechanism of the non-selected unit cell C12 may be equally applied to the remaining non-selected unit cells C13 and C14 arrayed in the first row.

Figure 34:
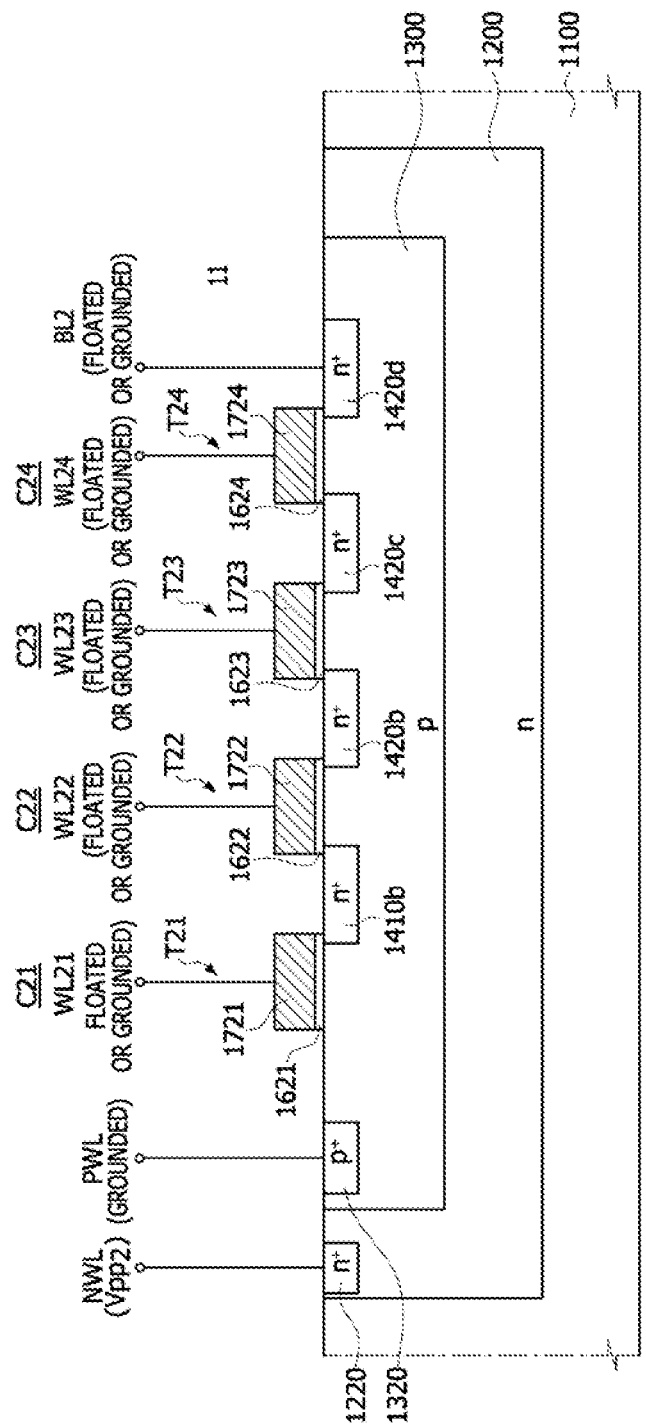

FIG. 34 is a cross-sectional view illustrating a bias condition applied to the unit cells C21, C22, C23 and C24 arrayed in the second row during the program operation for selectively programming the unit cell C11.

As illustrated in FIG. 34, the word lines WL21 to WL24 connected to the non-selected unit cells C21, C22, C23 and C24 arrayed in the second row may be floated or grounded. The second bit line BL2 connected to the non-selected unit cell C24 may also be floated or grounded.

When the word lines WL21 to WL24 are floated, the anti-fuse insulation layers 1621, 1622, 1623 and 1624 included in the non-selected unit cells C21, C22, C23 and C24 may not be ruptured regardless of a voltage level applied to the second bit line BL2. As a result, no resistive path is formed in each of the anti-fuse insulation layers 1621, 1622, 1623 and 1624.

When the word lines WL21 to WL24 are grounded and the second bit line BL2 is floated, all of the second source/drain regions 1410b, 1420b and 1430b and the second drain region 1440b may be floated. Thus, the anti-fuse insulation layers 1621, 1622, 1623 and 1624 included in the non-selected unit cells C21, C22, C23 and C24 may not be ruptured even though the word lines WL21 to WL24 are grounded. As a result, no resistive path is formed in each of the anti-fuse insulation layers 1621, 1622, 1623 and 1624.

When the word lines WL21 to WL24 are grounded and the second bit line BL2 is grounded, all of the second source/drain regions 1410b, 1420b and 1430b may be floated because no inversion channels are formed in each of the transistors T22, T23 and T24 and the second drain region 1440b may be grounded. Thus, the anti-fuse insulation layers 1621, 1622, 1623 and 1624 included in the non-selected unit cells C21, C22, C23 and C24 may not be ruptured even though the word lines WL21 to WL24 are grounded. Accordingly, the non-selected unit cells C21, C22 and C23 in the second row may not be programmed. In the non-selected unit cell C24, a voltage difference between the anti-fuse gate 1724 and the second drain 1440b may be approximately zero. Thus, the non-selected unit cell C24 may not be programmed. This program inhibition mechanism of the non-selected unit cells C21, C22, C23 and C24 may be equally applied to the remaining non-selected unit cells C31, C32, C33 and C34 arrayed in the third row and the remaining non-selected unit cells C41, C42, C43 and C44 arrayed in the fourth row.

Figure 35:
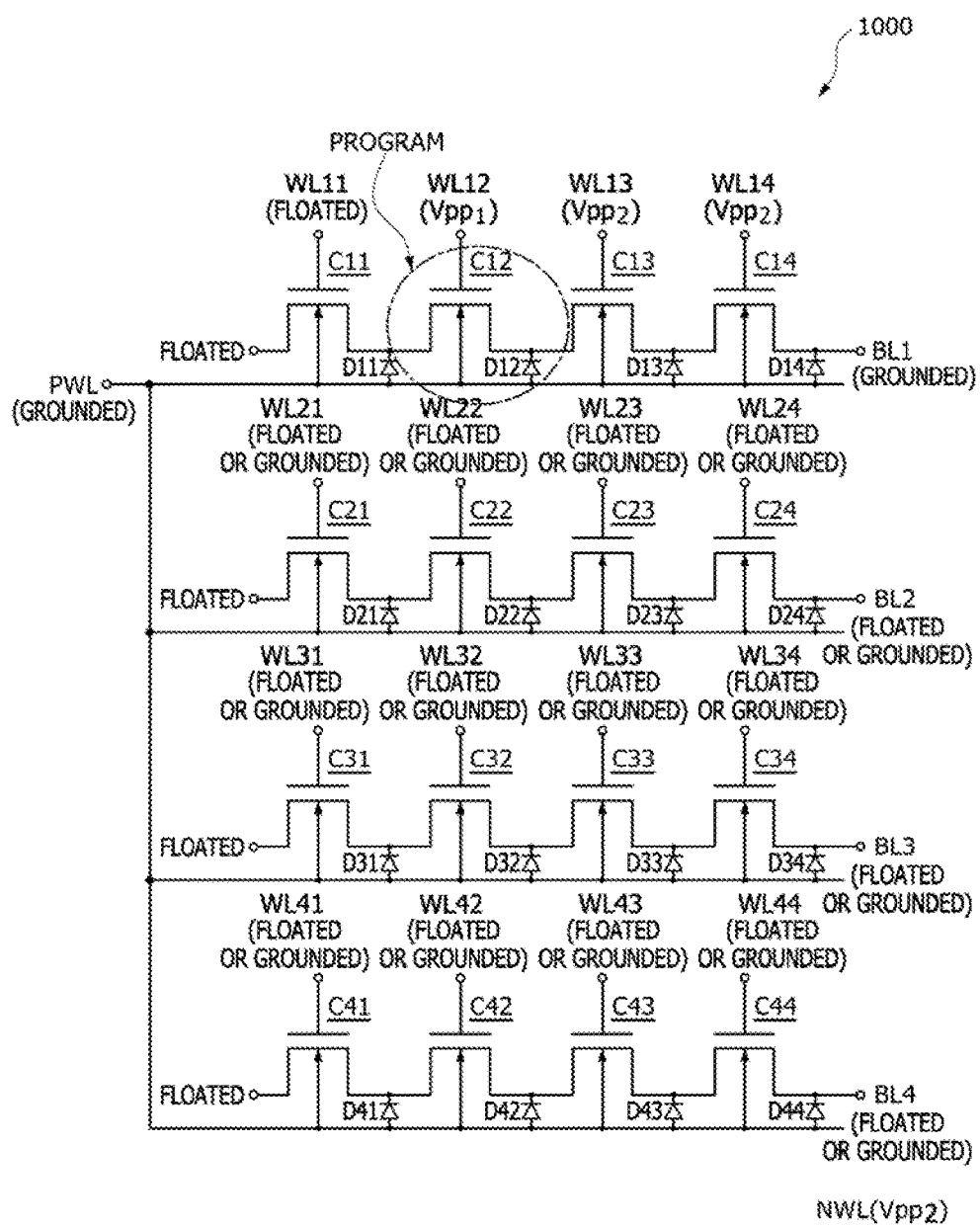

Referring to FIG. 35, after the unit cell C11 among the unit cells C11, C12, C13 and C14 arrayed in the first row is programmed, a program operation for selectively programming the unit cell C12 located in the second column may be performed. Specifically, when the word line WL11 connected to the programmed unit cell C11 is floated, the first program voltage Vpp1 may be applied to the word line WL12 connected to the selected unit cell C12, and the second program voltage Vpp2 may be applied to the word lines WL13 and WL14 connected to the non-selected unit cells C13 and C14 among the non-programmed unit cells. In addition, a ground voltage may be applied to the first bit line BL1 and the well bias line PWL, and the remaining bit lines BL2, BL3 and BL4 may be floated or grounded. The other word lines, that is, the word lines WL21 to WL24 arrayed in the second row, the word lines WL31 to WL34 arrayed in the third row, and the word lines WL41 to WL44 arrayed in the fourth row may also be floated or grounded. Furthermore, the second program voltage Vpp2 may also be applied to the deep well bias line NWL.

Figure 36:
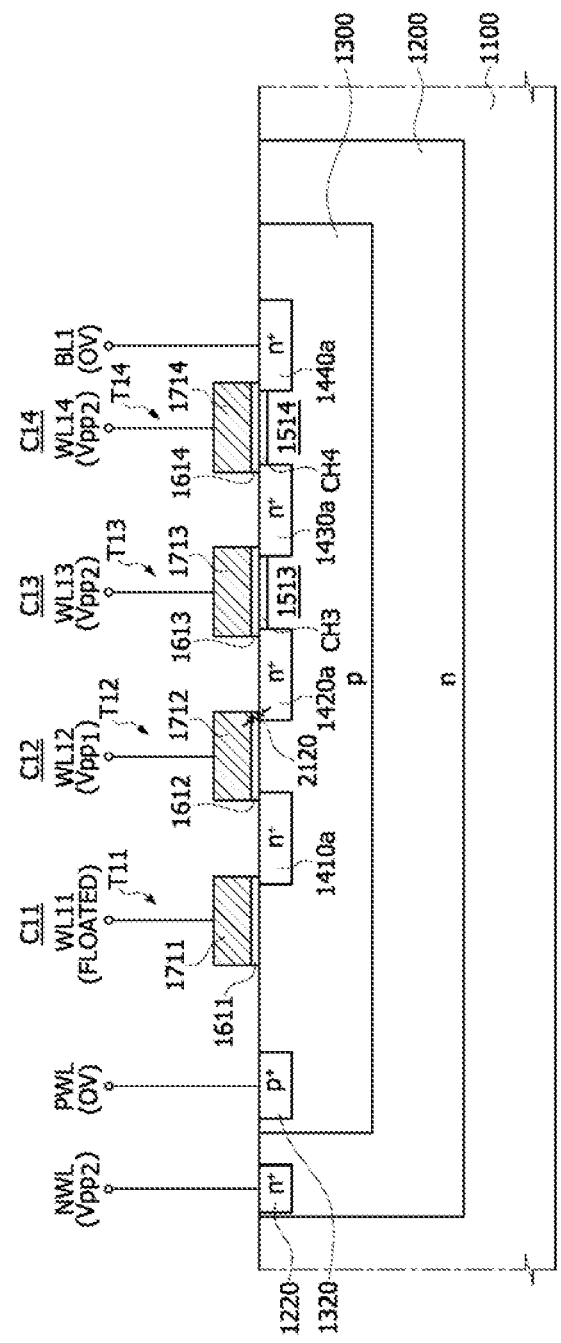

FIG. 36 is a cross-sectional view illustrating a bias condition applied to the unit cells C11, C12, C13 and C14 arrayed in the first row during the program operation for selectively programming the unit cell C12.

As illustrated in FIG. 36, since the word line WL11 connected to the programmed unit cell C11 is floated, the program operation for programming the selected unit cell C12 may not influence the programmed unit cell C11 regardless of a voltage level of the first source/drain region 1410a.

Because the second program voltage Vpp2 greater than the threshold voltage of the non-selected unit cells C13 and C14 is applied to the word lines WL13 and WL14 connected to the non-selected unit cells C13 and C14, the transistors T13 and T14 constituting the non-selected unit cells C13 and C14 may be turned on. Thus, inversion channels CH3 and CH4 may be formed in the channel regions 1513 and 1514 of the transistors T13 and T14, respectively. The ground voltage applied to the first bit line BL1 may be transmitted to the first source/drain region 1420a through the first drain region 1440a, the inversion channel CH4, the first source/drain region 1430a and the inversion channel CH3. Thus, a voltage difference, i.e., the first program voltage Vpp1, between the first program voltage Vpp1 and the ground voltage may be applied between the anti-fuse gate 1712 and the first source/drain region 1420a. Accordingly, the anti-fuse insulation layer 1612 between the anti-fuse gate 1712 and the first source/drain region 1420a may be ruptured by the first program voltage Vpp1 to form a resistive path 2120 through which current flows. As a result, the selected unit cell C12 may be programmed.

In the non-selected unit cell C13 arrayed in the first row together with the selected unit cell C12, the second program voltage Vpp2 may be applied between the anti-fuse gate 1713 and the first source/drain region 1430a. Since the second program voltage Vpp2 has an insufficient voltage level to rupture the anti-fuse insulation layer 1613, no resistive path is formed in the anti-fuse insulation layer 1613 between the anti-fuse gate 1713 and the first source/drain region 1430a. This program inhibition mechanism of the non-selected unit cell C13 may be equally applied to the remaining non-selected unit cell C14 which is located at a cross point of the first row and the fourth column. Furthermore, during the program operation for selectively programming the unit cell C12, the non-selected unit cells C21 to C24, C31 to C34 and C41 to C44 arrayed in the second, third and fourth rows may not be programmed by the same program inhibition mechanism as described with reference to FIG. 34.

Figure 37:
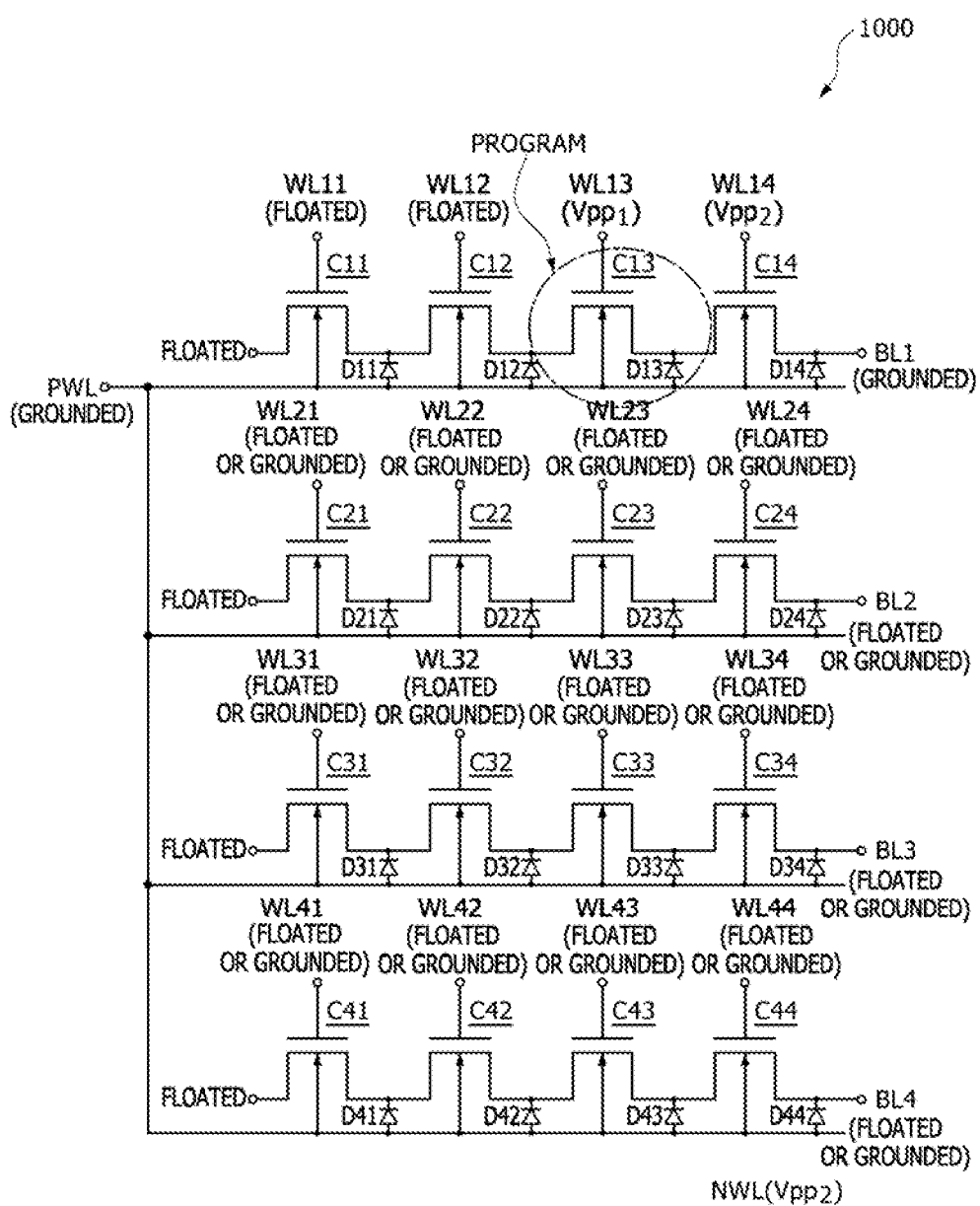

Referring to FIG. 37, after the unit cells C11 and C12 among the unit cells C11, C12, C13 and C14 arrayed in the first row are programmed, a program operation for selectively programming the unit cell C13 located in the third column may be performed. Specifically, in a state where the word lines WL11 and WL12 connected to the programmed unit cells C11 and C12 may be floated, the first program voltage Vpp1 may be applied to the word line WL13 connected to the selected unit cell C13, and the second program voltage Vpp2 may be applied to the word line WL14 connected to the non-selected unit cell C14 among the non-programmed unit cells. In addition, a ground voltage may be applied to the first bit line BL1 and the well bias line PWL, and the remaining bit lines BL2, BL3 and BL4 may be floated or grounded. The other word lines, that is, the word lines WL21 to WL24 arrayed in the second row, the word lines WL31 to WL34 arrayed in the third row, and the word lines WL41 to WL44 arrayed in the fourth row may also be floated or grounded. Furthermore, the second program voltage Vpp2 may also be applied to the deep well bias line NWL.

Figure 38:
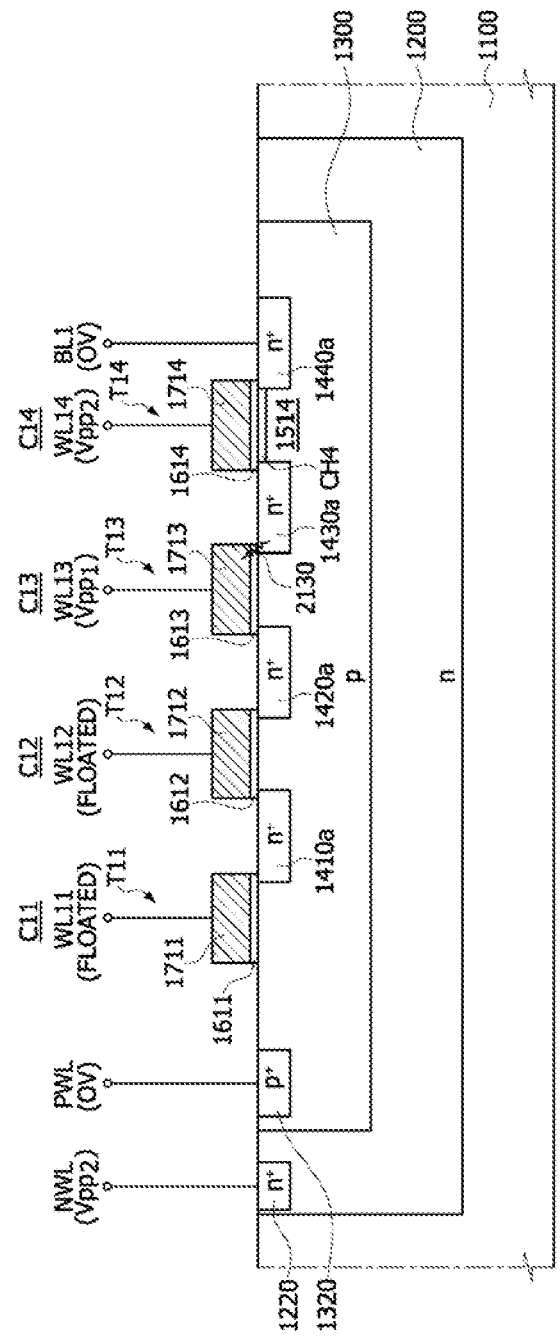

FIG. 38 is a cross-sectional view illustrating a bias condition applied to the unit cells C11, C12, C13 and C14 arrayed in the first row during the program operation for selectively programming the unit cell C13.

As illustrated in FIG. 38, since the word lines WL11 and WL12 connected to the programmed unit cells C11 and C12 are floated, the program operation for programming the selected unit cell C13 may not influence the unit cells C11 and C12 regardless of voltage levels of the first source/drain regions 1410a and 1420a.

Because the second program voltage Vpp2 greater than the threshold voltage of the non-selected unit cell C14 is applied to the word line WL14, the transistor T14 constituting the non-selected unit cell C14 may be turned on. Accordingly, an inversion channel CH4 may be formed in the channel region 1514 of the transistor T14. The ground voltage applied to the first bit line BL1 may be transmitted to the first source/drain region 1430a through the first drain region 1440a and the inversion channel CH4. Thus, a voltage difference, i.e., the first program voltage Vpp1, between the first program voltage Vpp1 and the ground voltage may be applied between the anti-fuse gate 1713 and the first source/drain region 1430a. Accordingly, the third anti-fuse insulation layer 1613 between the anti-fuse gate 1713 and the first source/drain region 1430a may be ruptured by the first program voltage Vpp1 to form a resistive path 2130 through which current flows. As a result, the selected unit cell C13 may be programmed.

In the non-selected unit cell C14 arrayed in the first row together with the selected unit cell C13, the second program voltage Vpp2 may be applied between the anti-fuse gate 1714 and the first drain region 1440a. Since the second program voltage Vpp2 has an insufficient voltage level to rupture the fourth anti-fuse insulation layer 1614, no resistive path is formed in the fourth anti-fuse insulation layer 1614 between the anti-fuse gate 1714 and the first drain region 1440a. During the program operation for selectively programming the unit cell C13, the non-selected unit cells C21 to C24, C31 to C34 and C41 to C44 arrayed in the second, third and fourth rows may not be programmed by the same program inhibition mechanism as described with reference to FIG. 34.

Figure 39:
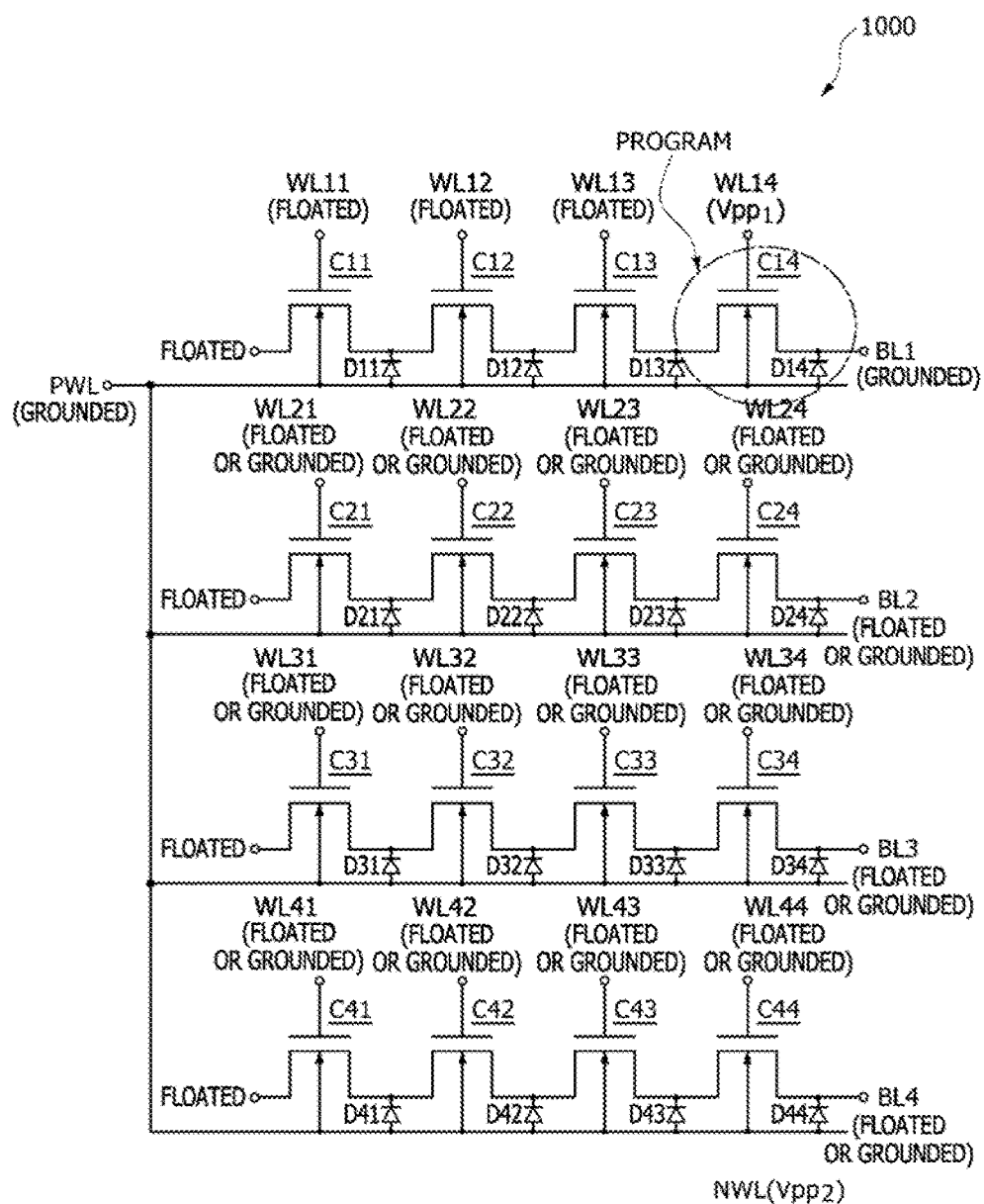

Referring to FIG. 39, after the unit cells C11, C12 and C13 among the unit cells C11, C12, C13 and C14 arrayed in the first row are programmed, a program operation for selectively programming the unit cell C14 located in the final column, i.e., the fourth column, may be performed. Specifically, in a state where the word lines WL11, WL12 and WL13 connected to the programmed unit cells C11, C12 and C13 may be floated, the first program voltage Vpp1 may be applied to the word line WL14 connected to the selected unit cell C14. In addition, a ground voltage may be applied to the first bit line BL1 and the well bias line PWL. The remaining bit lines, for example, the second, third and fourth bit lines BL2, BL3 and BL4 may be floated or grounded. The other word lines, that is, the word lines WL21 to WL24 arrayed in the second row, the word lines WL31 to WL34 arrayed in the third row, and the word lines WL41 to WL44 arrayed in the fourth row may also be floated or grounded. Furthermore, the second program voltage Vpp2 may also be applied to the deep well bias line NWL.

Figure 40:
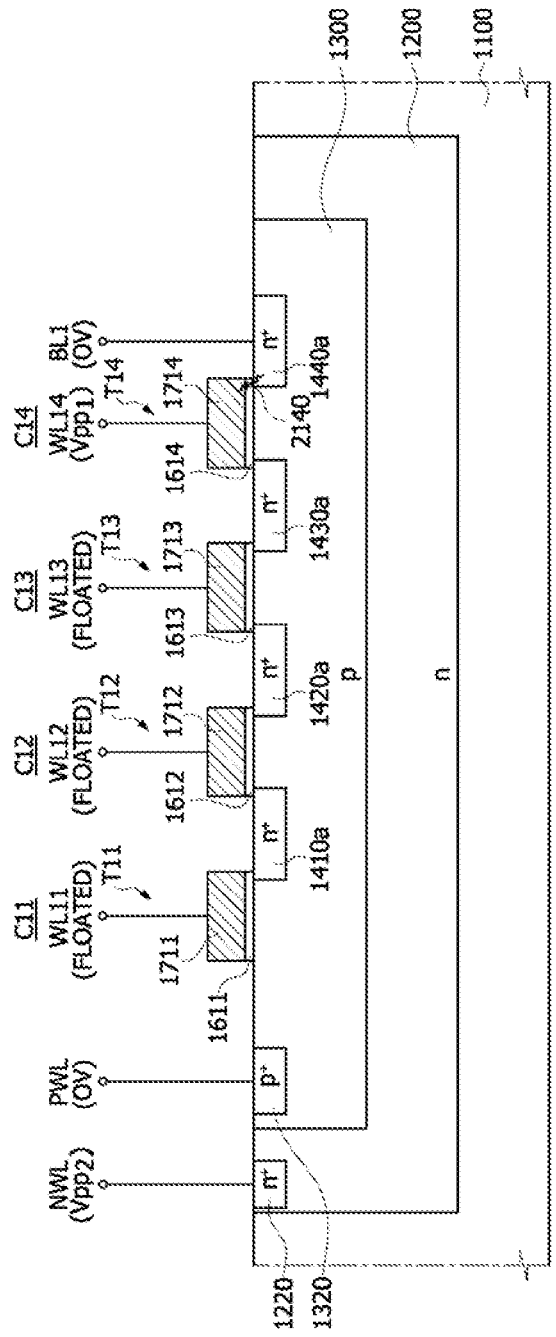

FIG. 40 is a cross-sectional view illustrating a bias condition applied to the unit cells C11, C12, C13 and C14 arrayed in the first row during the program operation for selectively programming the unit cell C14.

As illustrated in FIG. 40, since the word lines WL11, WL12 and WL13 connected to the programmed unit cells C11, C12 and C13 are floated, the program operation for programming the selected unit cell C14 may not influence the unit cells C11, C12 and C13 regardless of voltage levels of the first source/drain regions 1410a, 1420a and 1430a.

The ground voltage applied to the first bit line BL1 may be directly transmitted to the first drain region 1440a. Thus, a voltage difference, i.e., the first program voltage Vpp1, between the first program voltage Vpp1 and the ground voltage may be applied between the anti-fuse gate 1714 and the first drain region 1440a. Accordingly, the anti-fuse insulation layer 1614 between the anti-fuse gate 1714 and the first drain region 1440a may be ruptured by the first program voltage Vpp1 to form a resistive path 2140 through which current flows. As a result, the selected unit cell C14 may be programmed. During the program operation for selectively programming the unit cell C14, the non-selected unit cells C21 to C24, C31 to C34 and C41 to C44 arrayed in the second, third and fourth rows may not be programmed by the same program inhibition mechanism as described with reference to FIG. 34.

Figure 41:
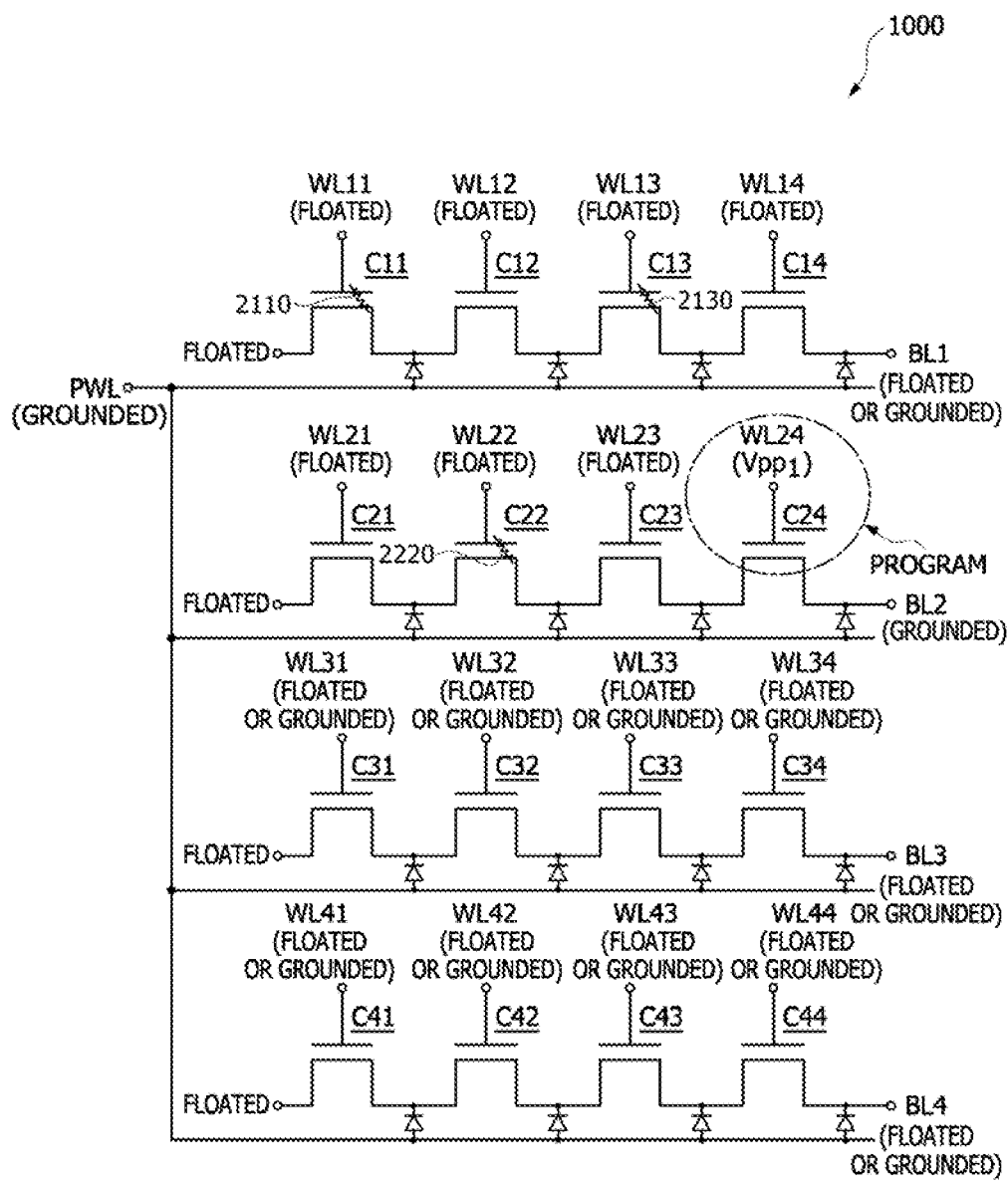

Referring to FIG. 41, after the program operations are applied to all of the unit cells C11, C12, C13 and C14 arrayed in the first row and the unit cells C21, C22 and C23 arrayed in the second row, the unit cell C24 arrayed in the second row may be programmed. In some embodiments, the unit cells C11, C12, C13, C14, C21, C22 and C23 to which the program operations are applied may be have a first state with a resistive path or a second state without the resistive path. In the present embodiment, it may be assumed that the unit cells C11, C13 and C22 have the first state with the resistive paths 2110, 2130 and 2220, respectively, and the unit cells C12, C14, C21 and C23 have the second state without a resistive path. The unit cells C31 to C34 and C41 to C44 arrayed in the third and fourth rows will be programmed in subsequent steps.

As illustrated in FIG. 41, the well bias line PWL and the second bit line BL2 may be grounded to selectively program the unit cell C24. The remaining first, third and fourth bit lines BL1, BL3 and BL4 may be floated or grounded. In addition, the word lines WL11 to WL14, WL21, WL22 and WL23 connected to the unit cells C11 to C14, C21, C22 and C23 may be floated, and the word lines WL31 to WL34 and WL41 to WL44 connected to the unit cells C31 to C34 and C41 to C44 may be floated or grounded. Moreover, the first program voltage Vpp1 may be applied to the word line WL24 connected to the selected unit cell C24. Although not shown in FIG. 41, the second program voltage Vpp2 may be applied to the deep well bias line NWL.

Under the above bias condition, the selected unit cell C24 may be programmed by the same mechanism as the program mechanism of the unit cell C14 which is described with reference to FIGS. 39 and 40. During the program operation for programming the selected unit cell C24, the unit cells C31 to C34 and C41 to C44 may not be programmed by the same program inhibition mechanism as described with reference to FIG. 34. The unit cells C11 to C14, C21, C22 and C23 may not be influenced by the program operation for programming the selected unit cell C24 because the word lines connected to the unit cells C11 to C14, C21, C22 and C23 are floated. Thus, each of the unit cells C11 to C14, C21, C22 and C23 may still maintain its state, i.e., the first state or the second state, even though the program operation for programming the selected unit cell C24 is performed.

Figure 42:
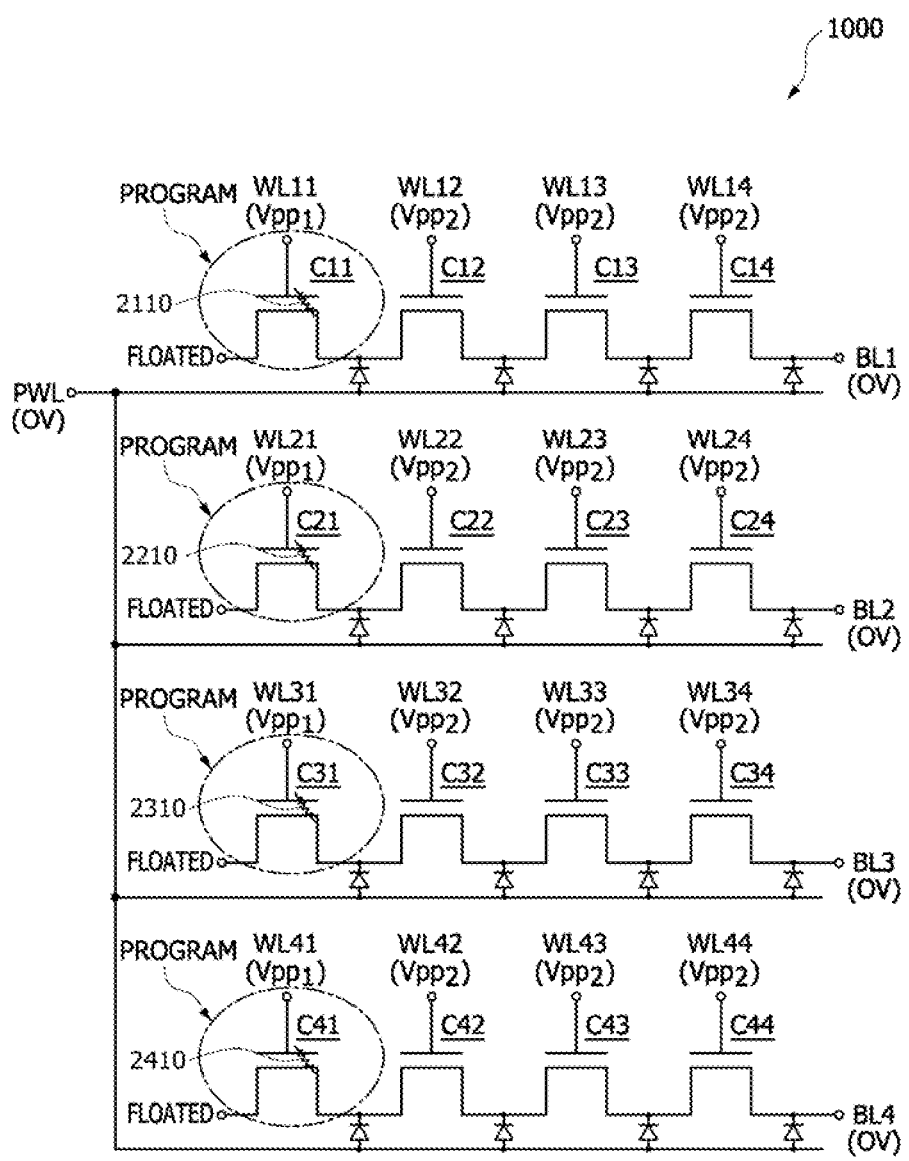
FIGS. 42 and 43 are schematic views illustrating other program operations of the anti-fuse type OTP memory cell array shown in FIG. 31.
Figure 43:
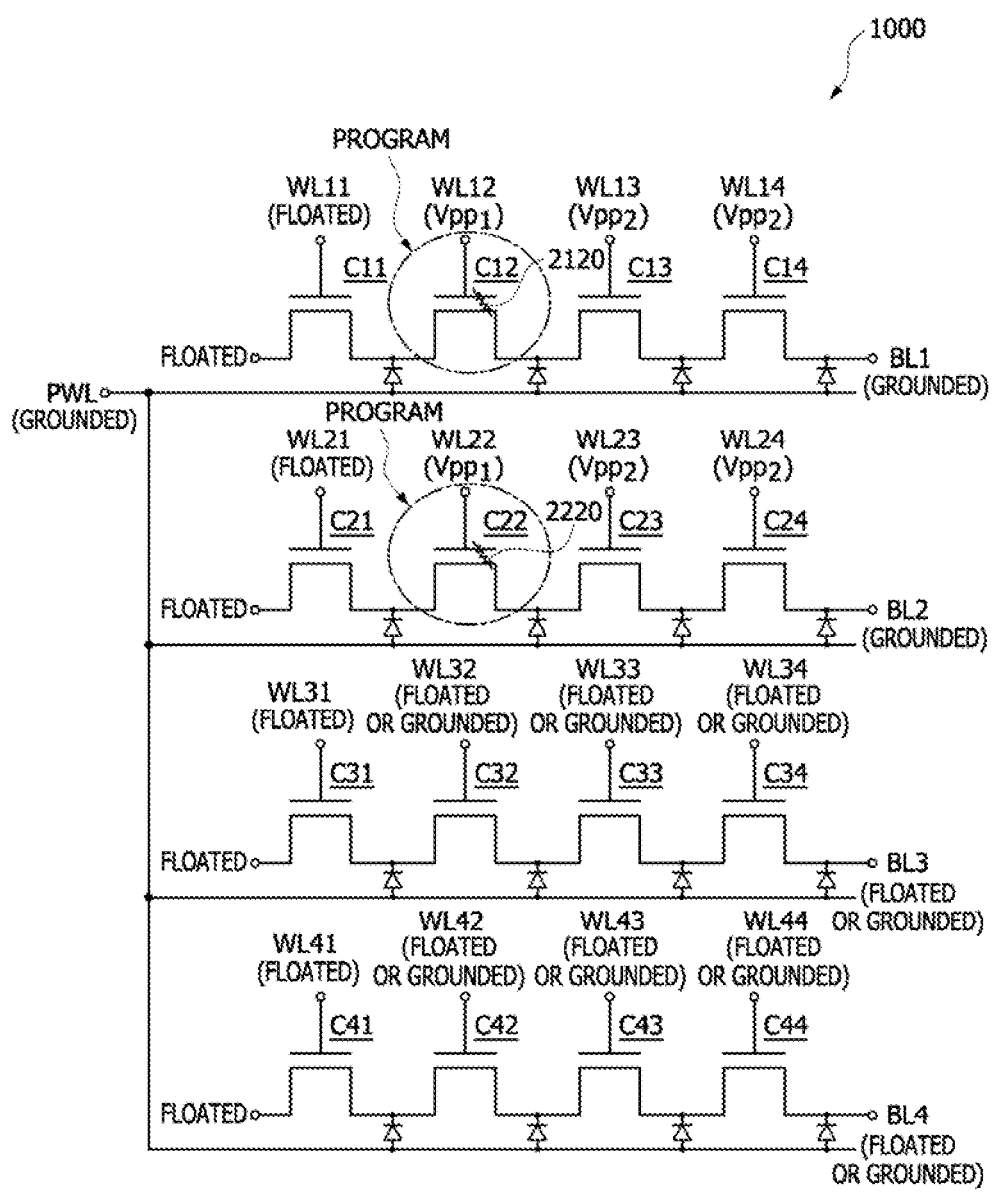

FIGS. 42 and 43 are equivalent circuit diagrams illustrating other program operations of the anti-fuse type OTP memory cell array 1000 shown in FIG. 31.

According to the present embodiment, the program operations may be performed in units of columns. That is, a program operation for selectively programming at least one target unit cell among the unit cells C11, C21, C31 and C41 arrayed in the first column may be performed, and a program operation for selectively programming at least one target unit cell among the unit cells C12, C22, C32 and C42 arrayed in the second column may then be performed. Subsequently, a program operation for selectively programming at least one target unit cell among the unit cells C13, C23, C33 and C43 arrayed in the third column may be performed, and a program operation for selectively programming at least one target unit cell among the unit cells C14, C24, C34 and C44 arrayed in the final column, i.e., the fourth column, may be finally performed. Accordingly, at least one target unit cell among the plurality of unit cells arrayed in each column may be programmed to reduce the number of the program operations. That is, according to the present embodiment, the anti-fuse type OTP memory cell array 1000 may be programmed by repeatedly executing the program operation by the same number of times as there are columns in the anti-fuse type OTP memory cell array 1000.

Referring to FIG. 42, an example in which all of the unit cells C11, C21, C31 and C41 arrayed in the first column are selectively and simultaneously programmed will be described. Specifically, the first program voltage Vpp1 may be applied to the word lines WL11, WL21, WL31 and WL41 which are connected to the selected unit cells C11, C21, C31 and C41, and the second program voltage Vpp2 may be applied to the remaining word lines WL12 to WL14, WL22 to WL24, WL32 to WL34 and WL42 to WL44. The well bias line PWL and the first to fourth bit lines BL1 to BL4 may be grounded. Although not shown in FIG. 42, the second program voltage Vpp2 may also be applied to the deep well bias line NWL.

Under the above bias condition, the selected unit cells C11 to C41 arrayed in the first column may be simultaneously programmed by the same mechanism as the program mechanism of the unit cell C11 which is described with reference to FIG. 33. As a result, resistive paths 2110, 2210, 2310 and 2410 may be formed in the anti-fuse insulation layers of the selected unit cells C11 to C41, respectively. The remaining non-selected unit cells C12 to C14, C22 to C24, C32 to C34 and C42 to C44 may not be programmed by the same mechanism as the program inhibition mechanism of the unit cells C12, C13 and C14 which is described with reference to FIG. 33.

Referring to FIG. 43, after the program operation of the unit cells C11 to C41 arrayed in the first column is performed, a program operation of the unit cells C12 to C42 arrayed in the second column may be performed. As illustrated in FIG. 43, an example in which only the unit cells C12 and C22 among the unit cells C12 to C42 arrayed in the second column are selectively and simultaneously programmed will be described. In order to selectively program the unit cells C12 and C22, the word lines WL11 to WL41 connected to the programmed unit cells C11 to C41 may be floated, and the first program voltage Vpp1 may be applied to the word lines WL12 and WL22 connected to the selected unit cells C12 and C22. The word lines WL32 and WL42 connected to the non-selected unit cells C32 and C42 among the unit cells C12 to C42 arrayed in the second column may be floated or grounded. The second program voltage Vpp2 may be applied to the word lines WL13 and WL14 connected to the non-selected unit cells C13 and C14 which are arrayed in the same row as the selected unit cell C12 and are programmed in subsequent steps. Similarly, the second program voltage Vpp2 may also be applied to the word lines WL23 and WL24 connected to the non-selected unit cells C23 and C24 which are arrayed in the same row as the selected unit cell C22 and are programmed in subsequent steps. The word lines WL33, WL34, WL43 and WL44 connected to the non-selected unit cells C33, C34, C43 and C44 which are arrayed in the same rows as the non-selected unit cells C32 and 42 and are programmed in subsequent steps may be floated or grounded. In addition, a ground voltage may be applied to the first and second bit lines BL1 and BL2 which are respectively connected to the selected unit cells C12 and C22, and the remaining third and fourth bit lines BL3 and BL4 may be floated or grounded. Moreover, the well bias line PWL may be grounded. Although not shown in FIG. 43, the second program voltage Vpp2 may also be applied to the deep well bias line NWL.

Under the above bias condition, the selected unit cells C12 and C22 may be simultaneously programmed by the same mechanism as the program mechanism of the unit cell C12 which is described with reference to FIGS. 35 and 36. As a result, resistive paths 2120 and 2220 may be formed in the anti-fuse insulation layers of the selected unit cells C12 and C22, respectively. The non-selected unit cells C11, C21, C31 and C41 arrayed in the first column may not be influenced by the program operation for programming the selected unit cells C12 and C22 because the word lines WL11, WL21, WL31 and WL41 are floated, like the unit cell C11 described with reference to FIG. 36. The remaining unit cells C13, C14, C23, C24, C32, C33, C34, C42, C43 and C44 arrayed in the second, third and fourth columns may not be programmed by the same program inhibition mechanisms as described with reference to FIGS. 35 and 36.

After the program operation for programming the unit cells C12 and C22 arrayed in the second column is performed, a program operation for programming at least one of the unit cells arrayed in the third column and a program operation for programming at least one of the unit cells arrayed in the fourth column may be performed. The program operations for programming the unit cells arrayed in the third and fourth columns may be performed using the same methods as the program operations for programming the unit cells arrayed in the first and second columns.

Figure 44:
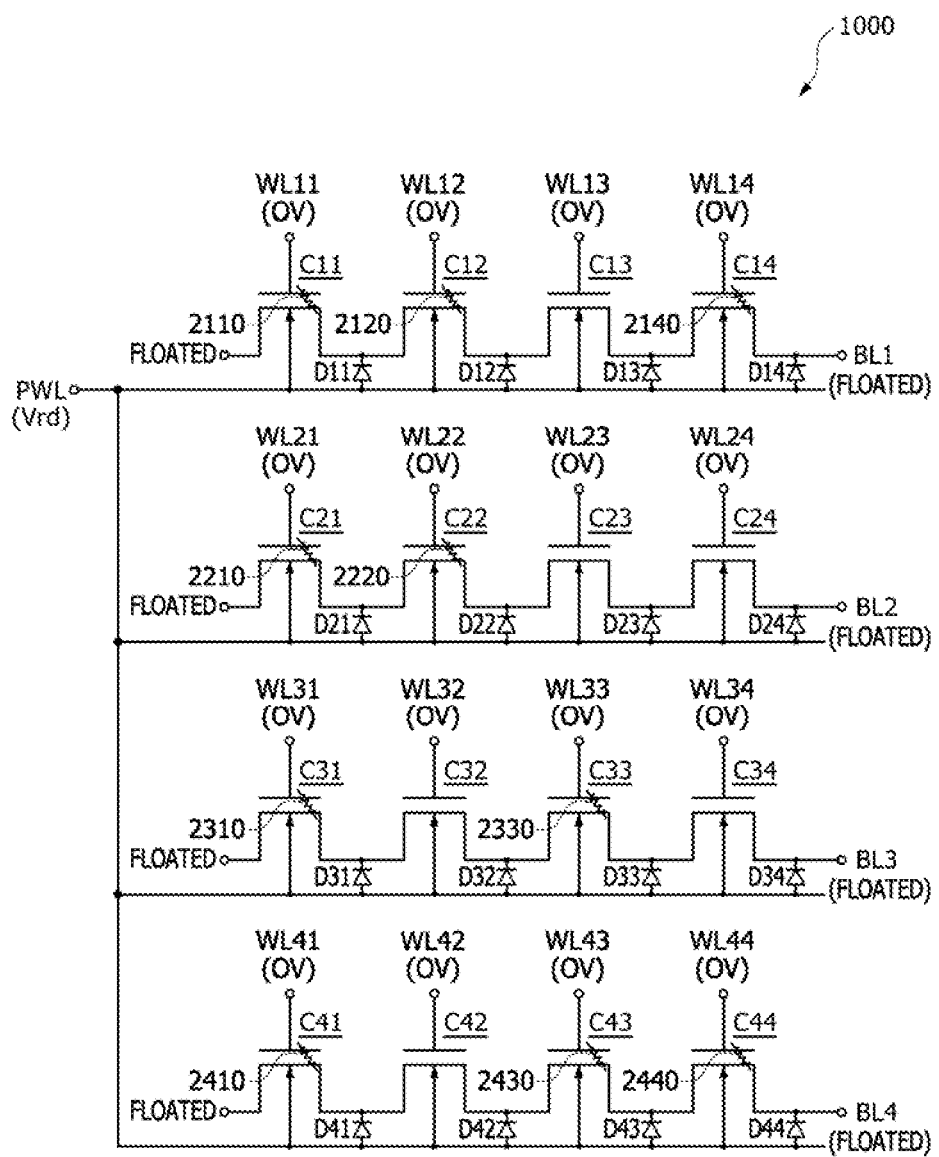
FIG. 44 is a schematic view illustrating read operations of the anti-fuse type OTP memory cell array shown in FIG. 31.

FIG. 44 is an equivalent circuit diagram illustrating a bias condition of a read operation of the anti-fuse type OTP memory cell array 1000 shown in FIG. 31.

The read operation according to the present embodiment may be performed to simultaneously read out the data of all of the unit cells constituting the anti-fuse type OTP memory cell array 1000. Referring to FIG. 44, a read voltage Vrd may be applied to the well bias line PWL. Although not shown in FIG. 44, the read voltage Vrd or a voltage greater than the read voltage Vrd may be applied to the deep well bias line NWL to electrically isolate the anti-fuse type OTP memory cell array 1000. All of the word lines WL11 to WL14, WL21 to WL24, WL31 to WL34 and WL41 to WL44 may be grounded, and all of the bit lines BL1, BL2, BL3 and BL4 may be floated. In some embodiments, the read voltage Vrd may be within the range of about 1 V to about 3 V.

In the present embodiment, it may be assumed that the unit cells C11, C12 and C14 arrayed in the first row, the unit cells C21 and C22 arrayed in the second row, the unit cells C31 and C33 arrayed in the third row, and the unit cells C41, C43 and C44 arrayed in the fourth row have a programmed state with resistive paths 2110, 2120, 2140, 2210, 2220, 2310, 2330, 2410, 2430 and 2440, respectively. Therefore, current may flow from the well bias line PWL toward the word lines WL11, WL12 and WL14 through the parasitic PN diodes D11, D12 and D14 and the resistive paths 2110, 2120 and 2140 of the unit cells C11, C12 and C14, respectively. That is, when the current flowing through the word lines WL11, WL12 and WL14 is detected, the unit cells C11, C12 and C14 connected to the word lines WL11, WL12 and WL14 may be recognized to have the programmed state. In contrast, no current may flow from the well bias line PWL toward the word line WL13 regardless of a bias condition of the parasitic PN diode D13 because the unit cell C13 does not have any resistive path in the anti-fuse insulation layer thereof. Thus, the unit cell C13 connected to the word line WL13 may be recognized to have an erased state because the current flowing through the word line WL13 is not detected.

In the unit cells C21 to C24 arrayed in the second row, current may flow from the well bias line PWL toward the word lines WL21 and WL22 through the parasitic PN diodes D21 and D22 and the resistive paths 2210 and 2220 of the unit cells C21 and C22, respectively. That is, when the current flowing through the word lines WL21 and WL22 is detected, the unit cells C21 and C22 connected to the word lines WL21 and WL22 may be recognized to have the programmed state. In contrast, no current may flow from the well bias line PWL toward the word lines WL23 and WL24 regardless of bias conditions of the parasitic PN diodes D23 and D24 because each of the unit cells C23 and C24 does not have any resistive path in the anti-fuse insulation layer thereof. Thus, the unit cells C23 and C24 connected to the word lines WL23 and WL24 may be recognized to have the erased state because the current flowing through the word lines WL23 and WL24 is not detected.

In the unit cells C31 to C34 arrayed in the third row, current may flow from the well bias line PWL toward the word lines WL31 and WL33 through the parasitic PN diodes D31 and D33 and the resistive paths 2310 and 2330 of the unit cells C31 and C33, respectively. That is, when the current flowing through the word lines WL31 and WL33 is detected, the unit cells C31 and C33 connected to the word lines WL31 and WL33 may be recognized to have the programmed state. In contrast, no current may flow from the well bias line PWL toward the word lines WL32 and WL34 regardless of bias conditions of the parasitic PN diodes D32 and D34 because each of the unit cells C32 and C34 does not have a resistive path in the anti-fuse insulation layer thereof. Thus, the unit cells C32 and C34 connected to the word lines WL32 and WL34 may be recognized to have the erased state because the current flowing through the word lines WL32 and WL34 is not detected.

In the unit cells C41 to C44 arrayed in the fourth row, current may flow from the well bias line PWL toward the word lines WL41, WL43 and WL44 through the parasitic PN diodes D41, D43 and D44 and the resistive paths 2410, 2430 and 2440 of the unit cells C41, C43 and C44, respectively. That is, when the current flowing through the word lines WL41, WL43 and WL44 is detected, the unit cells C41, C43 and C44 connected to the word lines WL41, WL43 and WL44 may be recognized to have the programmed state. In contrast, no current may flow from the well bias line PWL toward the word lines WL42 regardless of a bias condition of the parasitic PN diode D42 because the unit cell C42 does not have a resistive path in the anti-fuse insulation layer thereof. Thus, the unit cell C42 connected to the word line WL42 may be recognized to have the erased state because the current flowing through the word line WL42 is not detected.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of operating an anti-fuse type one-time programmable (OTP) memory cell array including a plurality of unit cells which are respectively located at cross points of a plurality of rows and a plurality of columns, a plurality of word lines respectively disposed in the plurality of columns, a plurality of well regions respectively disposed in the plurality of rows, wherein each of the well regions is shared by the unit cells in the same row, a plurality of well bias lines respectively connected to the plurality of well regions, a plurality of bit lines respectively connected to drain terminals of the unit cells arrayed in a last column of the plurality of columns, and a plurality of PN diodes coupled between the plurality of well bias lines and the drain terminals of the plurality of unit cells, the method comprising:
    selecting one of the plurality of rows; and
    sequentially programming the unit cells which are arrayed in the selected row,
    wherein each of the plurality of unit cells includes an anti-fuse transistor having a metal-oxide-semiconductor (MOS) transistor structure without a selection transistor.

2. The method of claim 1, wherein the selecting one of the plurality of rows comprises:
    applying a ground voltage to one selected from the plurality of well bias lines; and
    applying a second program voltage to the non-selected well bias lines arrayed in rows to be programmed in subsequent steps.

3. The method of claim 2, wherein the sequentially programming the unit cells which are arrayed in the selected row comprises:
    selectively applying a first program voltage to one of the plurality of word lines, which is connected to one selected from the unit cells;
    applying the second program voltage to the non-selected word lines;
    selectively applying a ground voltage to one of the plurality of bit lines, which is connected to the selected row; and
    electrically floating or grounding the non-selected bit lines.

4. The method of claim 3, wherein, when at least one of the unit cells has a programmed state before the selected unit cell is programmed, the word line connected to the at least one unit cell in the programmed state is electrically floated while the selected unit cell is programmed.

5. The method of claim 3,
    wherein a voltage difference between the first program voltage applied to the selected word line and the ground voltage applied to the selected bit line has a voltage level to rupture an anti-fuse insulation layer of the anti-fuse transistor,
    wherein the second program voltage is greater than a threshold voltage of the anti-fuse transistor; and
    wherein a voltage difference between the second program voltage applied to the non-selected word lines and the ground voltage applied to the selected bit line has a voltage level which is insufficient to rupture an anti-fuse insulation layer of the anti-fuse transistor.

6. The method of claim 1, further comprising:
    performing a read operation for reading out data stored in the plurality of unit cells in units of rows,
    wherein the data stored in the unit cells which are arrayed in any one selected from the plurality of rows are simultaneously read out during the read operation, and
    wherein the performing the read operation comprises:
        applying a ground voltage to all of the plurality of word lines;
        electrically floating all of the plurality of bit lines;
        applying a read voltage to one selected from the plurality of well bias lines; and
        electrically floating the non-selected well bias lines.

7. The method of claim 6, wherein the read voltage has a voltage level which is greater than a turn-on voltage of the PN diodes.

8. The method of claim 6, wherein the read operation for reading out the data of the unit cells in the selected row is performed by detecting current that flows through each of the plurality of word lines.

9. The method of claim 1, wherein the sequentially programming the unit cells which are arrayed in the selected row comprises:
    sequentially programming from the unit cell of the first column in the selected row to the unit cell of the last column in the selected row.

* * * * *